US010937794B2

(12) United States Patent
Zhou et al.

(10) Patent No.: US 10,937,794 B2
(45) Date of Patent: Mar. 2, 2021

(54) SPLIT GATE NON-VOLATILE MEMORY CELLS WITH FINFET STRUCTURE AND HKMG MEMORY AND LOGIC GATES, AND METHOD OF MAKING SAME

(71) Applicant: Silicon Storage Technology, Inc., San Jose, CA (US)

(72) Inventors: Feng Zhou, Fremont, CA (US); Jinho Kim, Saratoga, CA (US); Xian Liu, Sunnyvale, CA (US); Serguei Jourba, Aix en Provence (FR); Catherine Decobert, Pourrieres (FR); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/208,150

(22) Filed: Dec. 3, 2018

(65) Prior Publication Data

US 2020/0176459 A1  Jun. 4, 2020

(51) Int. Cl.
*H01L 27/11521*  (2017.01)
*H01L 21/28*  (2006.01)
(Continued)

(52) U.S. Cl.
CPC .. *H01L 27/11521* (2013.01); *H01L 27/11526* (2013.01); *H01L 27/11531* (2013.01);
(Continued)

(58) Field of Classification Search
CPC ......... H01L 27/11521; H01L 27/11526; H01L 27/11531; H01L 29/40114; H01L 29/1083;
(Continued)

(56) References Cited

U.S. PATENT DOCUMENTS 5,029,130 A  7/1991 Yeh
6,747,310 B2  6/2004 Fan
(Continued)

FOREIGN PATENT DOCUMENTS

WO  2016/118785  7/2016

OTHER PUBLICATIONS

U.S. Appl. No. 16/422,740, filed May 24, 2019 entitled "Method of Making Split Gate Non-Volatile Memory Cells With Three-Dimensional FINFET Structure, and Method of Making Same," Jourba et al.
(Continued)

*Primary Examiner* — Mark W Tornow
(74) *Attorney, Agent, or Firm* — DLA Piper LLP (US)

(57) ABSTRACT

A memory device having plurality of upwardly extending semiconductor substrate fins, a memory cell formed on a first fin and a logic device formed on a second fin. The memory cell includes source and drain regions in the first fin with a channel region therebetween, a polysilicon floating gate extending along a first portion of the channel region including the side and top surfaces of the first fin, a metal select gate extending along a second portion of the channel region including the side and top surfaces of the first fin, a polysilicon control gate extending along the floating gate, and a polysilicon erase gate extending along the source region. The logic device includes source and drain regions in the second fin with a second channel region therebetween, and a metal logic gate extending along the second channel region including the side and top surfaces of the second fin.

22 Claims, 76 Drawing Sheets

(51) Int. Cl.
  *H01L 27/11526* (2017.01)
  *H01L 27/11531* (2017.01)
  *H01L 29/10* (2006.01)
  *H01L 29/423* (2006.01)
  *H01L 29/66* (2006.01)
  *H01L 29/78* (2006.01)
  *H01L 29/788* (2006.01)

(52) U.S. Cl.
  CPC .... *H01L 29/1083* (2013.01); *H01L 29/40114* (2019.08); *H01L 29/42328* (2013.01); *H01L 29/66537* (2013.01); *H01L 29/66795* (2013.01); *H01L 29/66825* (2013.01); *H01L 29/7851* (2013.01); *H01L 29/7883* (2013.01)

(58) Field of Classification Search
  CPC ......... H01L 29/42328; H01L 29/66537; H01L 29/66795; H01L 29/66825; H01L 29/7851; H01L 29/7883
  See application file for complete search history.

(56) References Cited

U.S. PATENT DOCUMENTS

| | | | |
|---|---|---|---|
| 7,315,056 B2 | 1/2008 | Klinger | |
| 7,329,580 B2 | 2/2008 | Choi | |
| 7,410,913 B2 | 8/2008 | Lee | |
| 7,423,310 B2 | 9/2008 | Verhoeven | |
| 7,868,375 B2 | 1/2011 | Liu | |
| 7,927,994 B1 | 4/2011 | Liu | |
| 8,068,370 B2 | 11/2011 | Lue | |
| 8,148,768 B2 | 4/2012 | Do | |
| 8,420,476 B2 | 4/2013 | Booth | |
| 8,461,640 B2* | 6/2013 | Hu | H01L 27/11521 257/320 |
| 8,710,485 B2 | 4/2014 | Saitoh | |
| 8,883,592 B2* | 11/2014 | Kotov | H01L 29/42328 438/267 |
| 8,941,153 B2 | 1/2015 | Lee | |
| 9,276,005 B1 | 3/2016 | Zhou | |
| 9,276,006 B1 | 3/2016 | Chen | |
| 9,406,689 B2 | 8/2016 | Li | |
| 9,614,048 B2 | 4/2017 | Wu | |
| 9,634,017 B1 | 4/2017 | Baars et al. | |
| 9,634,018 B2 | 4/2017 | Su | |
| 9,972,630 B2 | 5/2018 | Su | |
| 9,985,042 B2 | 5/2018 | Su | |
| 2005/0012137 A1 | 1/2005 | Levi | |
| 2005/0227435 A1 | 10/2005 | Oh et al. | |
| 2005/0280000 A1 | 12/2005 | Ishii | |
| 2006/0097310 A1 | 5/2006 | Kim | |
| 2006/0208307 A1 | 9/2006 | Chang | |
| 2007/0158730 A1 | 7/2007 | Burnett | |
| 2008/0173921 A1 | 7/2008 | Li | |
| 2009/0207662 A1* | 8/2009 | Wang | H01L 27/11521 365/185.18 |
| 2010/0320525 A1 | 12/2010 | Nagashima | |
| 2013/0270627 A1 | 10/2013 | Cheng | |
| 2015/0132966 A1* | 5/2015 | Shih | H01L 21/82343 438/703 |
| 2016/0064398 A1 | 3/2016 | Toh | |
| 2016/0218110 A1 | 7/2016 | Yang | |
| 2016/0379987 A1* | 12/2016 | Liu | H01L 27/11524 257/316 |
| 2017/0103989 A1 | 4/2017 | Su et al. | |
| 2017/0117285 A1 | 4/2017 | Chen | |
| 2017/0125429 A1 | 5/2017 | Su et al. | |
| 2017/0243955 A1 | 8/2017 | Shinohara | |
| 2017/0271484 A1 | 9/2017 | Baars et al. | |
| 2017/0301683 A1 | 10/2017 | Chen | |
| 2017/0330949 A1 | 11/2017 | Wang et al. | |
| 2017/0345840 A1 | 11/2017 | Su et al. | |
| 2018/0012898 A1 | 1/2018 | Wu et al. | |
| 2018/0342607 A1 | 11/2018 | Hu | |

OTHER PUBLICATIONS

U.S. Appl. No. 16/208,288, filed Dec. 3, 2018 entitled "FINFET-Based Split Gate Non-volatile Flash Memory With Extended Source Line FINFET, and Method of Fabrication," Jourba et al.

U.S. Appl. No. 15/957,615, filed Apr. 19, 2018 entitled "Split Gate Non-volatile Memory Cells and Logic Devices With FINFET Structure, and Method of Making Same"—Applicant—Silicon Storage Technology, Inc.

U.S. Appl. No. 15/933,124, filed Mar. 22, 2018 entitled "Two Transistor Finfet-Based Split Gate Non-volatile Floating Gate Flash Memory and Method of Fabrication"—Applicant—Silicon Storage Technology, Inc.

U.S. Appl. No. 16/028,244, filed Jul. 5, 2018 entitled "Split Gate Non-Volatile Memory Cells With Three-Dimensional FINFET Structure, and Method of Making Same"—Applicant—Silicon Storage Technology, Inc.

Cho, et al., "Hf-silicate Inter-Poly Dielectric Technology for sub 70 nm Body Tied FinFET Flash Memory," 2005 Symposium on VLSI Technology Digest of Technical Papers, 2005 Symposium on Kyoto, Japan, Jun. 14-16, 2005, pp. 208-209.

* cited by examiner

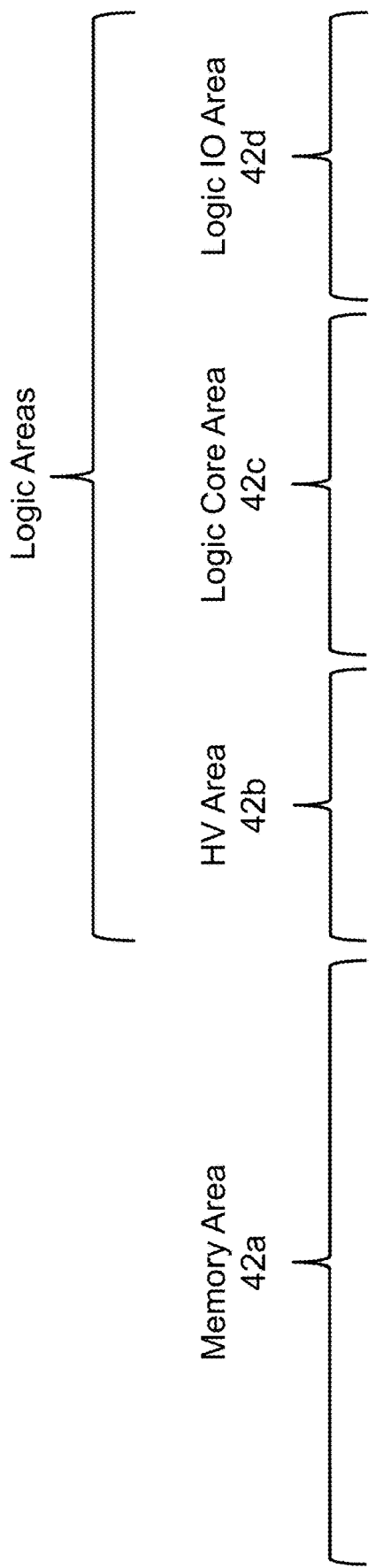
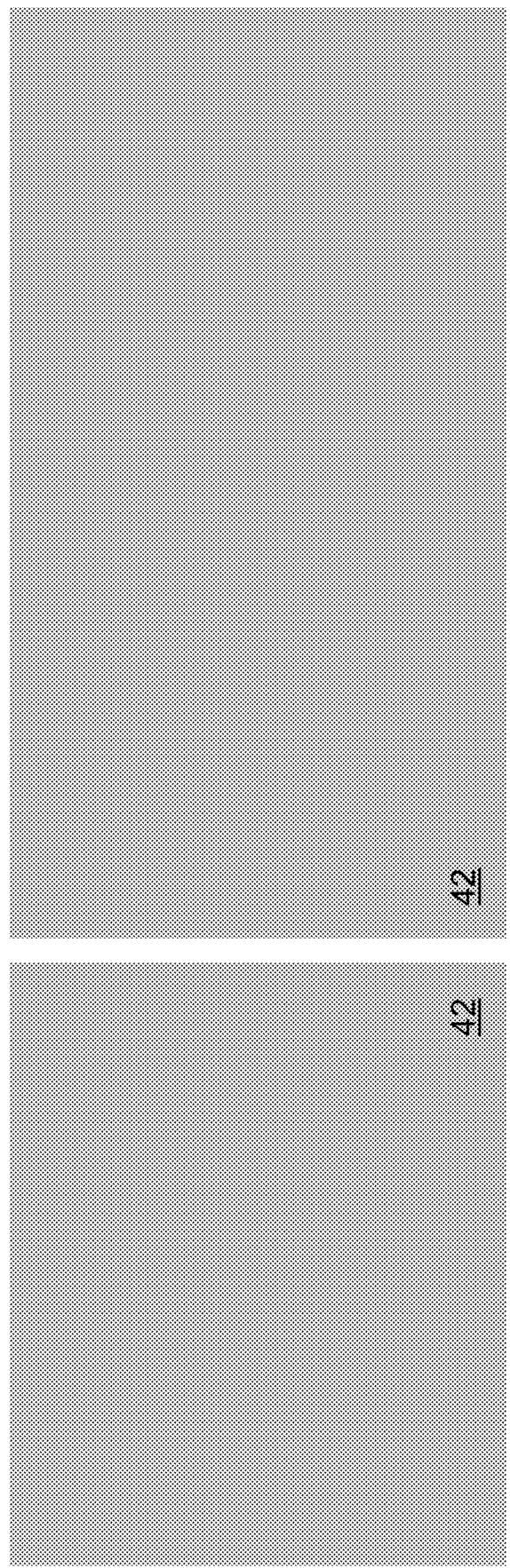
FIG. 3A (along X-section d)
FIG. 3B

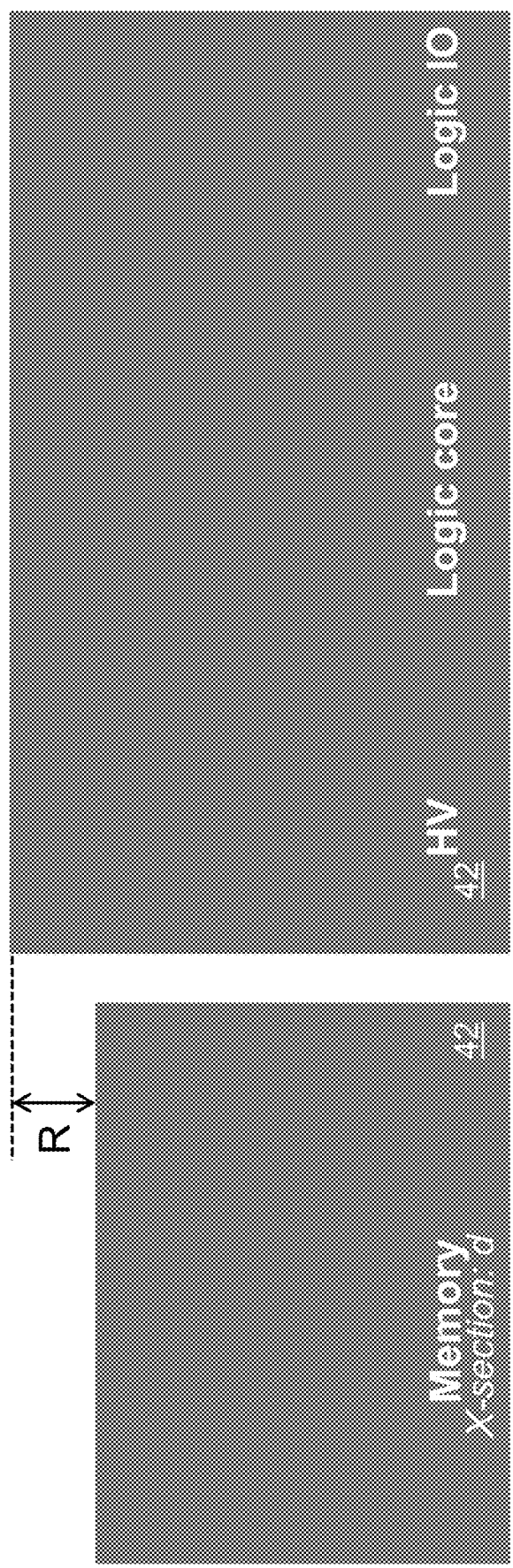

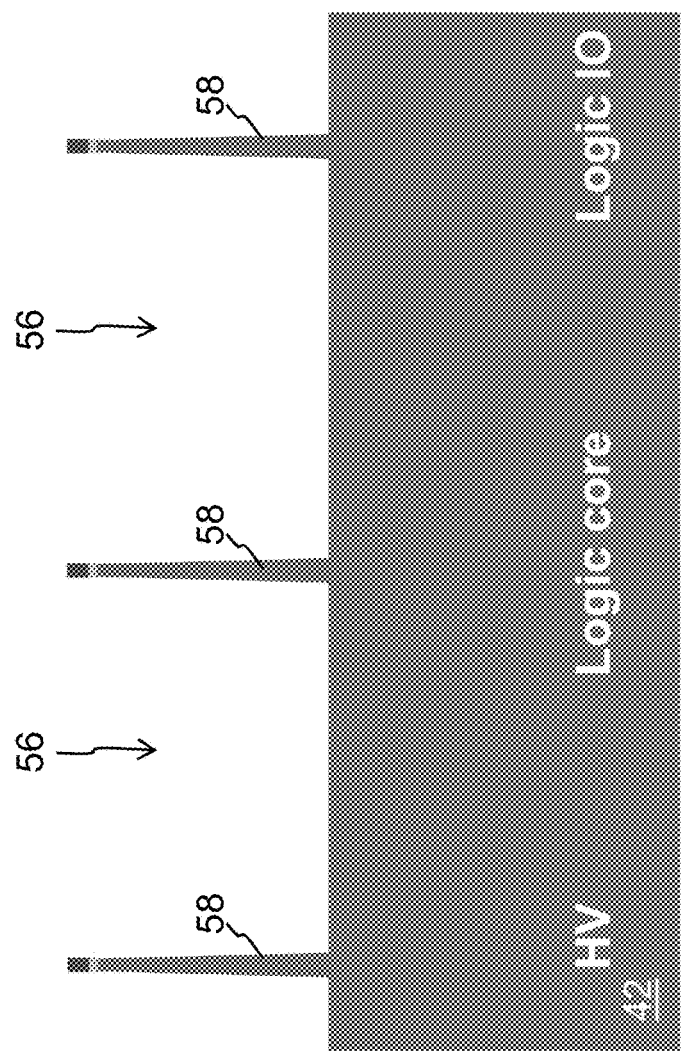
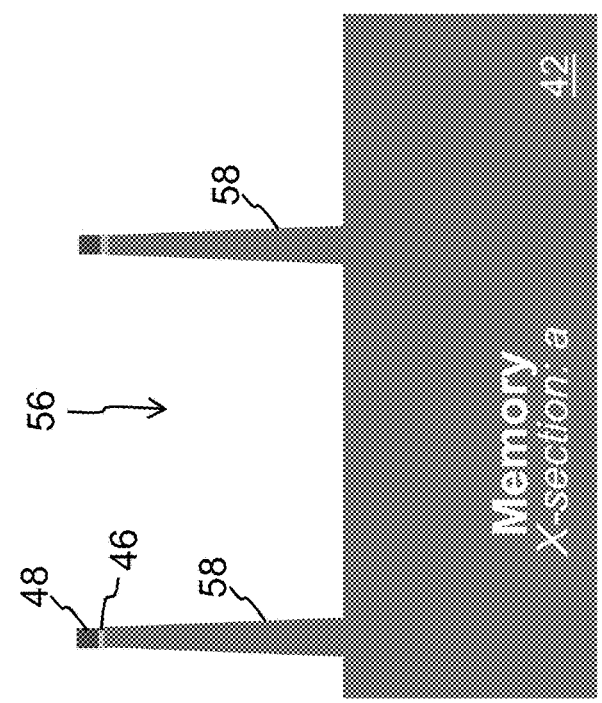
FIG. 9B
FIG. 9A

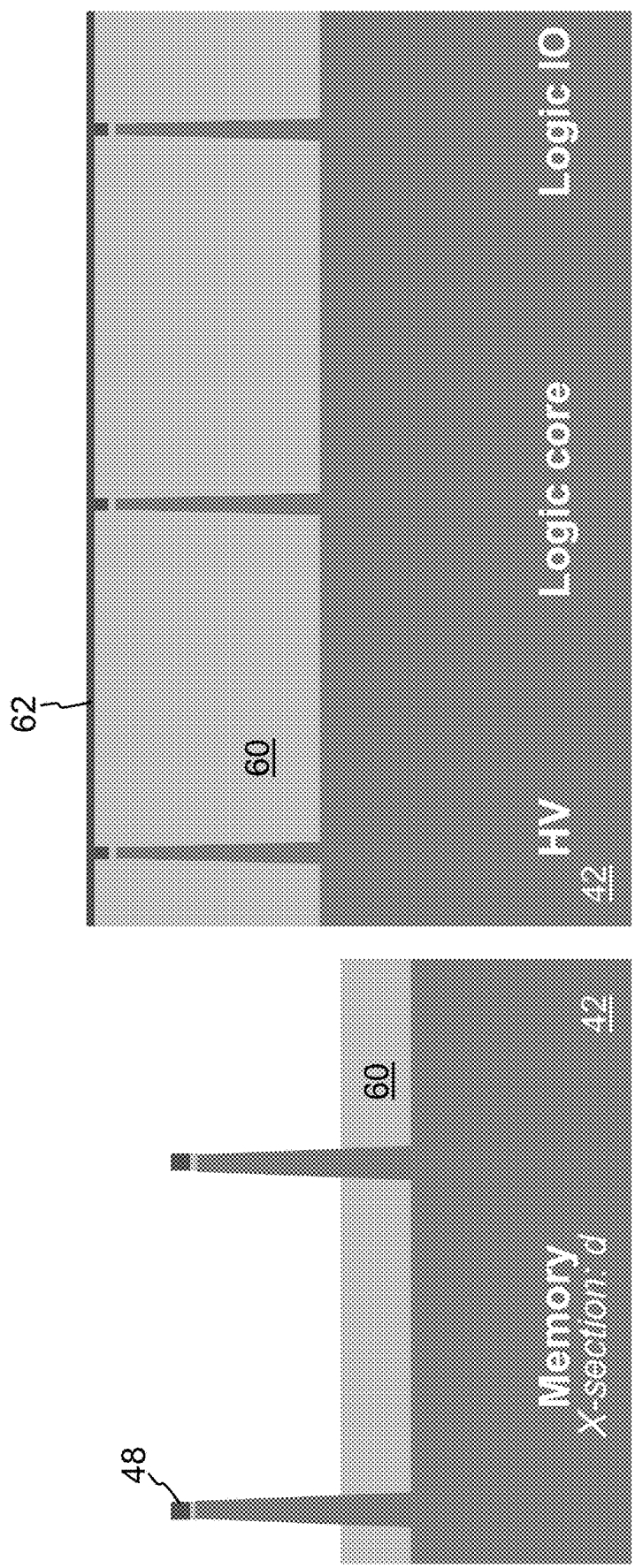

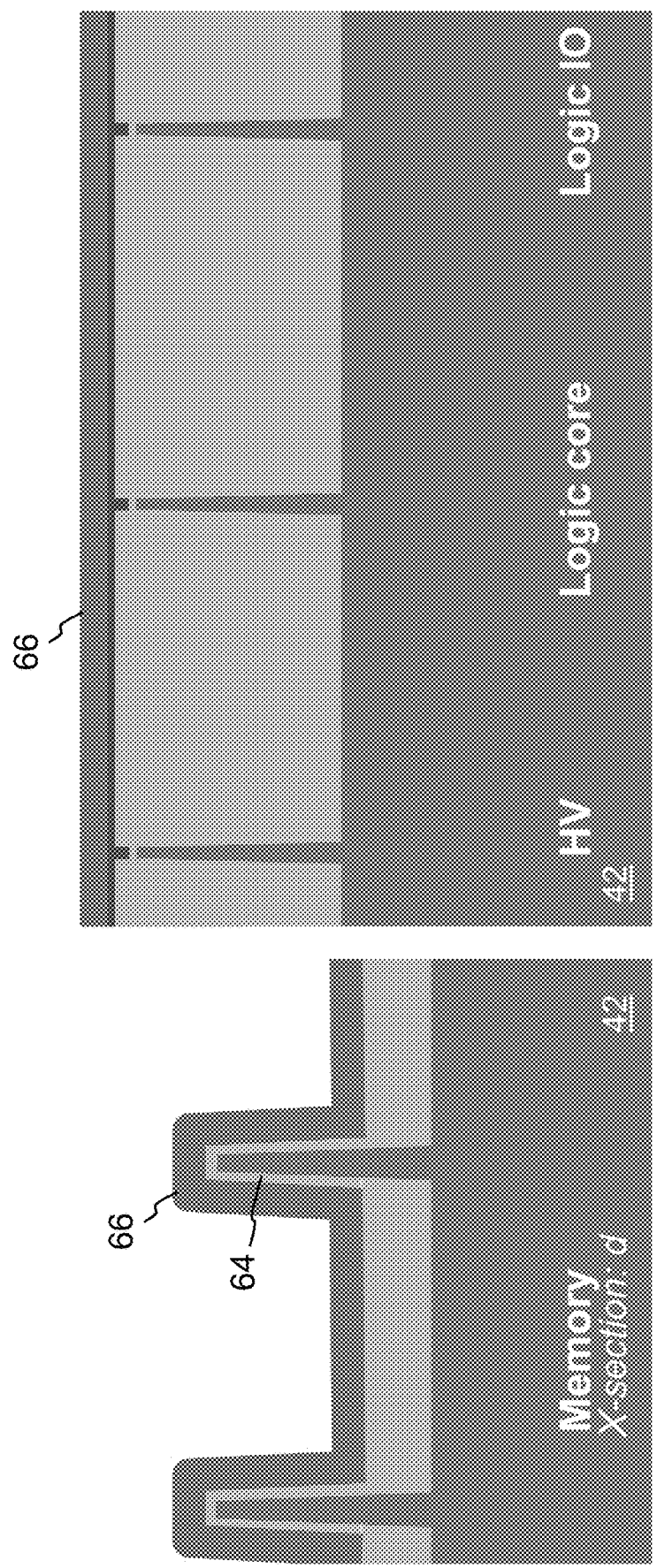

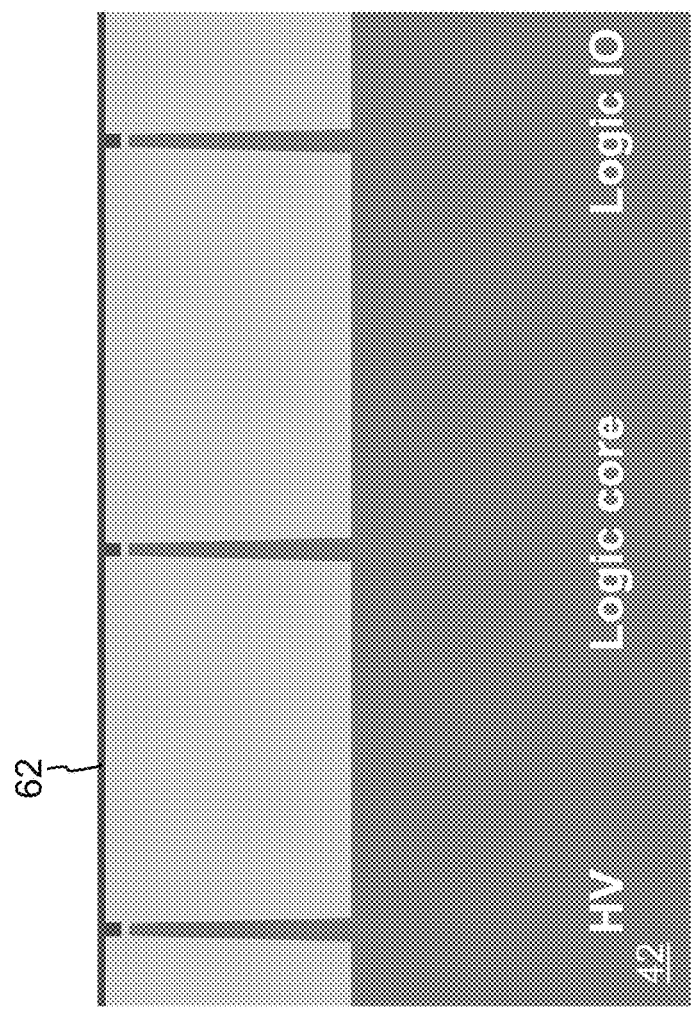
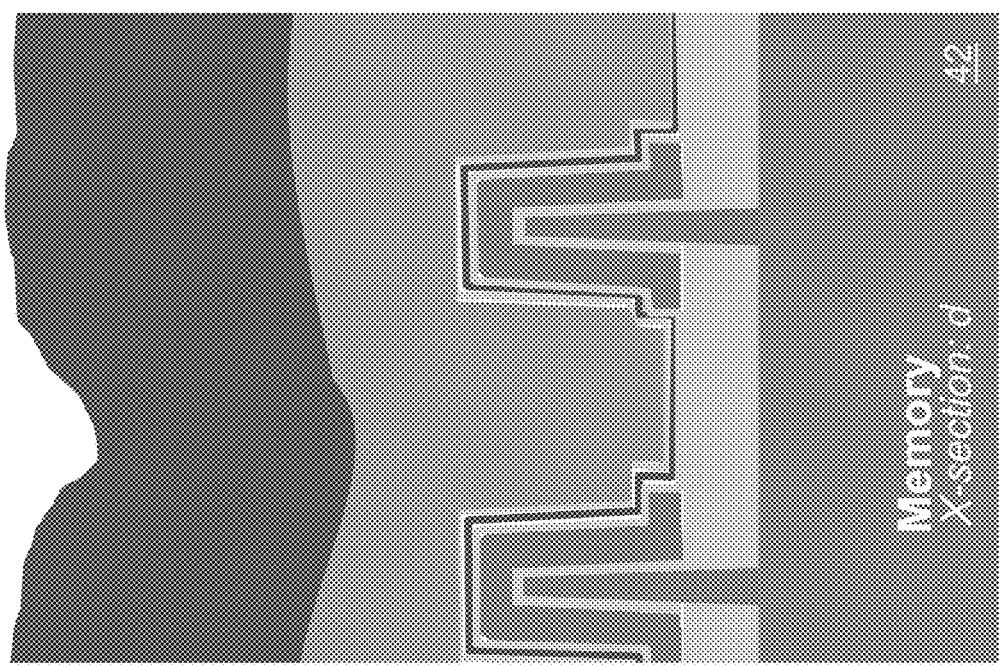
FIG. 18E
FIG. 18D

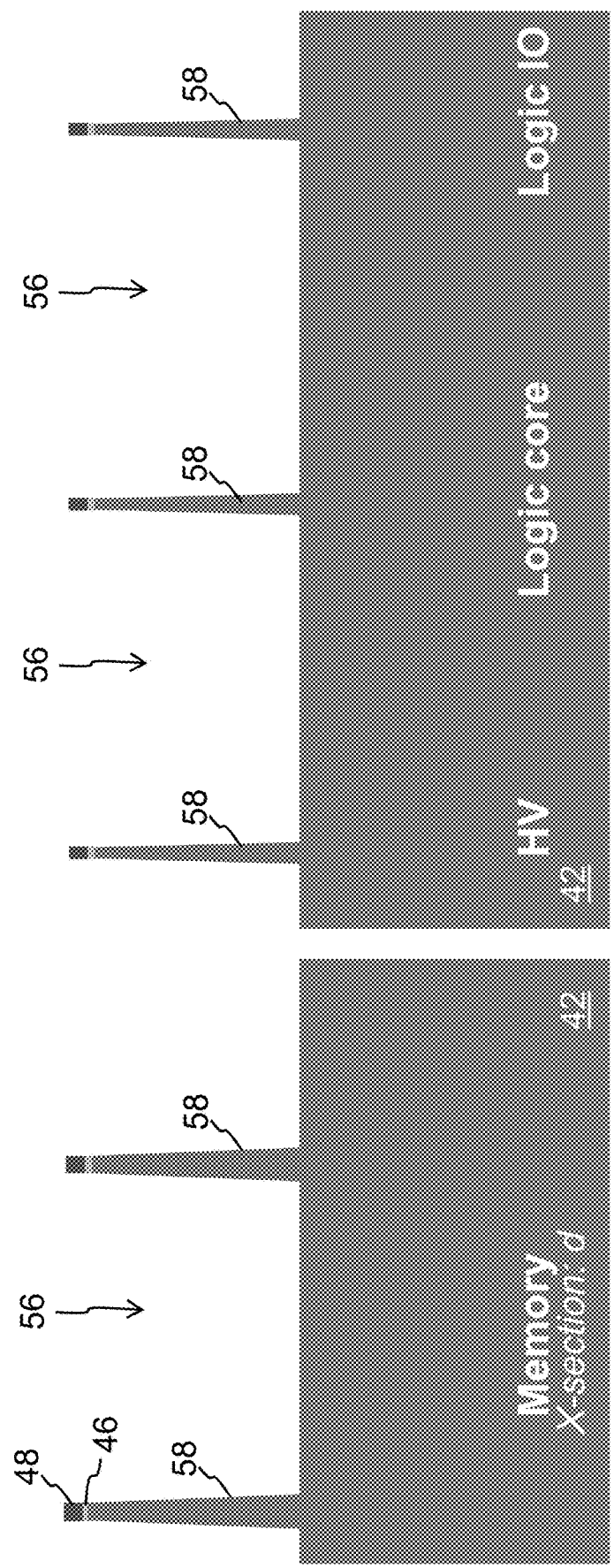

SPLIT GATE NON-VOLATILE MEMORY CELLS WITH FINFET STRUCTURE AND HKMG MEMORY AND LOGIC GATES, AND METHOD OF MAKING SAME

FIELD OF THE INVENTION

The present invention relates to non-volatile flash memory cell arrays.

BACKGROUND OF THE INVENTION

Split gate non-volatile memory devices are well known in the art. For example, U.S. Pat. No. 7,927,994 discloses a split gate non-volatile memory cell. FIG. 1 illustrates an example of such a split gate memory cell formed on a semiconductor substrate 12. Source and drain regions 16 and 14 are formed as diffusion regions in substrate 12, and define a channel region 18 there between. The memory cell includes four conductive gates: a floating gate 22 disposed over and insulated from a first portion of the channel region 18 and a portion of the source region 16, a control gate 26 disposed over and insulated from the floating gate 22, an erase gate 24 disposed over and insulated from the source region 16, and a select gate 20 disposed over and insulated from a second portion of the channel region 18. A conductive contact 10 can be formed to electrically connect to the drain region 14. Because the channel region is formed along the planar surface of the semiconductor substrate, as device geometries get smaller, so too does total area (e.g. width) of the channel region. This reduces the current flow between the source and drain regions, requiring inter alia more sensitive sense amplifiers to detect the state of the memory cell.

Because the problem of shrinking the lithography size thereby reducing the channel width affects all semiconductor devices, a Fin-FET type of structure has been proposed. In a Fin-FET type of structure, a fin shaped member of semiconductor material connects the source to the drain regions. The fin shaped member has two side surfaces terminating in a top surface. Current from the source to the drain regions can then flow along the two side surfaces and the top surface. Thus, the width of the channel region is increased, thereby increasing the current flow. However, the width of the channel region is increased without sacrificing more semiconductor real estate by "folding" the channel region into two side surfaces and the top surface, thereby reducing the "footprint" of the channel region. Non-volatile memory cells using such Fin-FETs have been disclosed, where the floating gates are disposed adjacent to one of the side surfaces of the fin shaped member. Some examples of prior art Fin-FET non-volatile memory structures (although the number and configuration of the gates varies from the above described planar example in FIG. 1) include U.S. Pat. Nos. 7,423,310, 7,410,913 and 8,461,640, and U.S. Patent Publication 2017/0345840. It has also been proposed to form logic devices on fin shaped members. See for example U.S. Patent Publication 2017/0125429 and pending U.S. patent application Ser. No. 15/933,124.

However, these prior art Fin-FET structures have disclosed using the floating gate in stacked gate configuration, or using trapping material, or using SRO (silicon rich oxide) or using nanocrystal silicon to store charges, or other more complicated memory cell configurations which can add to the cost of making the device.

BRIEF SUMMARY OF THE INVENTION

The aforementioned problems and needs are addressed by a memory device that includes a semiconductor substrate having an upper surface with a plurality of upwardly extending fins, wherein each of the fins includes first and second side surfaces that oppose each other and that terminate in a top surface, a memory cell formed on a first fin of the plurality of fins and a logic device formed on a second fin of the plurality of fins. The memory cell includes spaced apart first source and first drain regions in the first fin, with a first channel region of the first fin extending along the top surface and the opposing side surfaces of the first fin between the first source and first drain regions, a floating gate of polysilicon material that extends along a first portion of the first channel region, wherein the floating gate extends along and is insulated from the first and second side surfaces and the top surface of the first fin, a select gate of metal material that extends along a second portion of the first channel region, wherein the select gate extends along and is insulated from the first and second side surfaces and the top surface of the first fin, a control gate of polysilicon material that extends along and is insulated from the floating gate, and an erase gate of polysilicon material that extends along and is insulated from the first source region. The logic device includes spaced apart second source and second drain regions in the second fin, with a second channel region of the second fin extending along the top surface and the opposing side surfaces of the second fin between the second source and second drain regions, and a first logic gate of metal material that extends along the second channel region, wherein the first logic gate extends along and is insulated from the first and second side surfaces and the top surface of the second fin.

A method of forming a memory device includes forming a plurality of upwardly extending fins in an upper surface of a semiconductor substrate, wherein each of the fins includes first and second side surfaces that oppose each other and that terminate in a top surface, forming a memory cell on a first fin of the plurality of fins, and forming a logic device on a second fin of the plurality of fins. The memory cell is formed by forming spaced apart first source and first drain regions in the first fin, with a first channel region of the first fin extending along the top surface and the opposing side surfaces of the first fin between the first source and first drain regions, forming a floating gate of polysilicon material that extends along a first portion of the first channel region, wherein the floating gate extends along and is insulated from the first and second side surfaces and the top surface of the first fin, forming a select gate of metal material that extends along a second portion of the first channel region, wherein the select gate extends along and is insulated from the first and second side surfaces and the top surface of the first fin, forming a control gate of polysilicon material that extends along and is insulated from the floating gate, and forming an erase gate of polysilicon that extends along and is insulated from the first source region. The logic device is formed by forming spaced apart second source and second drain regions in the second fin, with a second channel region of the second fin extending along the top surface and the opposing side surfaces of the second fin between the second source and second drain regions, and forming a first logic gate of metal material that extends along the second channel region, wherein the first logic gate extends along and is insulated from the first and second side surfaces and the top surface of the second fin.

Other objects and features of the present invention will become apparent by a review of the specification, claims and appended figures.

BRIEF DESCRIPTION OF THE DRAWINGS

FIGS. 3A, 4A, 5A, 6A, 7A, 8A, 9A, 10A, 11A-11C, 12A-12D, 13A-13D, 14A-14D, 15A-15D, 16A-16D, 17A-17D, 18A-18D, 19A-19D, 20A-20D, 22A-22D, 23A-23B, 24A-24B, 25A, 26A, 27A, 28A, 29A, 30A, 31A and 32A are side cross sectional views of different cross sectional positions and directions of the Memory Area showing the steps in forming the memory device of the present invention.

FIGS. 3B, 4B, 5B, 6B, 7B, 8B, 9B, 10B, 11D, 12E, 13E, 14E, 15E, 16E, 17E, 18E, 19E, 20E, 21, 25B-25C, 26B, 27B, 28B, 29B, 30B, 31B and 32B are side cross sectional views of the Logical Device Areas showing the steps in forming the memory device of the present invention.

FIGS. 33A and 34A are side cross sectional views of the Memory Area showing the steps in forming the memory device according to an alternate embodiment of the present invention.

FIGS. 33B and 34B are side cross sectional views of the Logical Device Areas showing the steps in forming the memory device according to the alternate embodiment of the present invention.

DETAILED DESCRIPTION OF THE INVENTION

Figure 1:
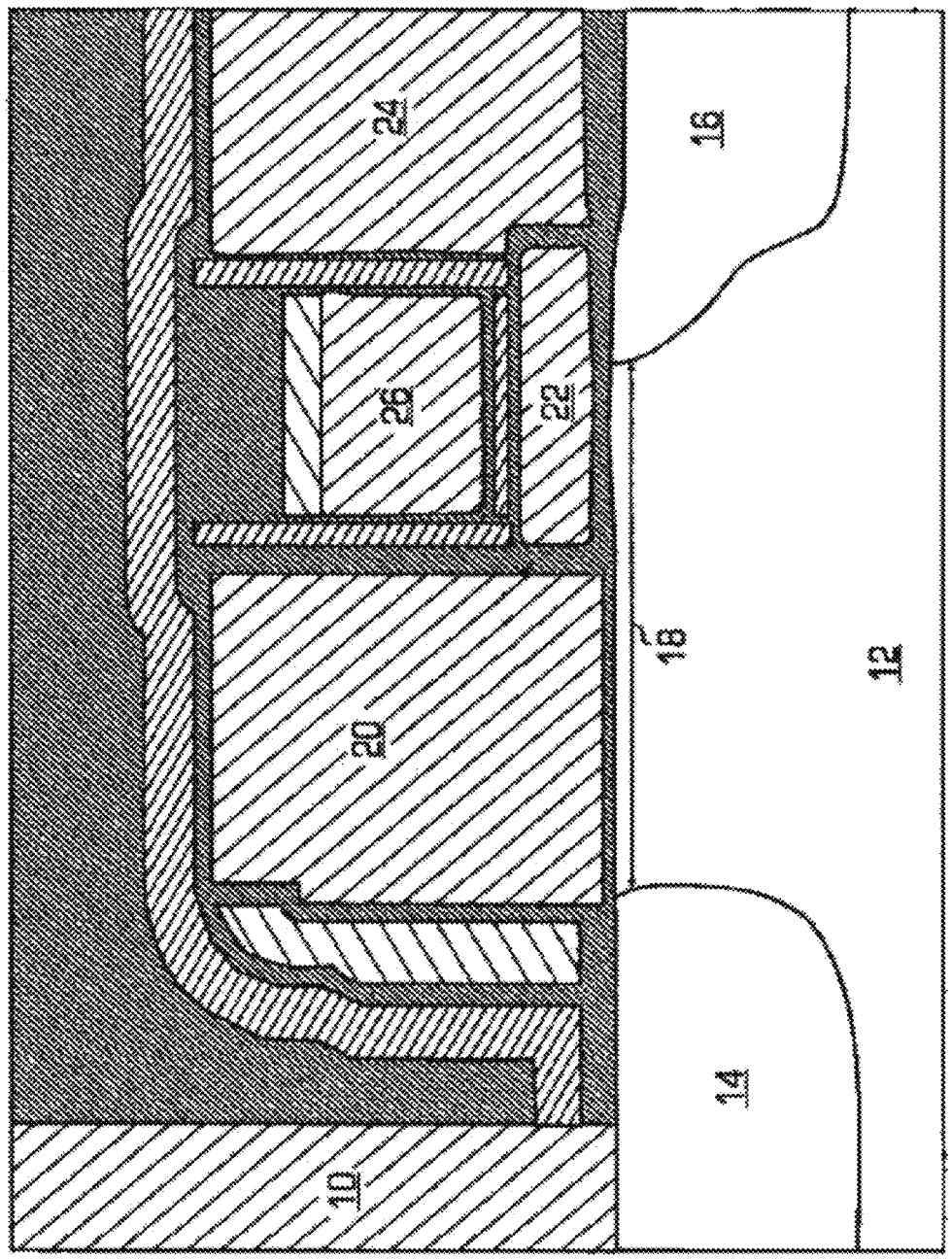
FIG. 1 is a side cross sectional view of a conventional non-volatile memory cell.
Figure 2:
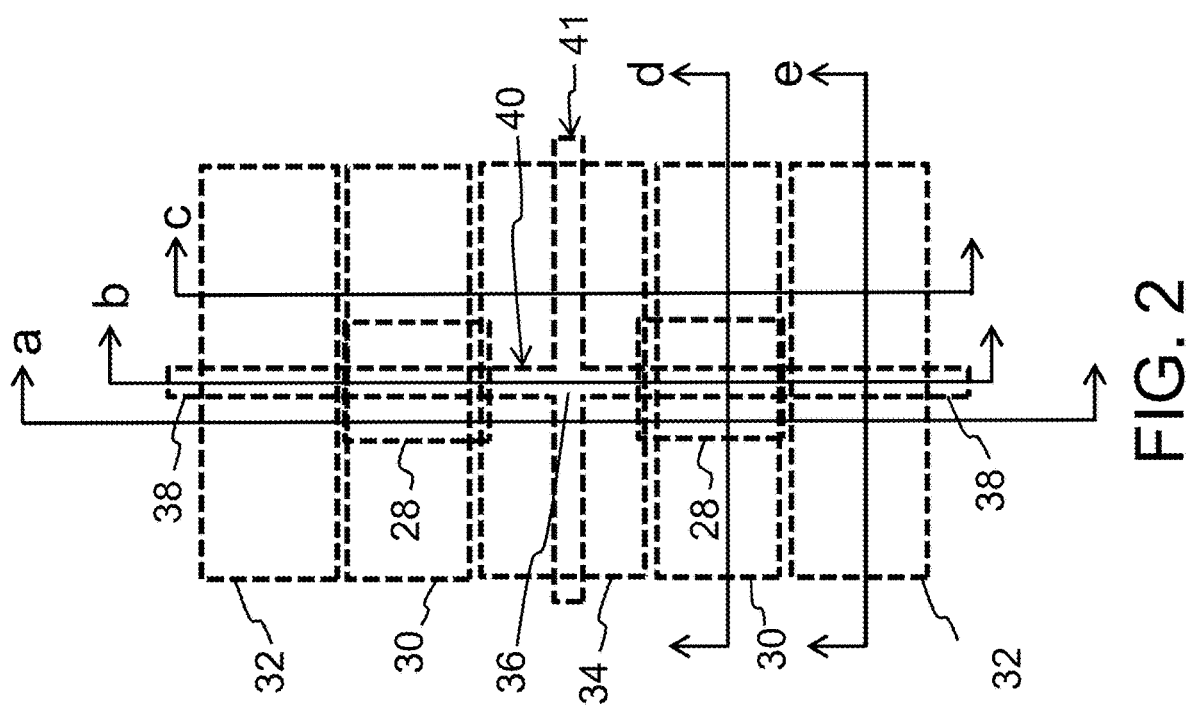
FIG. 2 is a top view of the Memory Area illustrating the various cross sectional view directions for other figures.

The present embodiments enable a memory device having Fin-FET split gate type memory cells each having four gates: a floating gate 28, control gate 30, a select gate 32 and an erase gate 34. Fin-FET logic devices are formed on the same substrate as the memory cells. FIG. 2 is a top view illustrating the configuration of a mirror pair of memory cells in the memory area of the substrate. The mirror pair of memory cells share a common source region 36 (i.e., a region of the substrate having a second conductivity type different than the first conductivity type of the substrate), where drain regions 38 (of the second conductivity type) are shared among adjacent pairs of memory cells (not shown). The substrate includes crossing fin shaped portions 40 and 41 of the upper surface of a semiconductor substrate 42. The memory cells are formed on the fin shaped portions 40. FIG. 2 further shows the cross sectional view directions a, b, c, d and e for subsequently described figures.

The fabrication process begins by selectively implanting different areas of a semiconductor substrate 42. The various areas of the substrate 42 are shown in FIGS. 3A and 3B (i.e., FIGS. 3A and 3B show different areas of the same substrate 42), where the substrate has four areas relating to memory cells and logic devices: the Memory Area 42a (in which memory cells are formed), the HV Area 42b (in which high voltage logic devices are formed), the Logic Core Area 42c (in which core logic devices are formed) and the Logic IO Area 42d (in which input/output logic devices are formed). Areas 42b, 42c and 42d are referred to herein collectively as the Logic Areas. Preferably, the selective implantation begins by covering the substrate with a masking material except for the HV Area 42b, which is subjected to one or more implantation steps (e.g., an anti-punchthrough implantation that will prevent source to drain leakage in the high voltage logic devices formed in this area). This can be repeated for Memory Area 42a (e.g., cover the other areas with masking material, and perform an anti-punchthrough implantation that will prevent source to drain leakage in the memory cells formed in this area).

The upper surface of Memory Area 42a of the substrate 42 is then recessed (lowered) compared to the Logic Areas of the substrate, as shown in FIGS. 4A and 4B. This is preferably done by forming a layer of material (e.g., silicon nitride) on the substrate 42, followed by a masking step (i.e., photoresist deposition, selective photolithography exposure and selective photoresist removal), leaving photoresist on the silicon nitride in the Logic Areas, but leaving the silicon nitride exposed in Memory Area 42a. A silicon nitride etch is used to remove the silicon nitride from Memory Area 42a leaving the substrate surface exposed. After photoresist removal, the exposed portion of the substrate 42 (in Memory Area 42a) is oxidized, followed by a wet oxide etch to remove the oxidized portion of the substrate, which effectively removes a top portion of the substrate (effectively lowering/recessing its upper surface). These steps can be repeated until the desired level of surface recess R is achieved (e.g., 300-500 nm). A nitride etch is then used to remove the nitride from the Logic Areas.

Figure 5B:
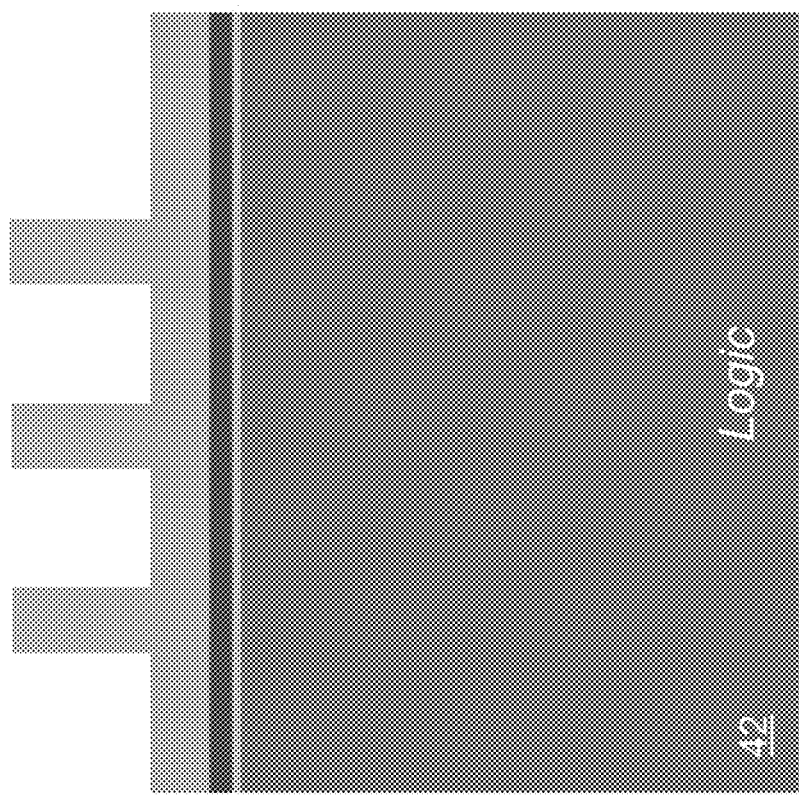
Figure 5A:
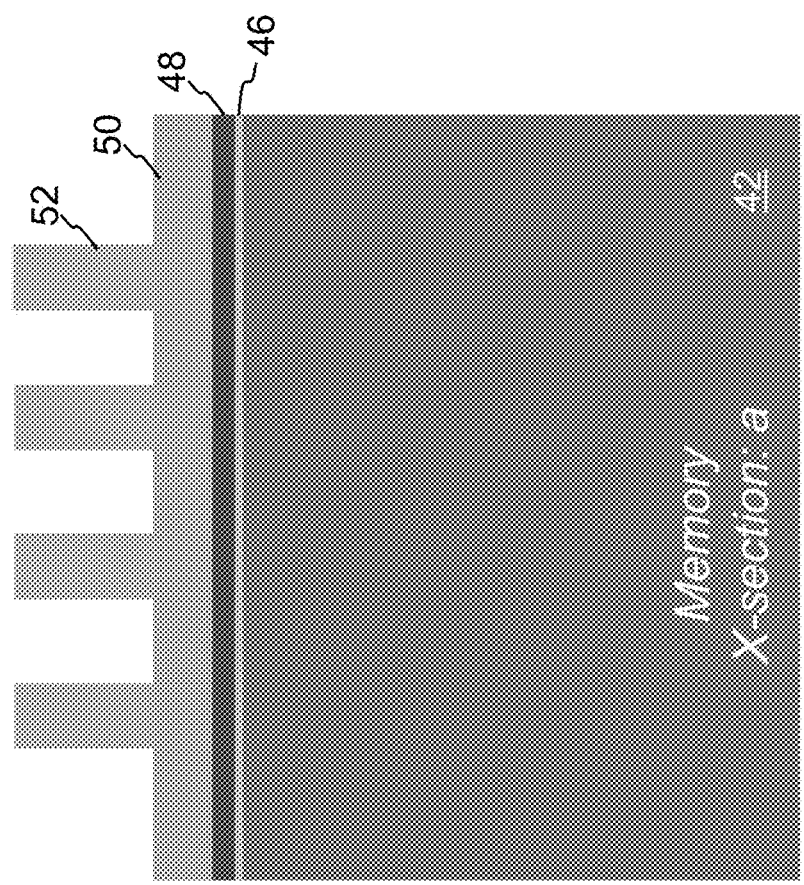
Figure 6B:
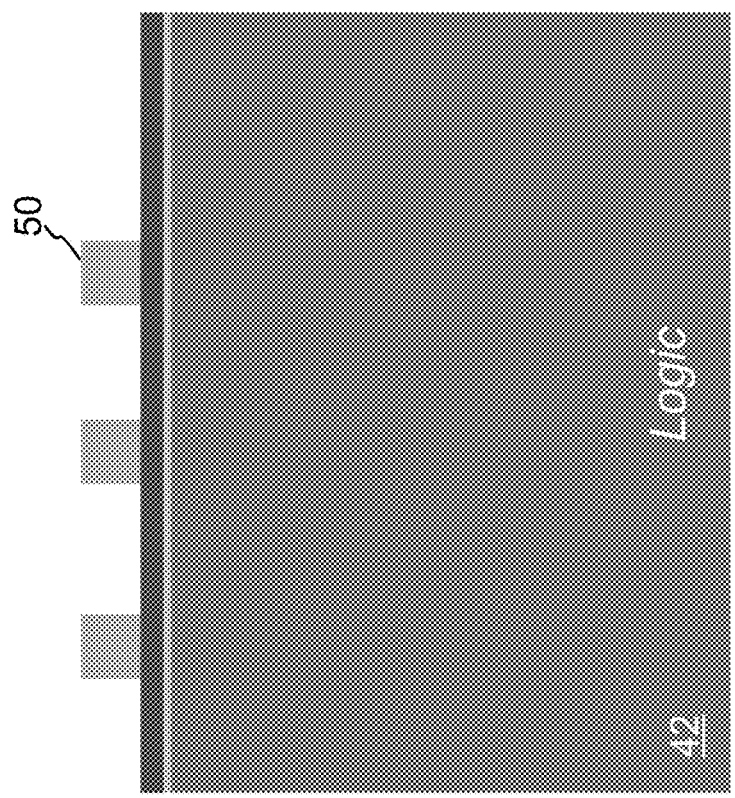
Figure 6A:
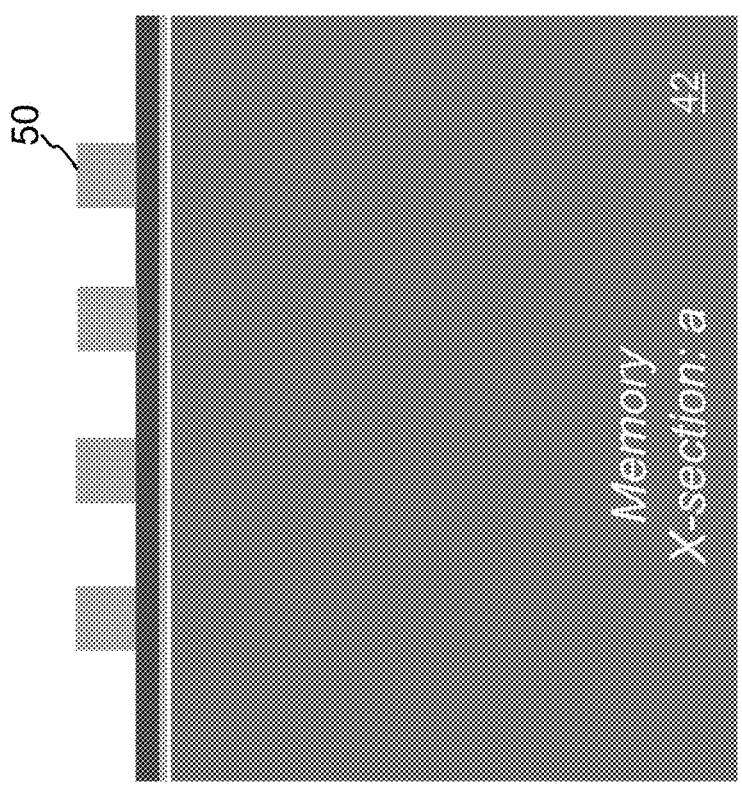

Fins are then formed in the substrate upper surface. Specifically, crossing fins are formed in Memory Area 42a, while parallel fins are formed in the Logic Areas. A silicon dioxide (oxide) layer 46 is formed on the upper surface in all four areas (Memory Area 42a, HV Area 42b, Logic Core Area 42c and Logic IO Area 42d) of the substrate 42. A silicon nitride (nitride) layer 48 is formed on oxide layer 46. A hard mask material (e.g. amorphous carbon) 50 is formed on the nitride layer 48. Photoresist 52 is formed on the hard mask material 50 and patterned using a masking step to expose a grid of intersecting strips of the hard mask material 50, as shown in FIGS. 5A and 5B. An etch is performed to remove the exposed portions of hard mask material, leaving strips of hard mask material 50, as shown in FIGS. 6A and 6B (after photoresist removal).

Figure 7B:
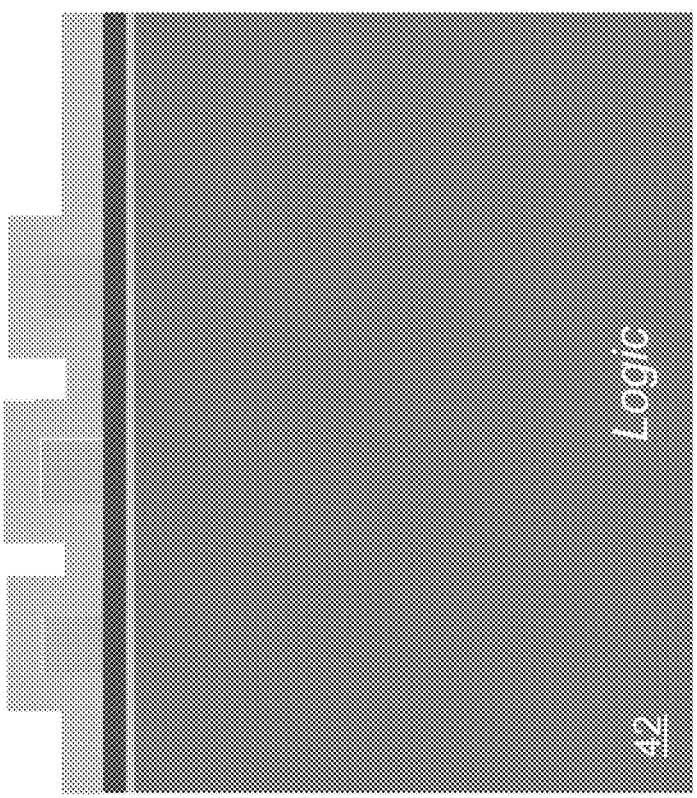
Figure 7A:
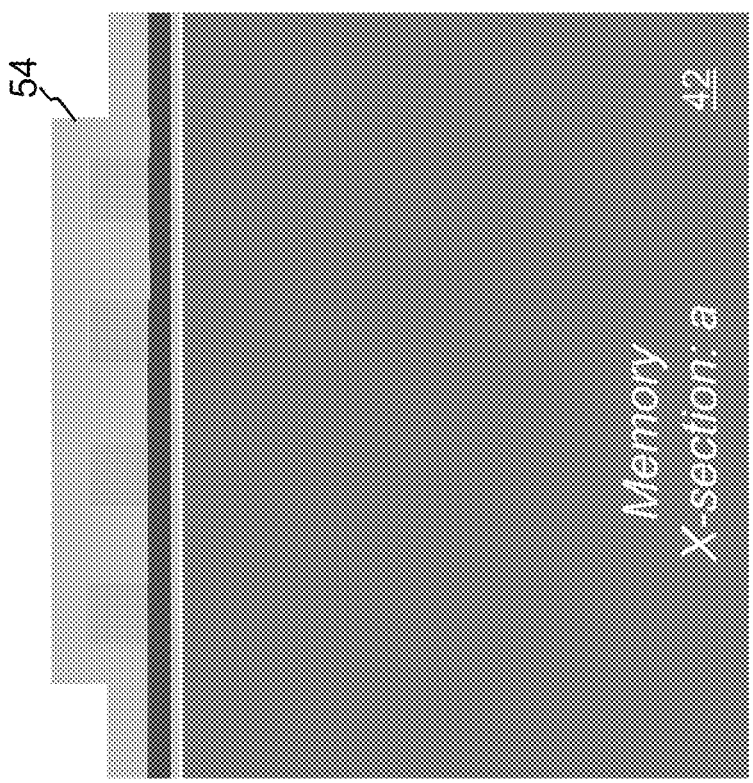
Figure 8B:
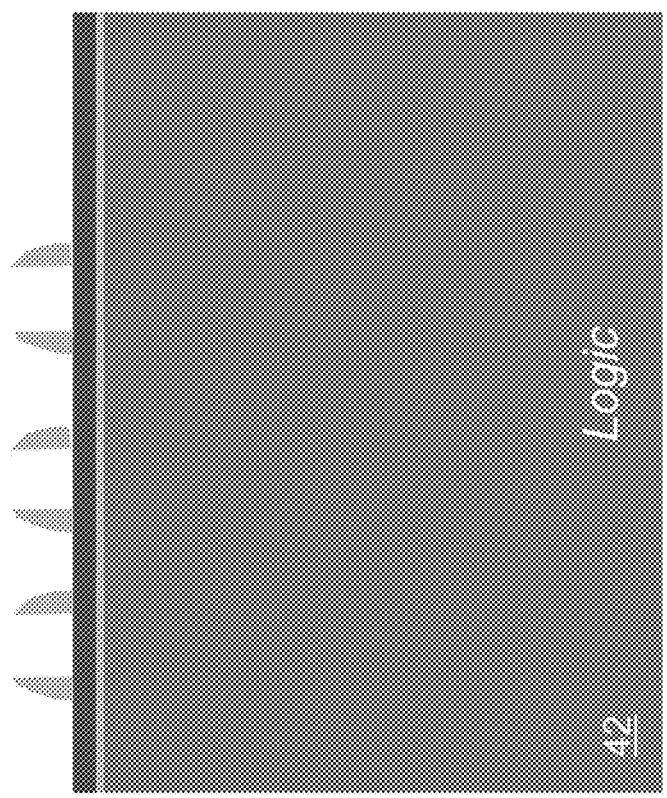
Figure 8A:
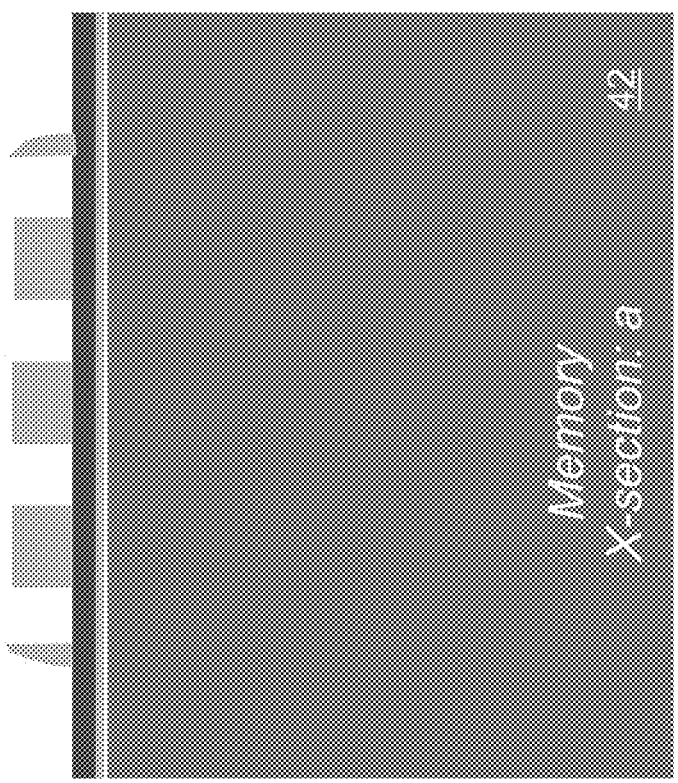
Figure 9C:
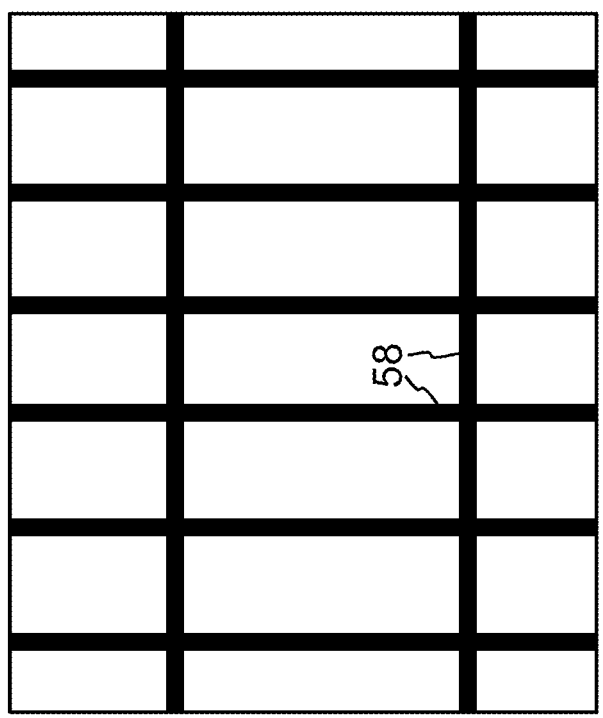
FIG. 9C is a top view of the Memory Area illustrating the vertically and horizontally extending fins of the substrate.
Figure 11A:
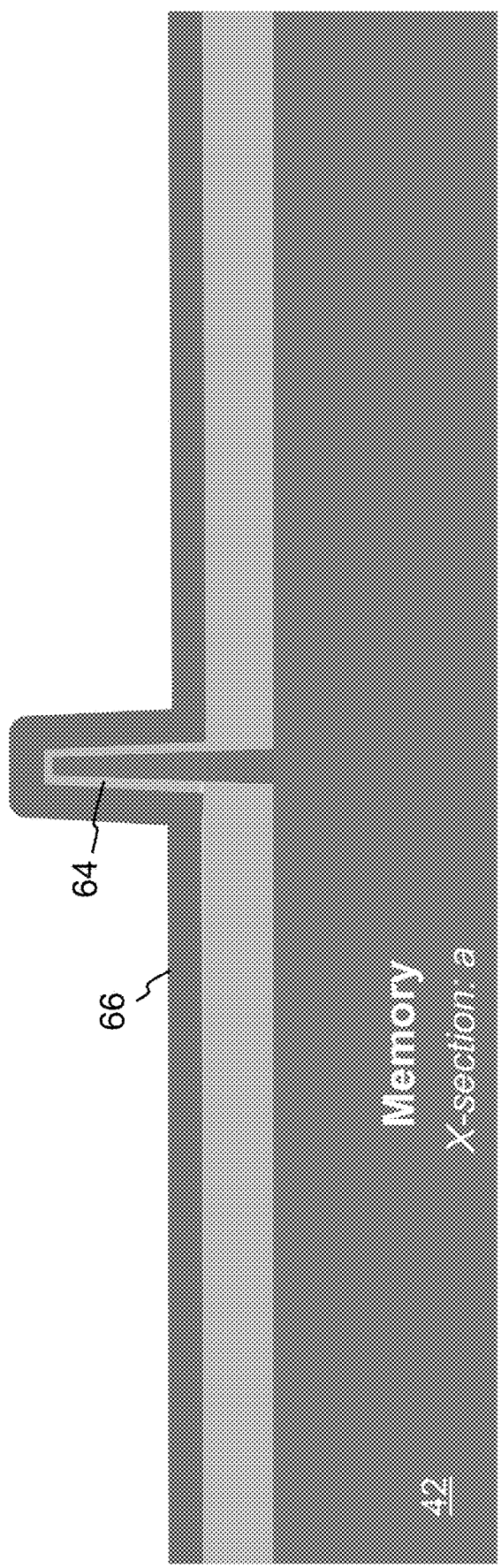
Figure 11B:
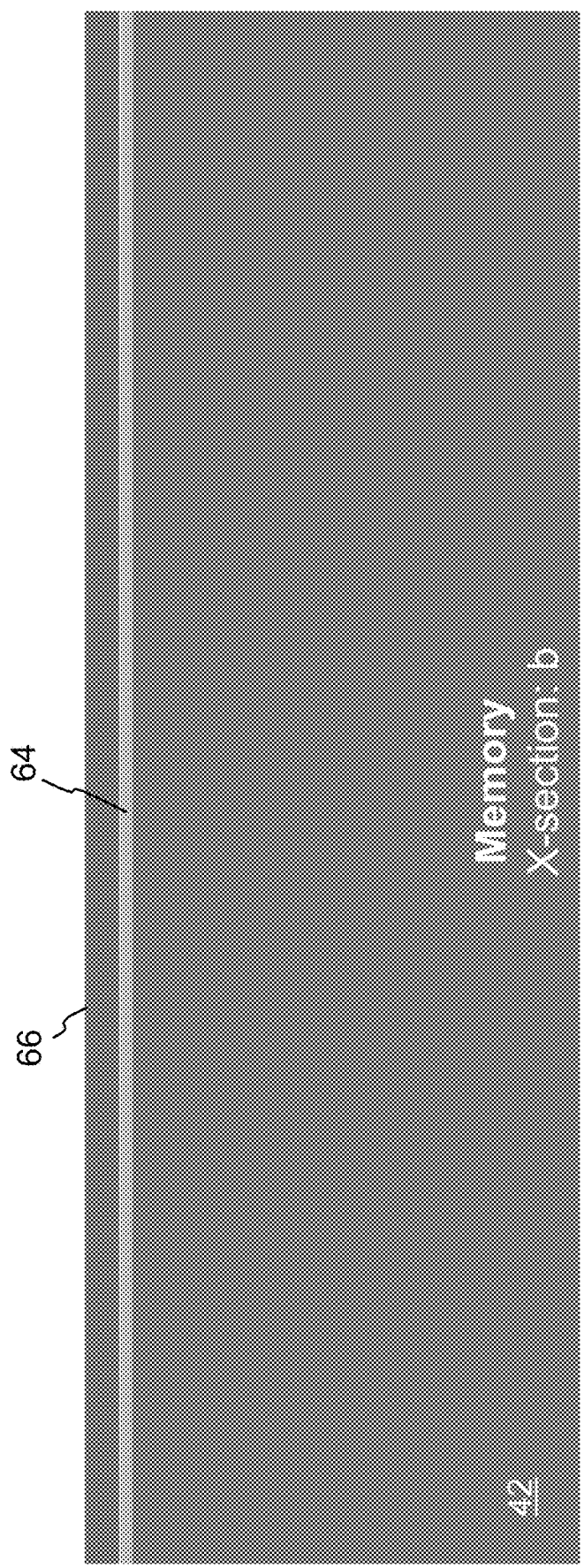
Figure 12A:
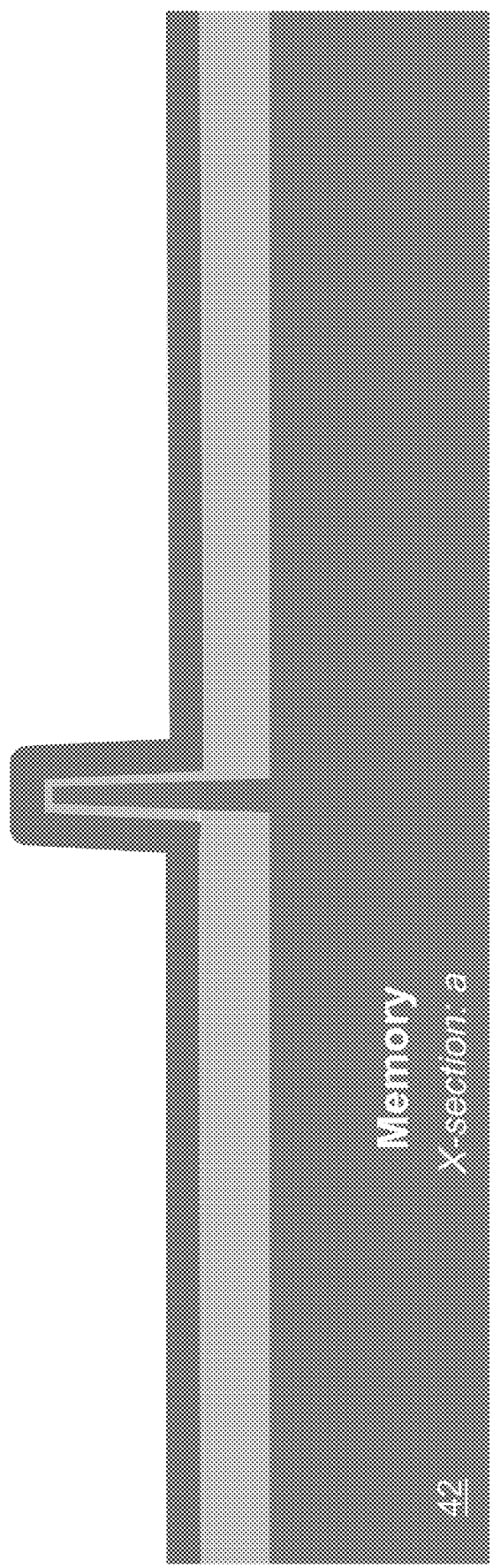
Figure 12B:
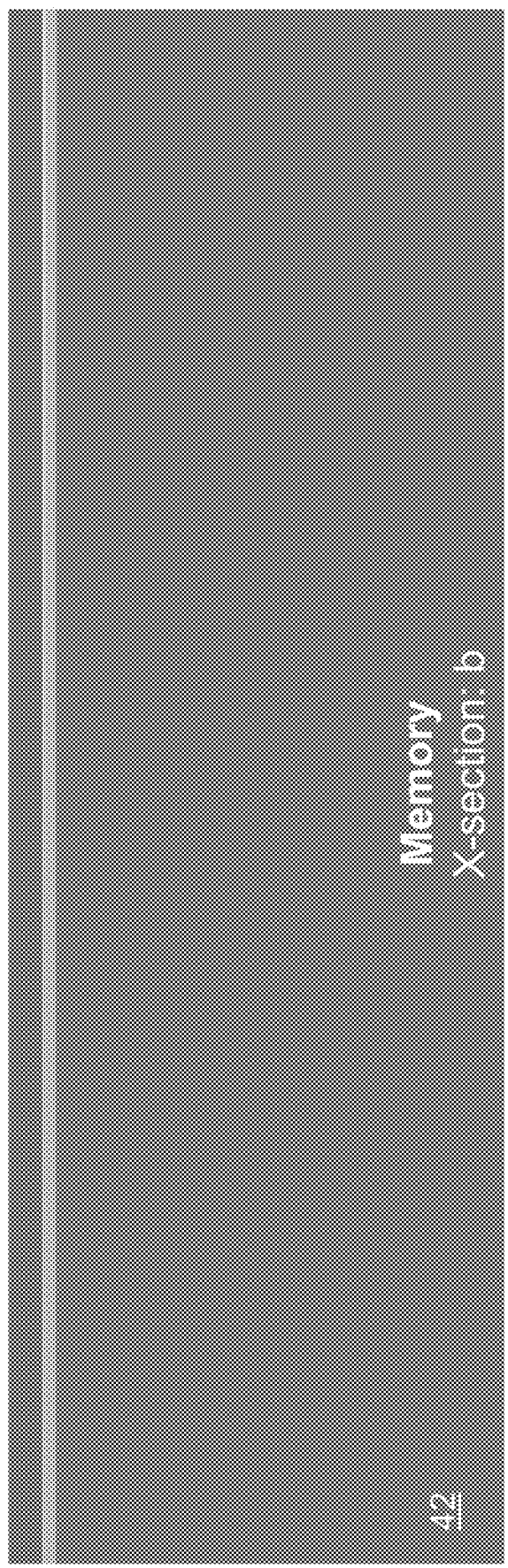
Figure 12C:
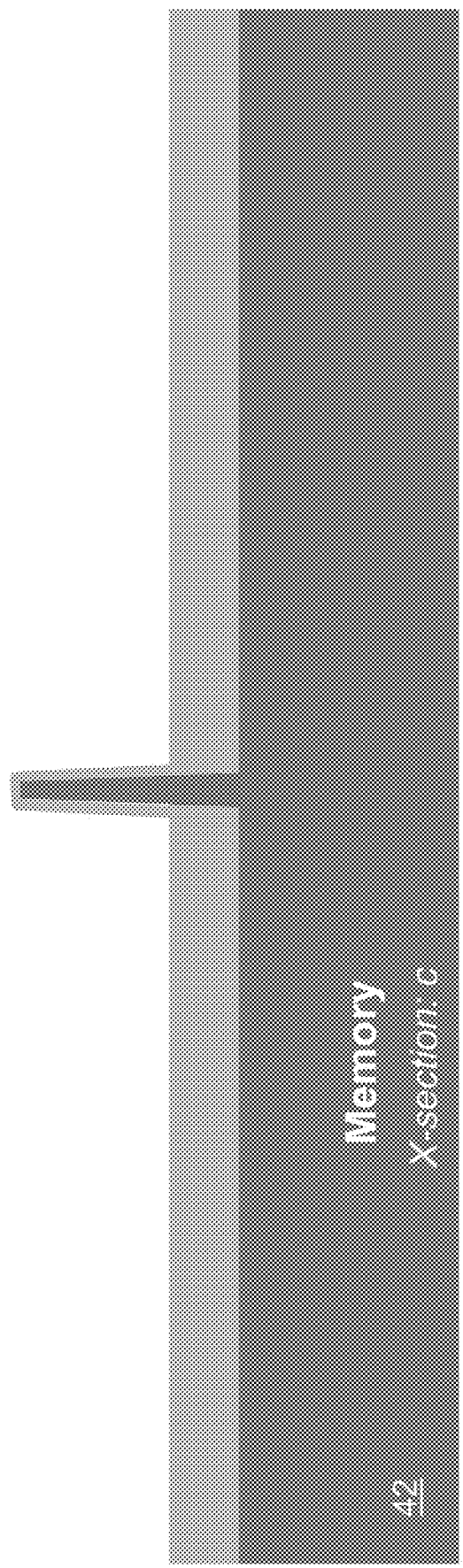
Figure 12E:
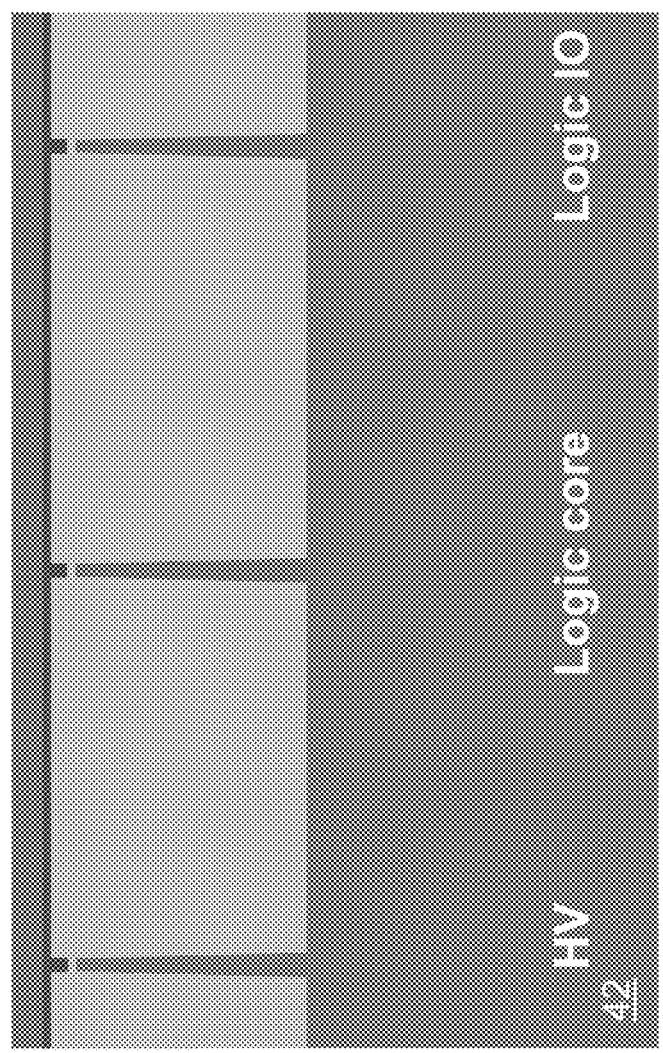
Figure 12D:
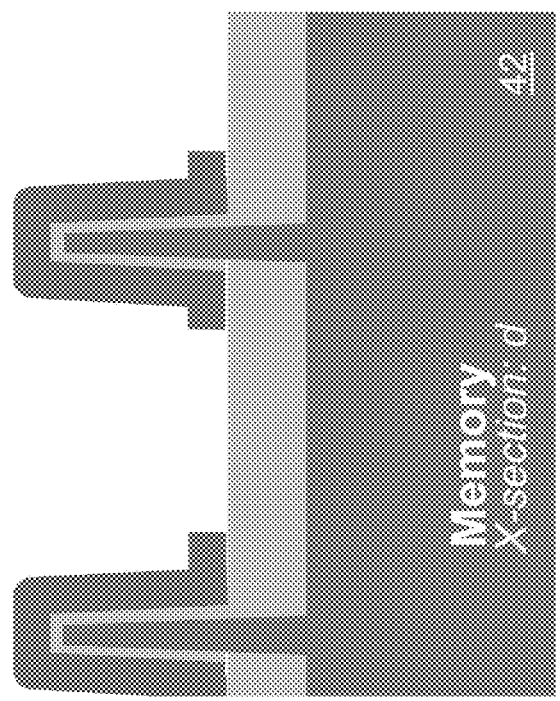
Figure 13A:
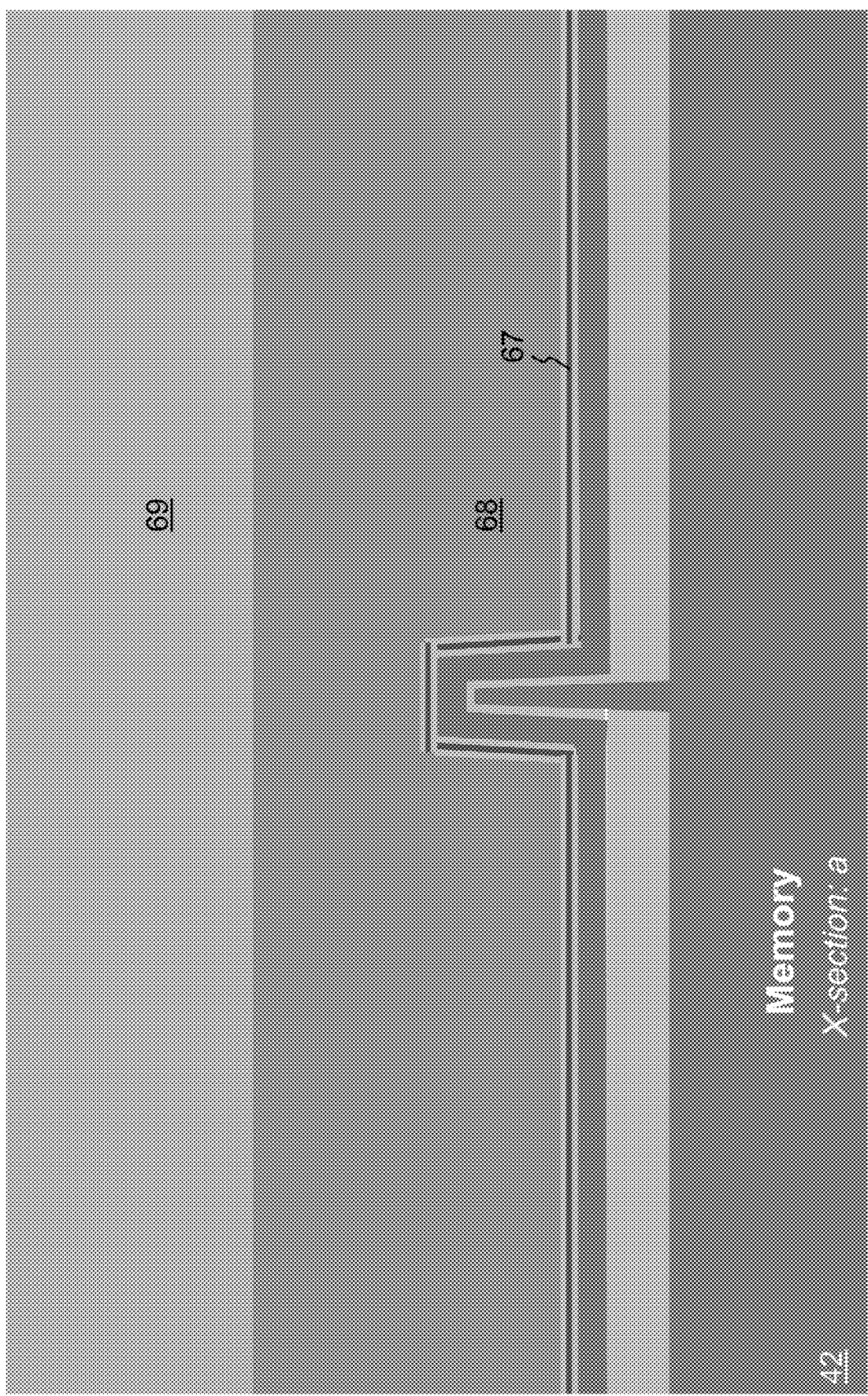
Figure 13B:
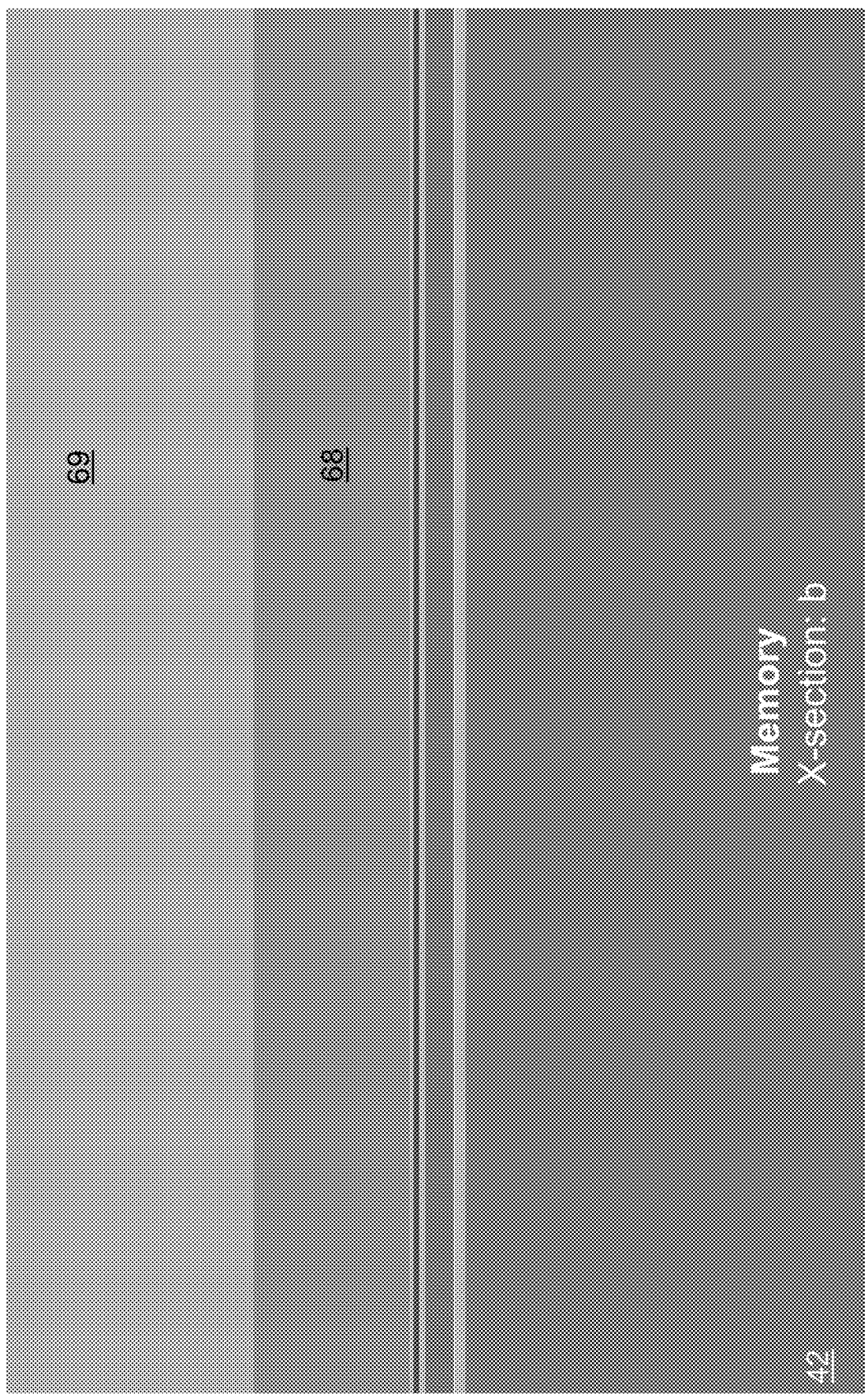
Figure 13C:
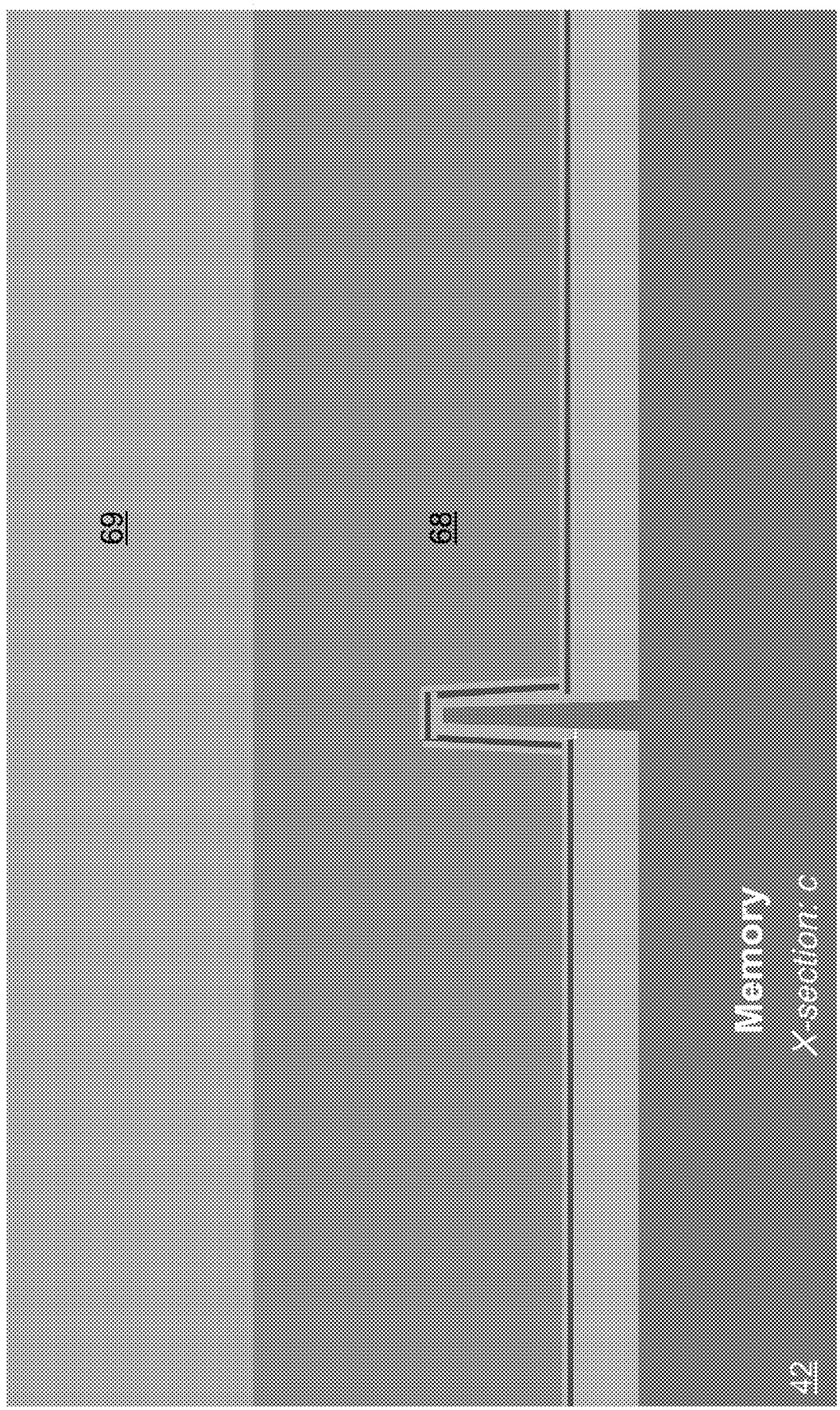
Figure 13E:
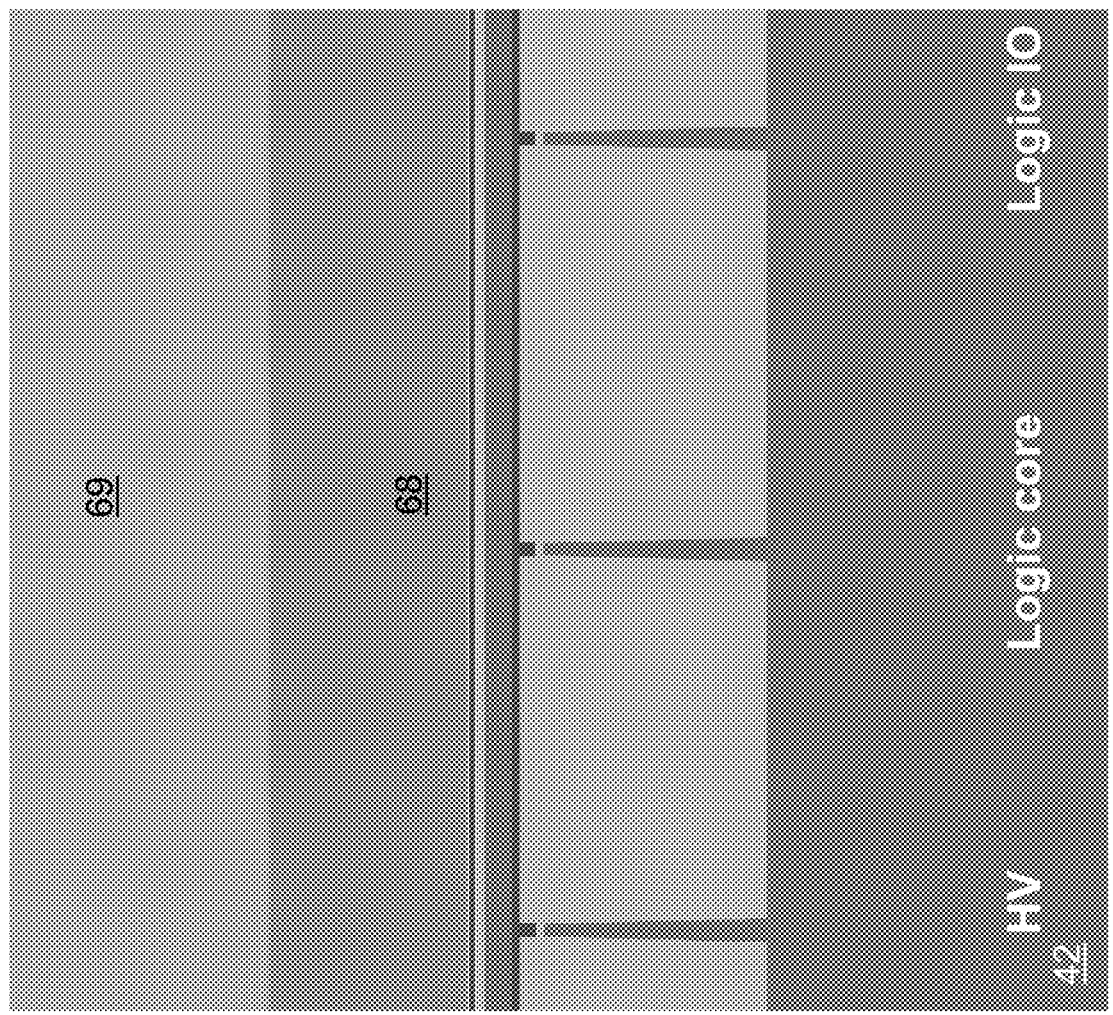
Figure 13D:
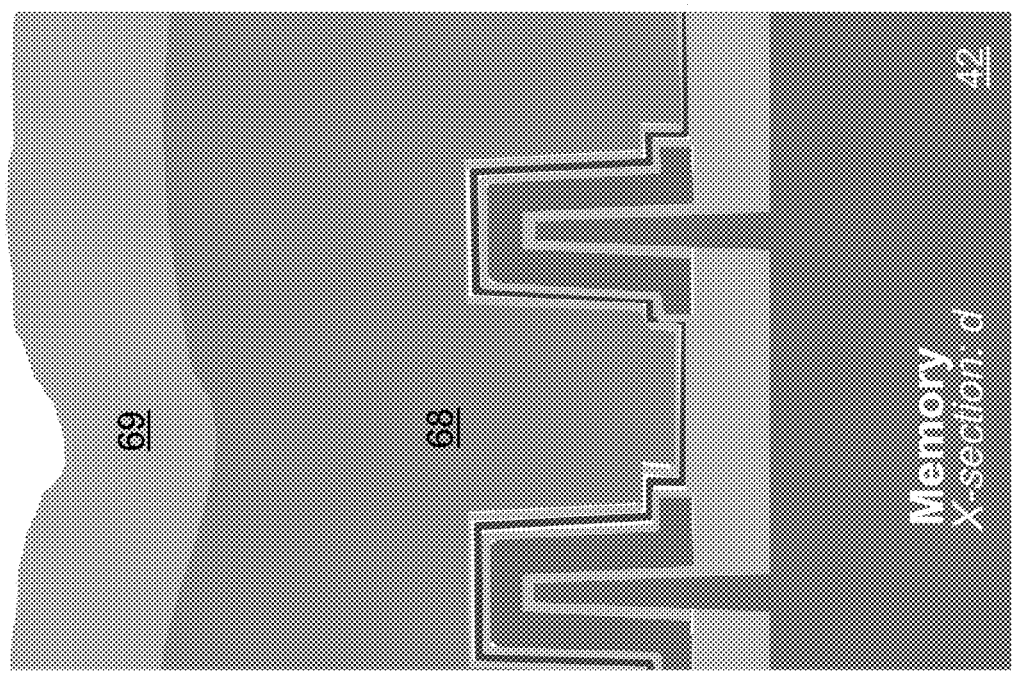
Figure 14A:
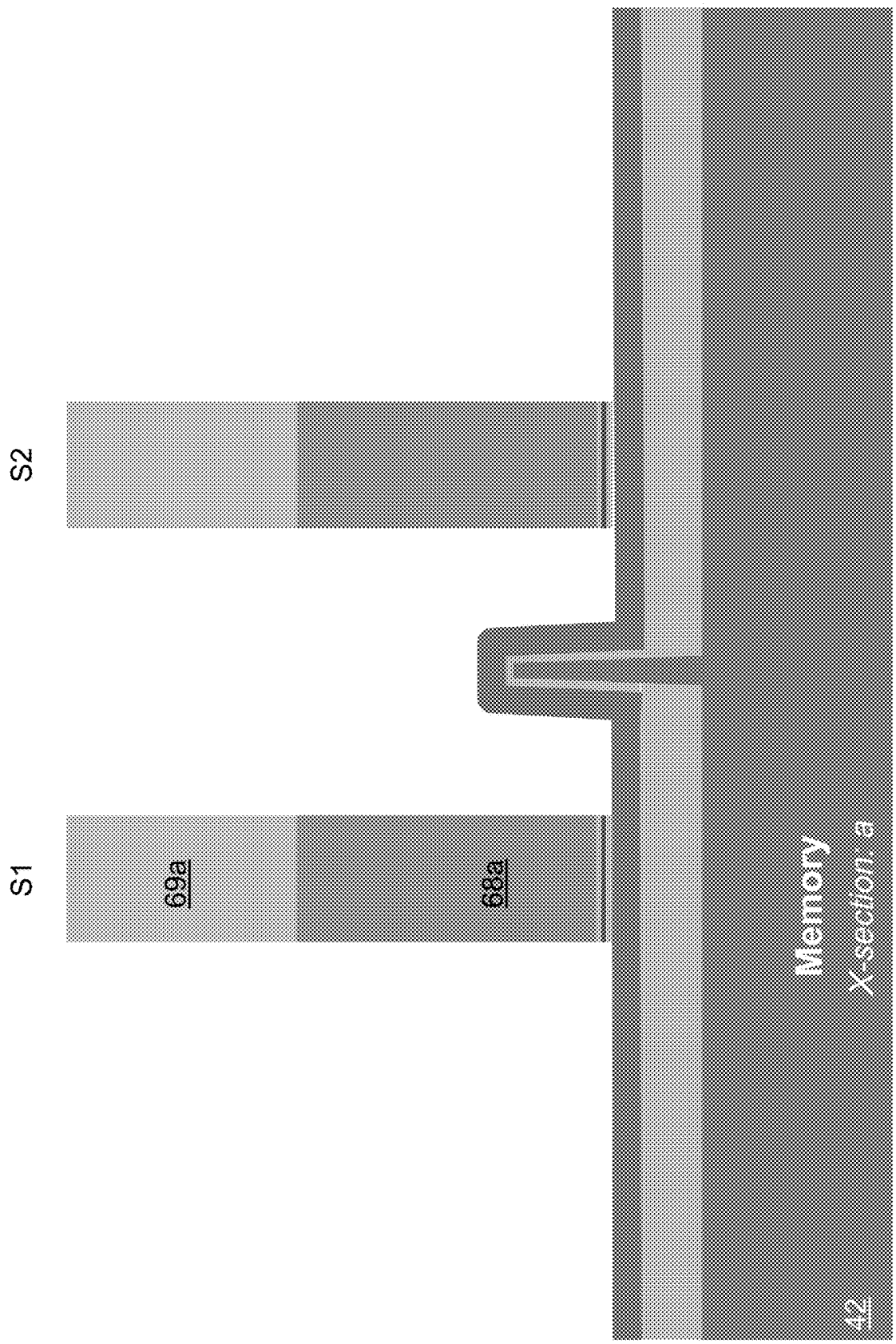
Figure 14B:
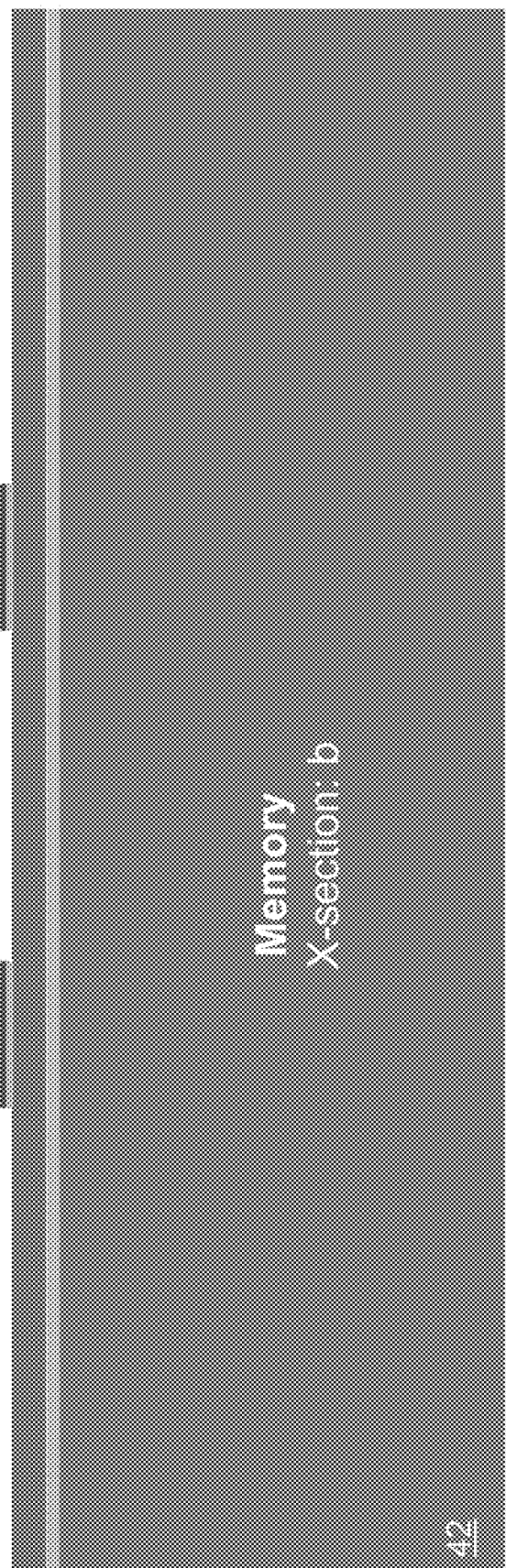
Figure 14C:
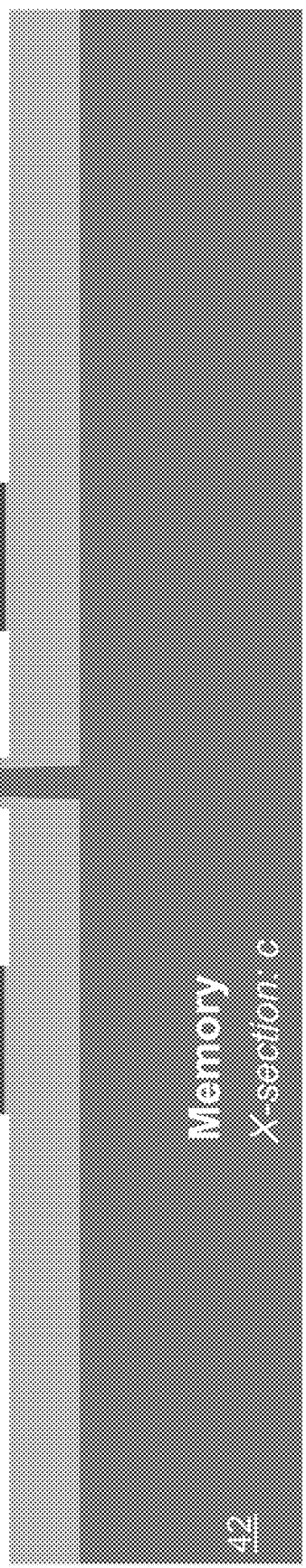
Figure 14E:
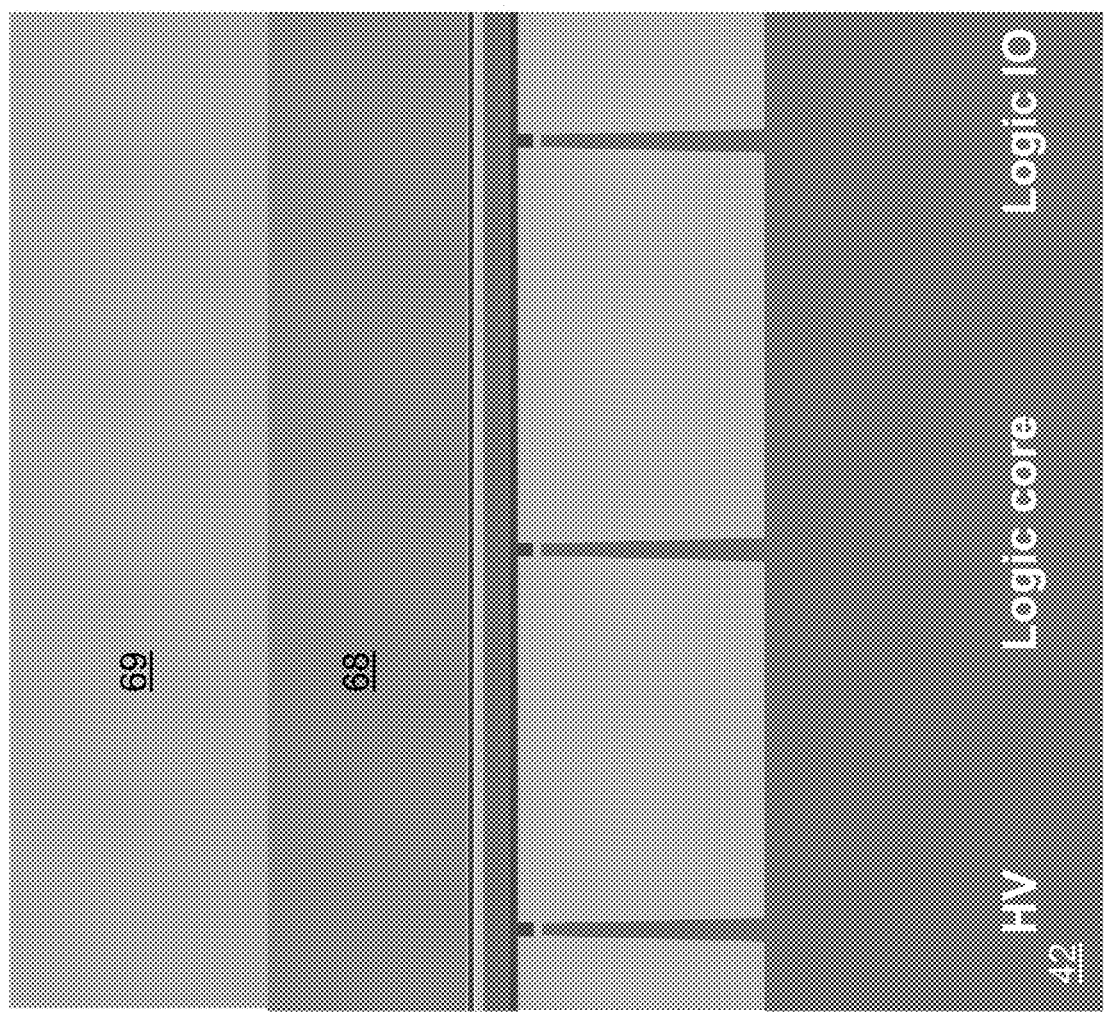
Figure 14D:
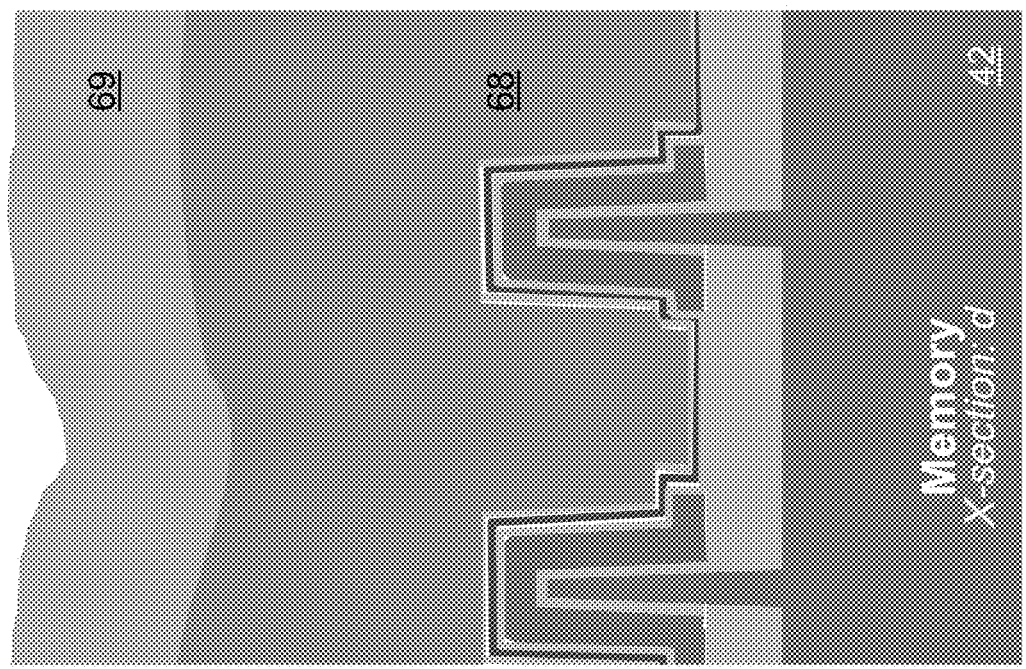
Figure 15A:
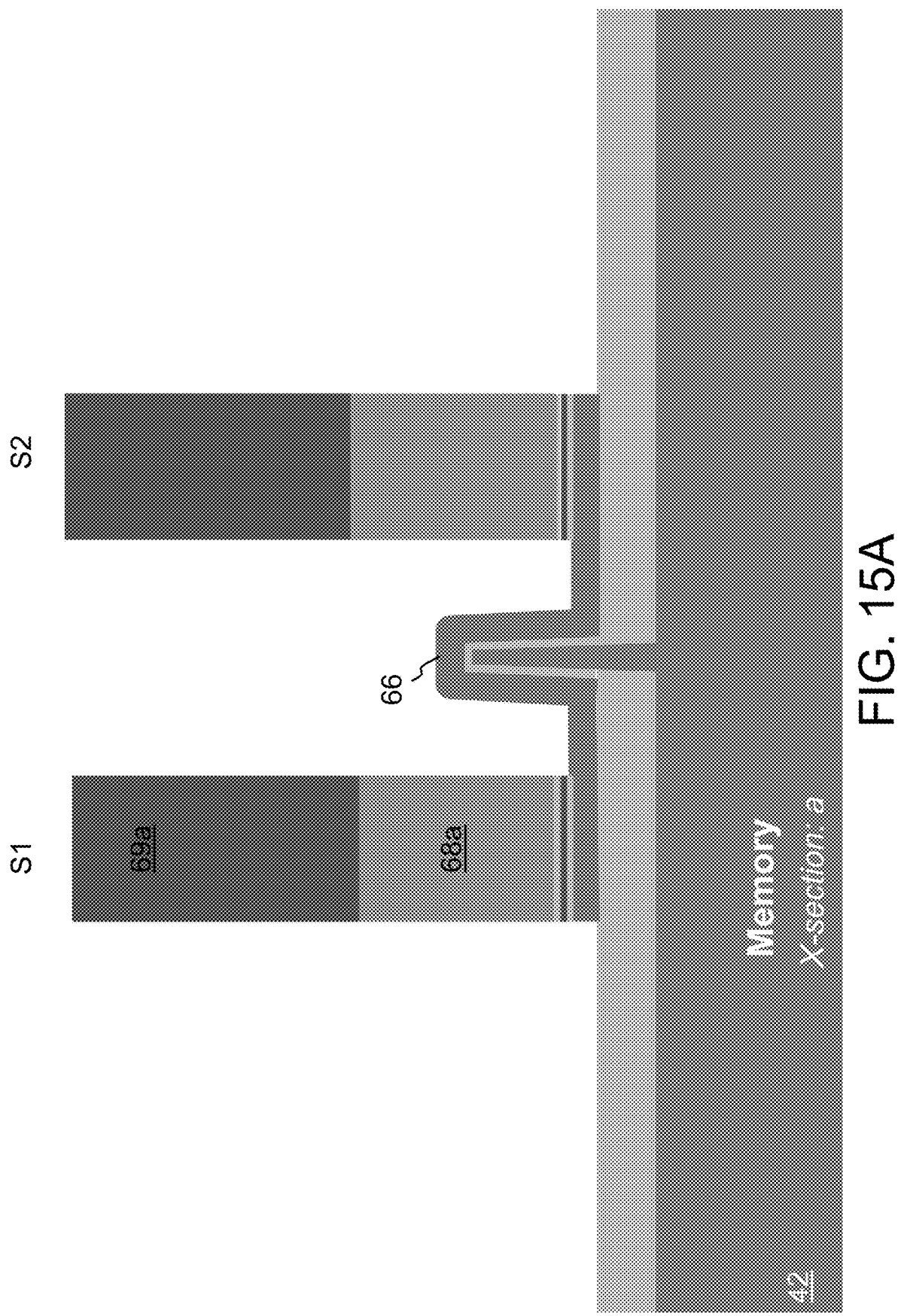
Figure 15B:
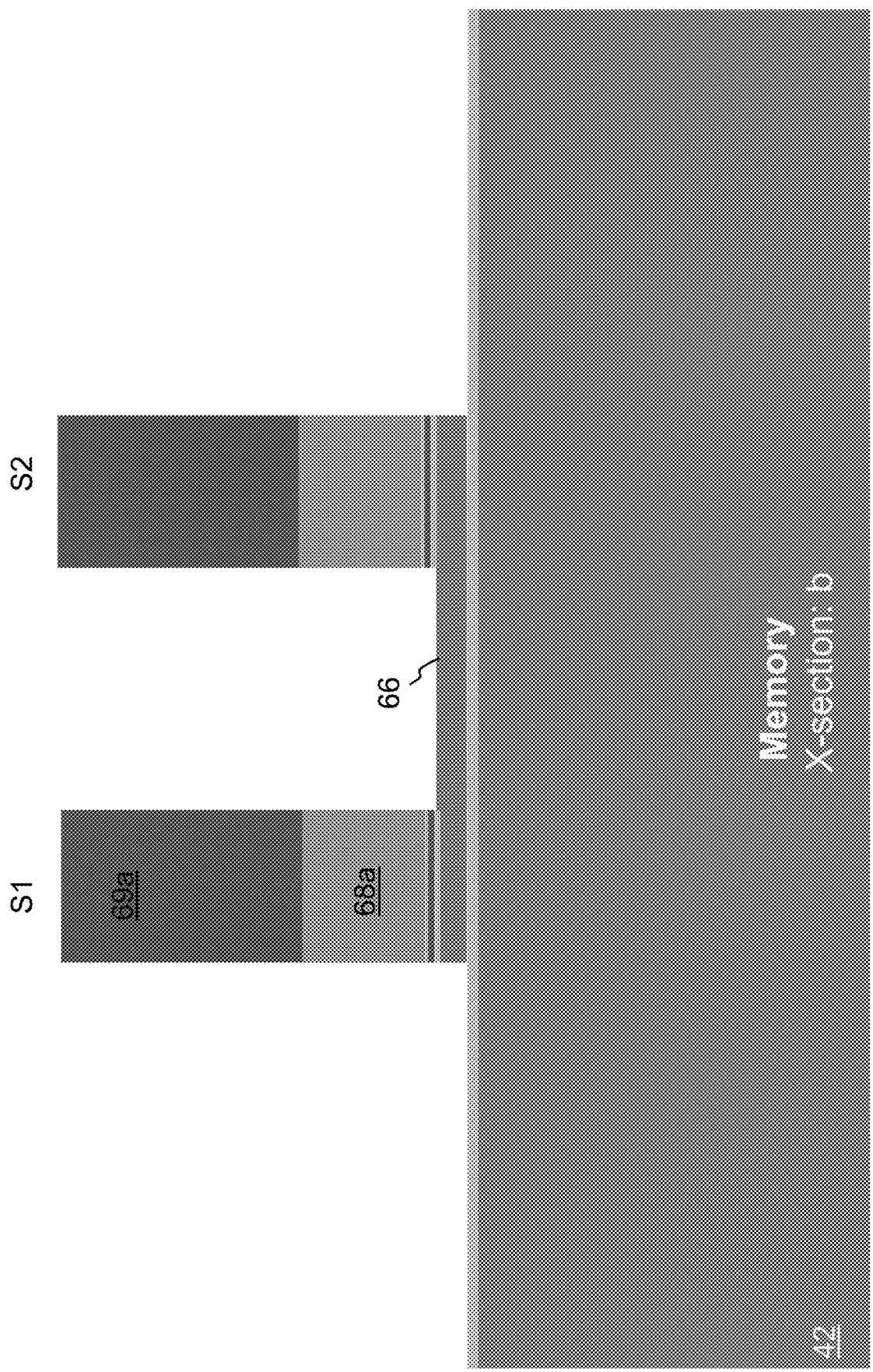
Figure 15C:
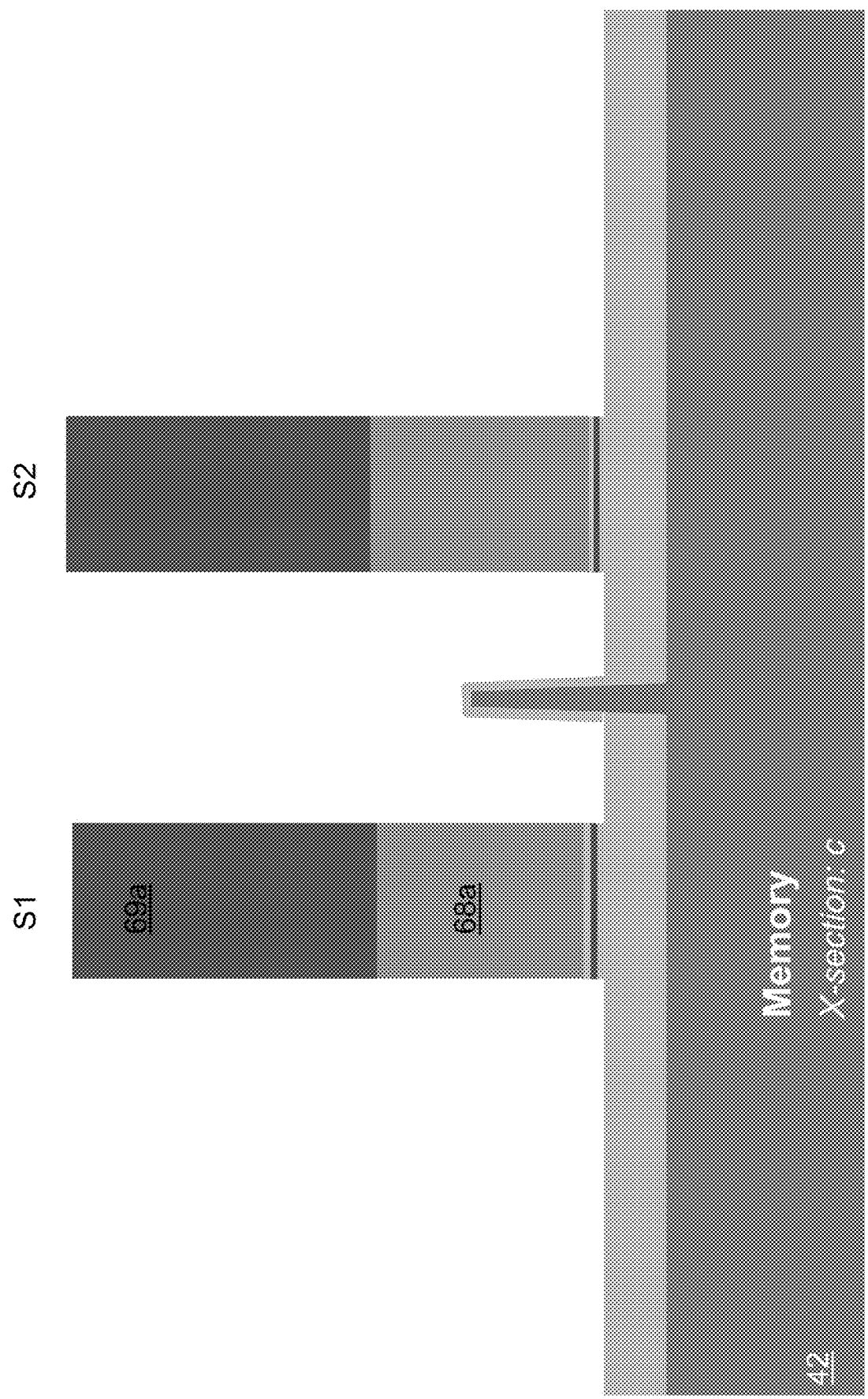
Figure 15E:
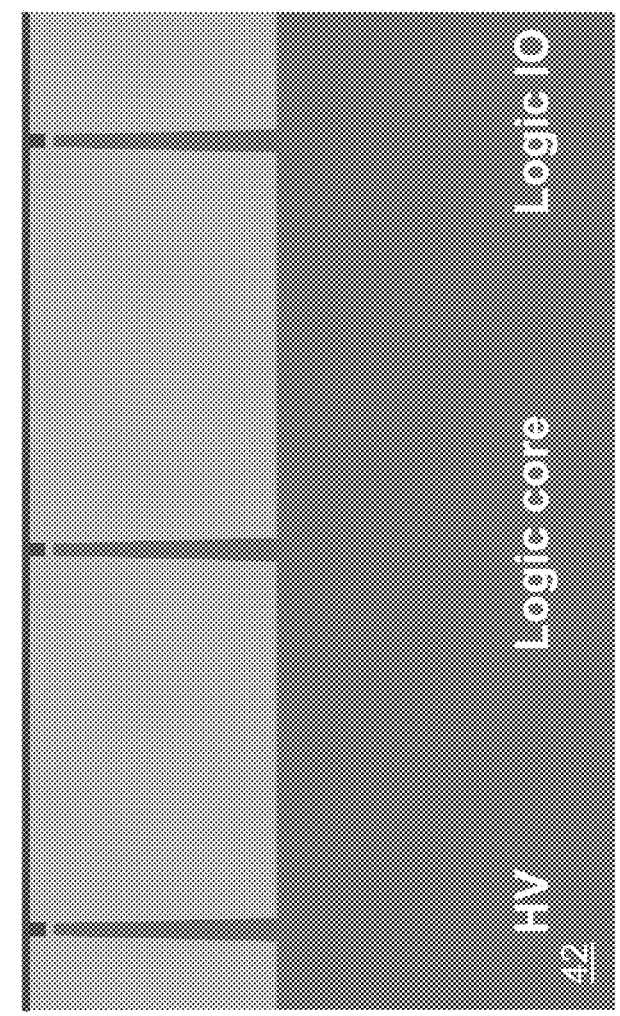
Figure 15D:
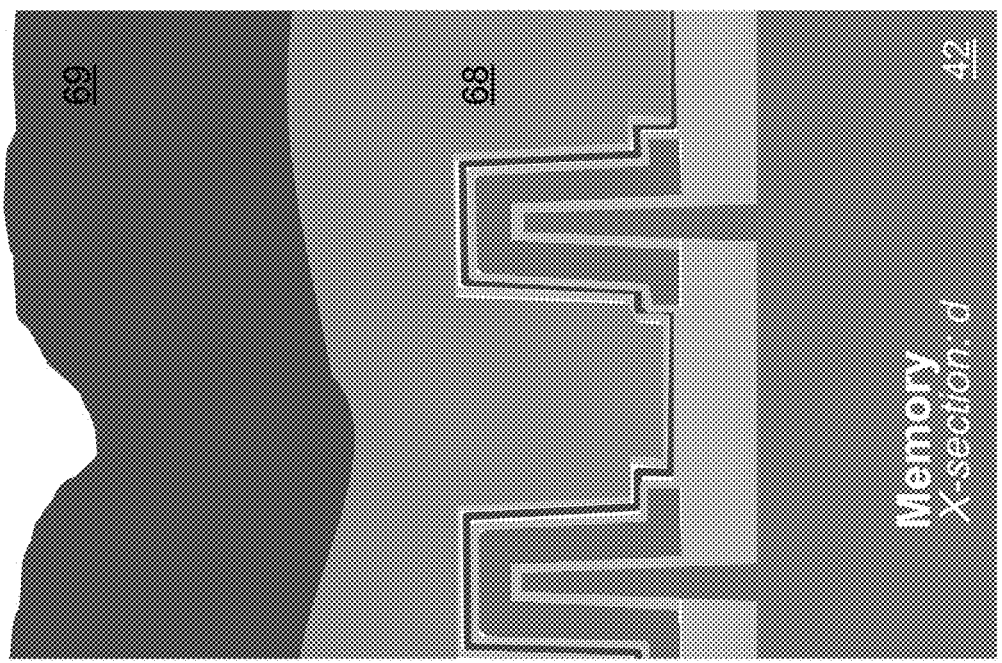
Figure 16A:
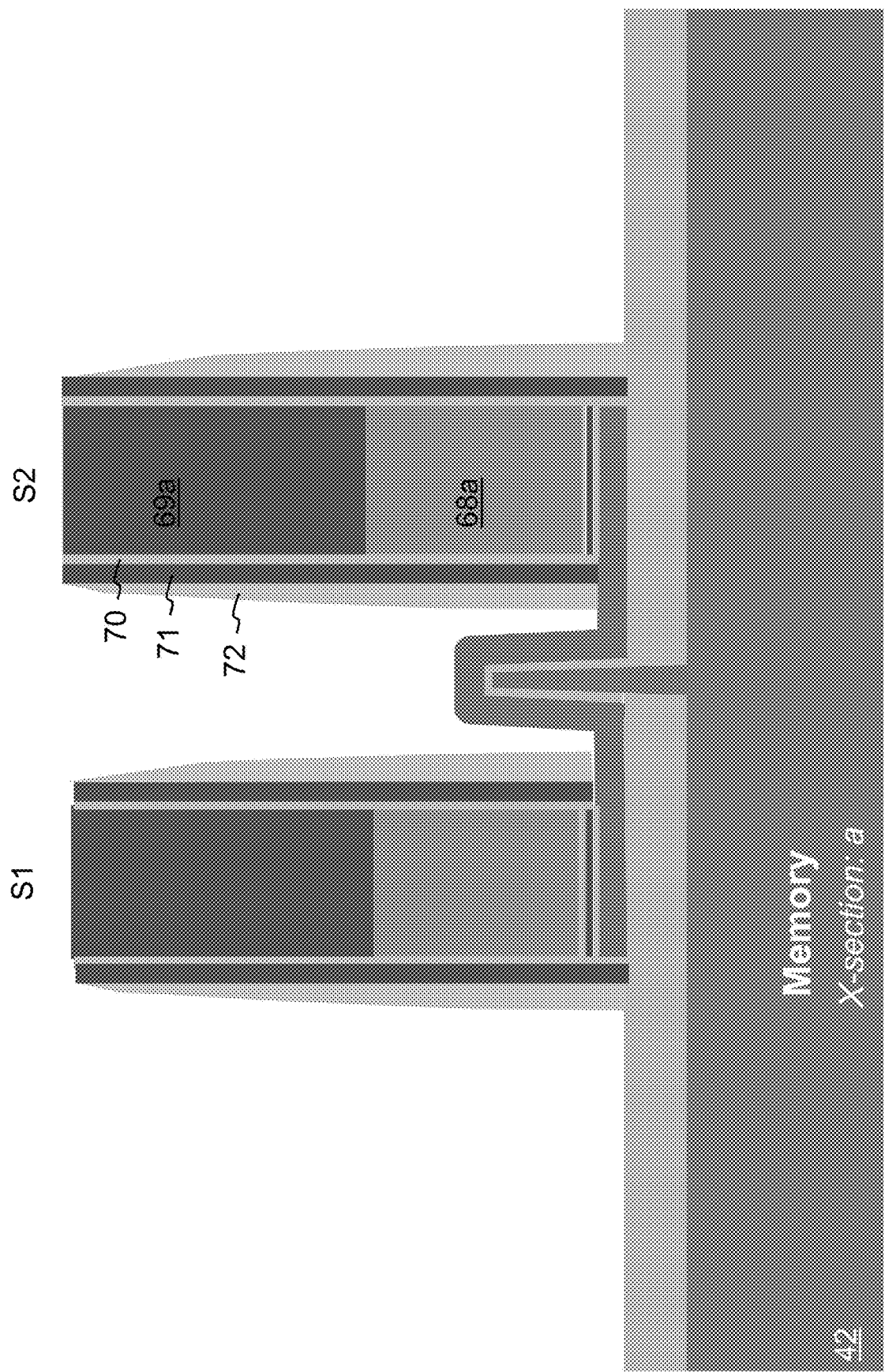
Figure 16B:
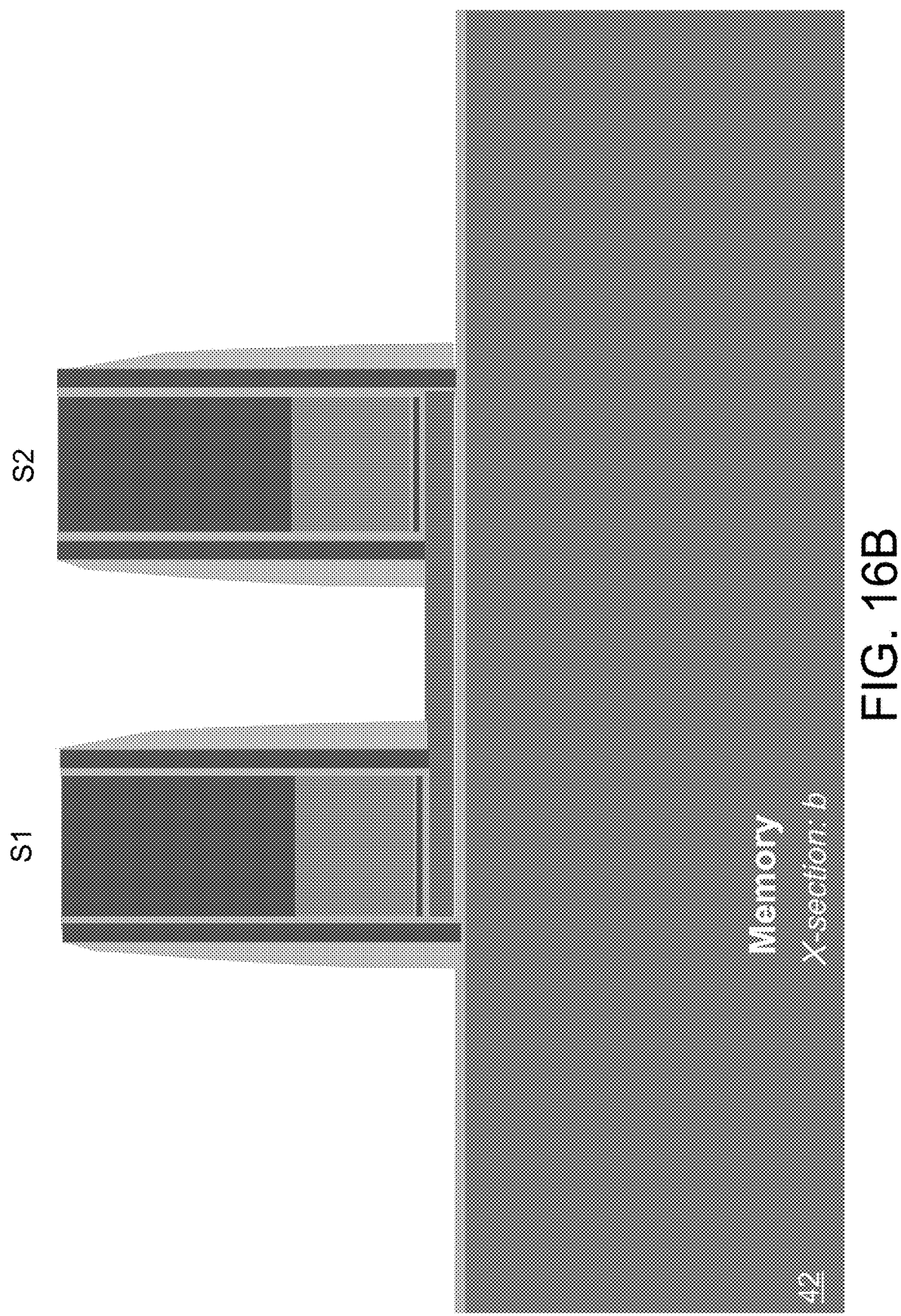
Figure 16C:
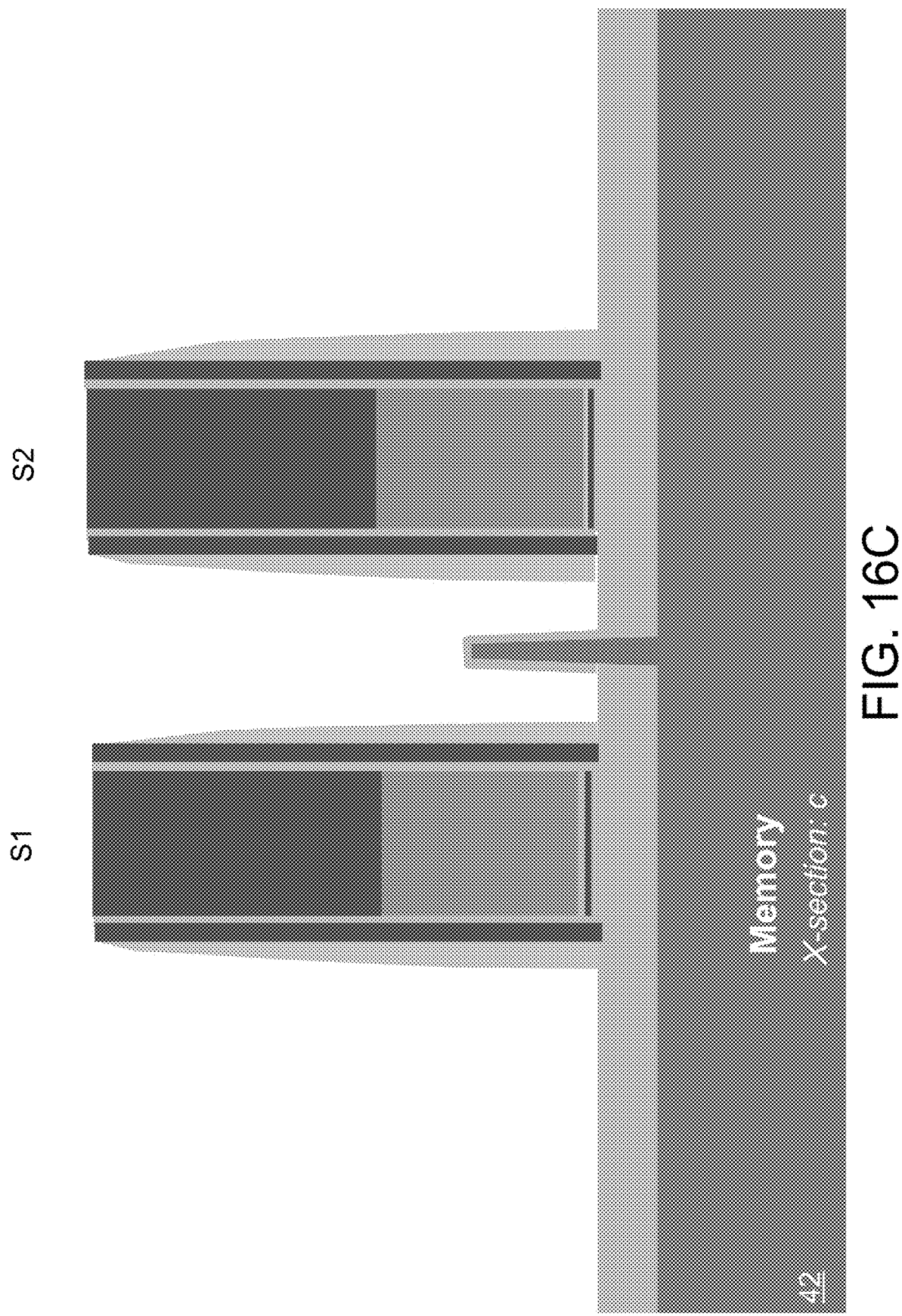
Figure 16E:
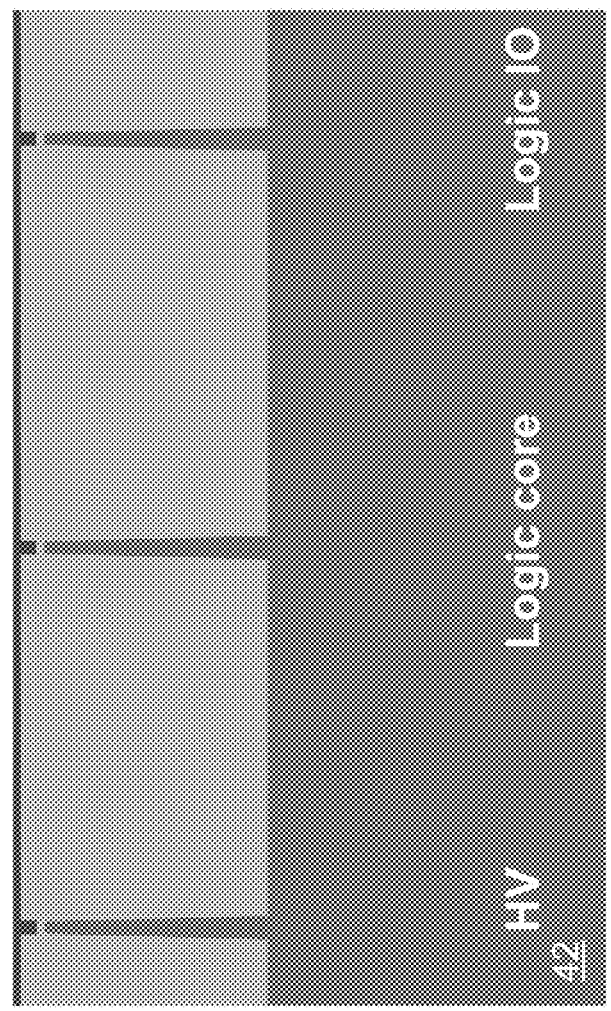
Figure 16D:
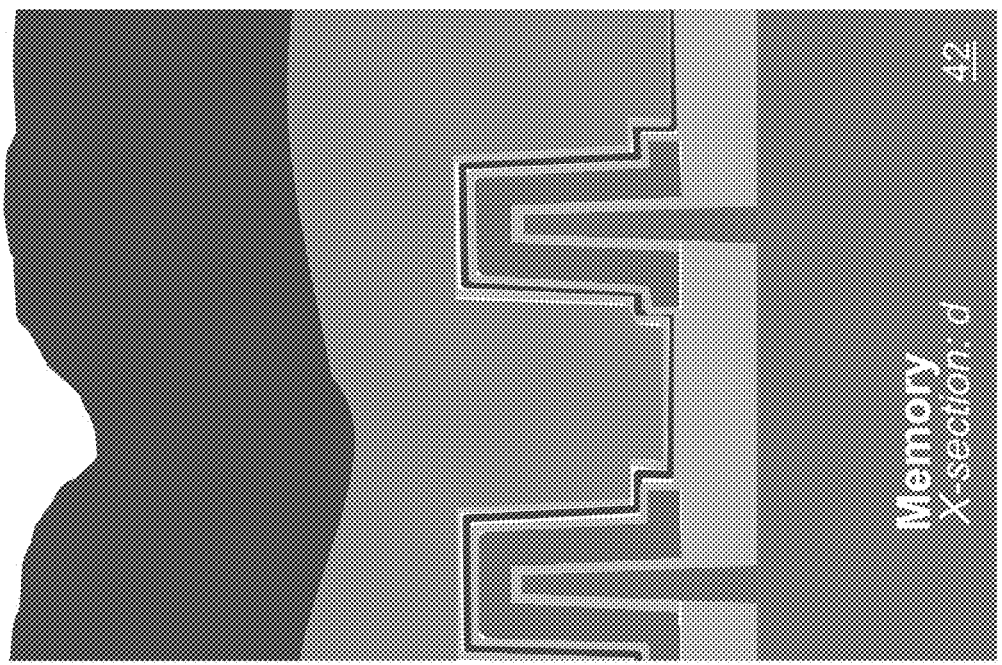
Figure 17A:
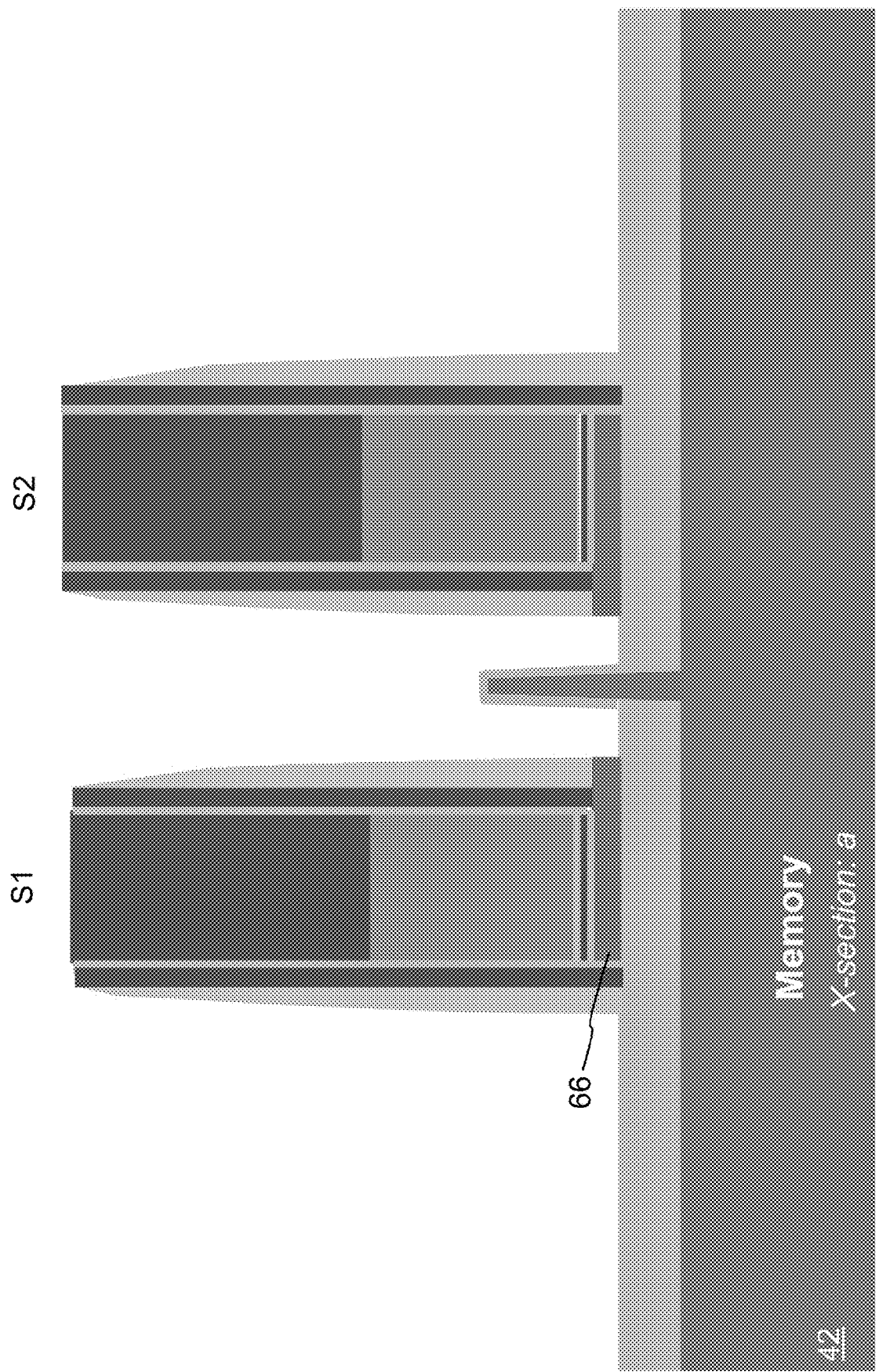
Figure 17B:
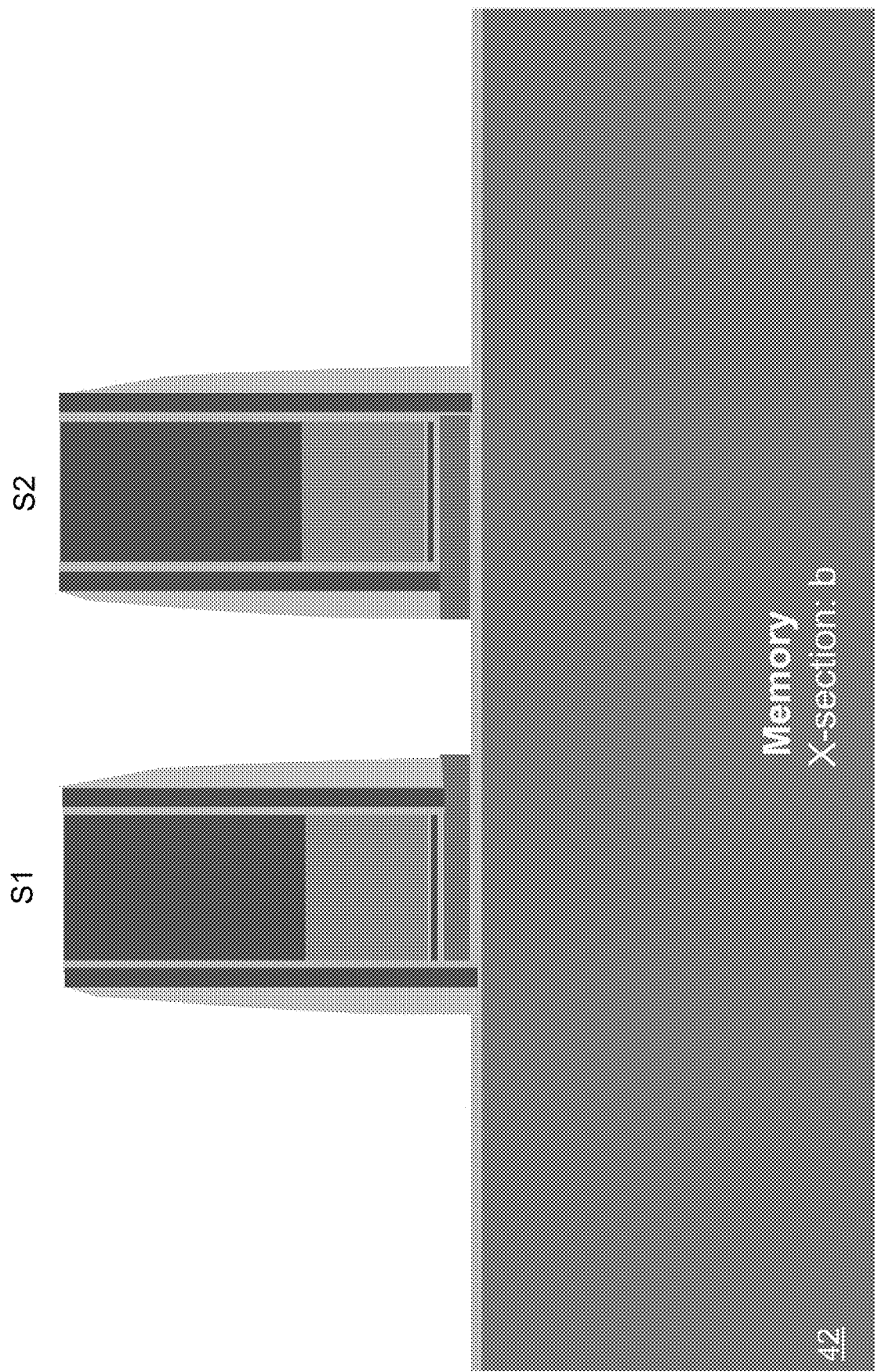
Figure 17C:
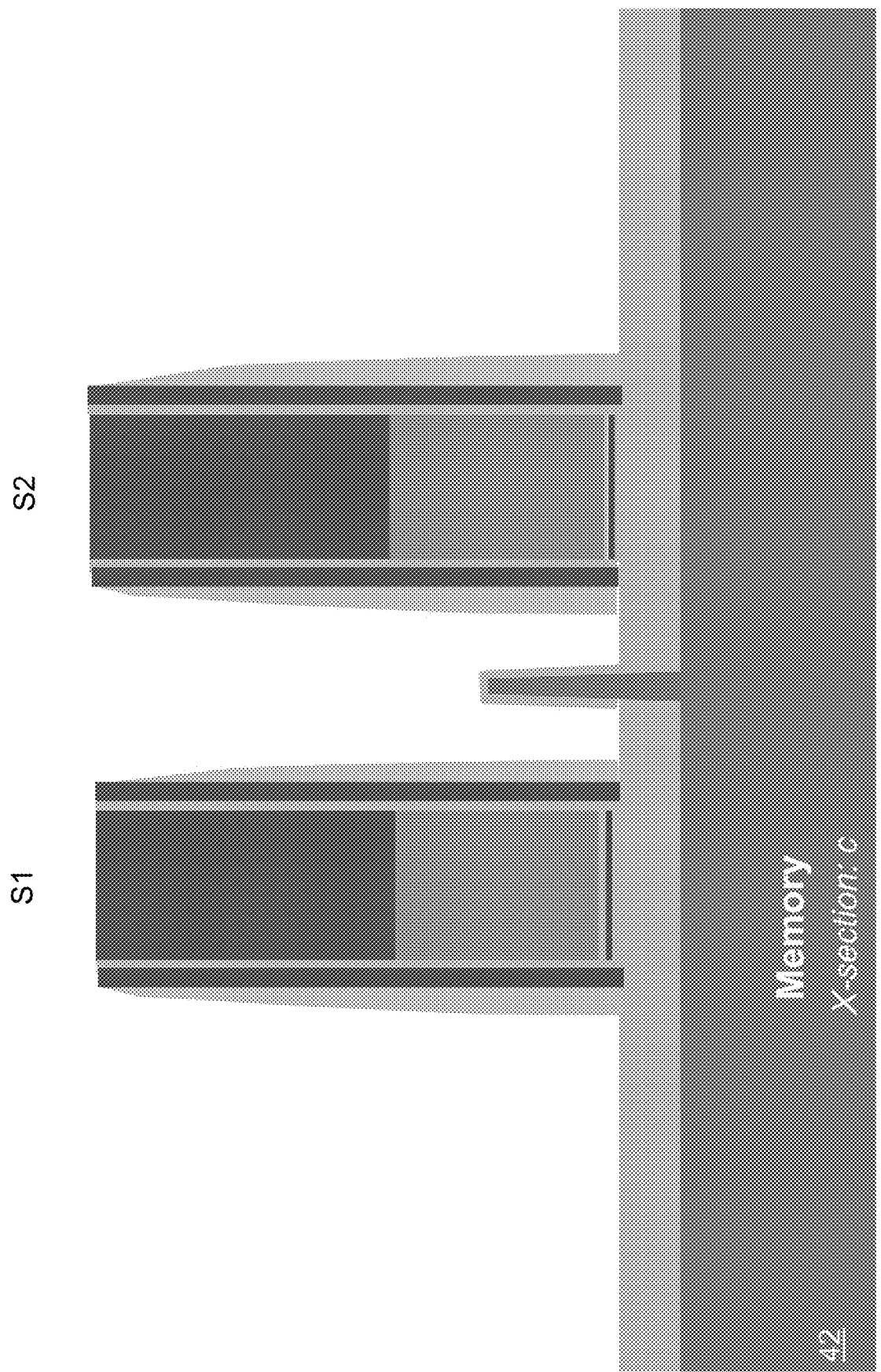
Figure 17E:
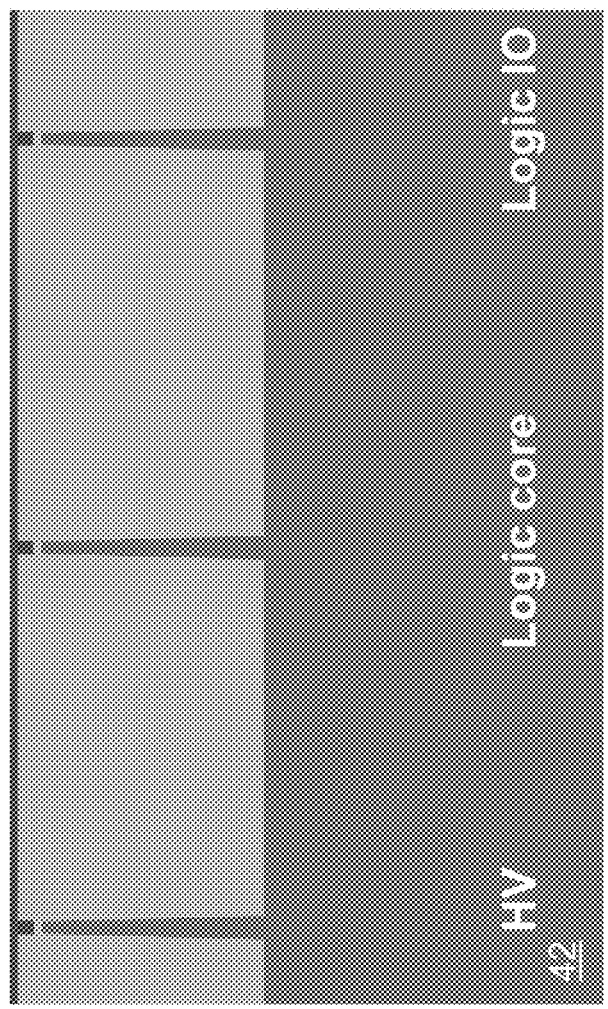
Figure 17D:
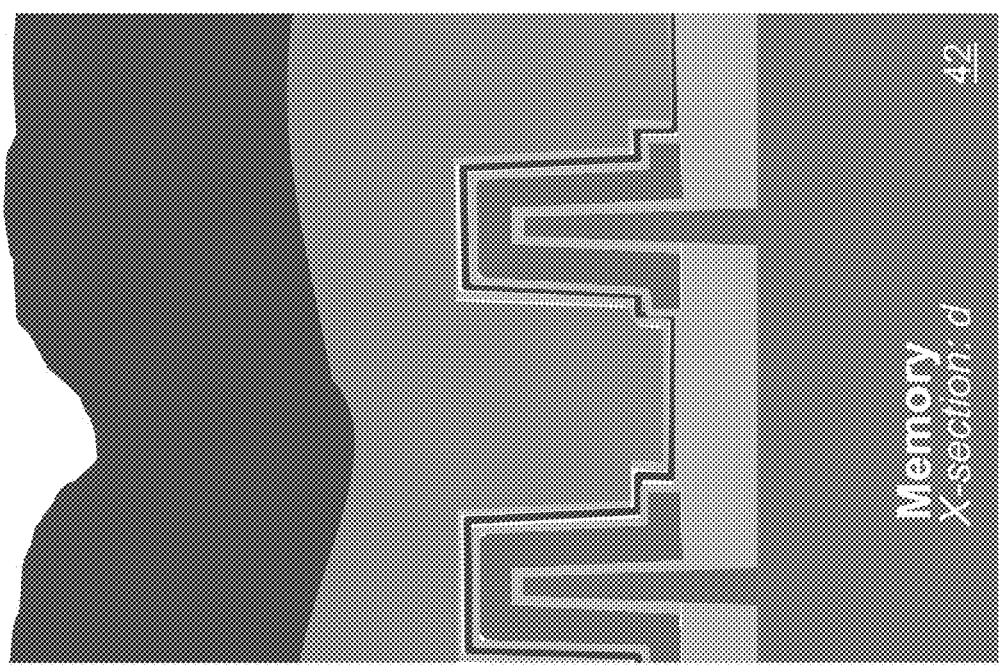
Figure 18A:
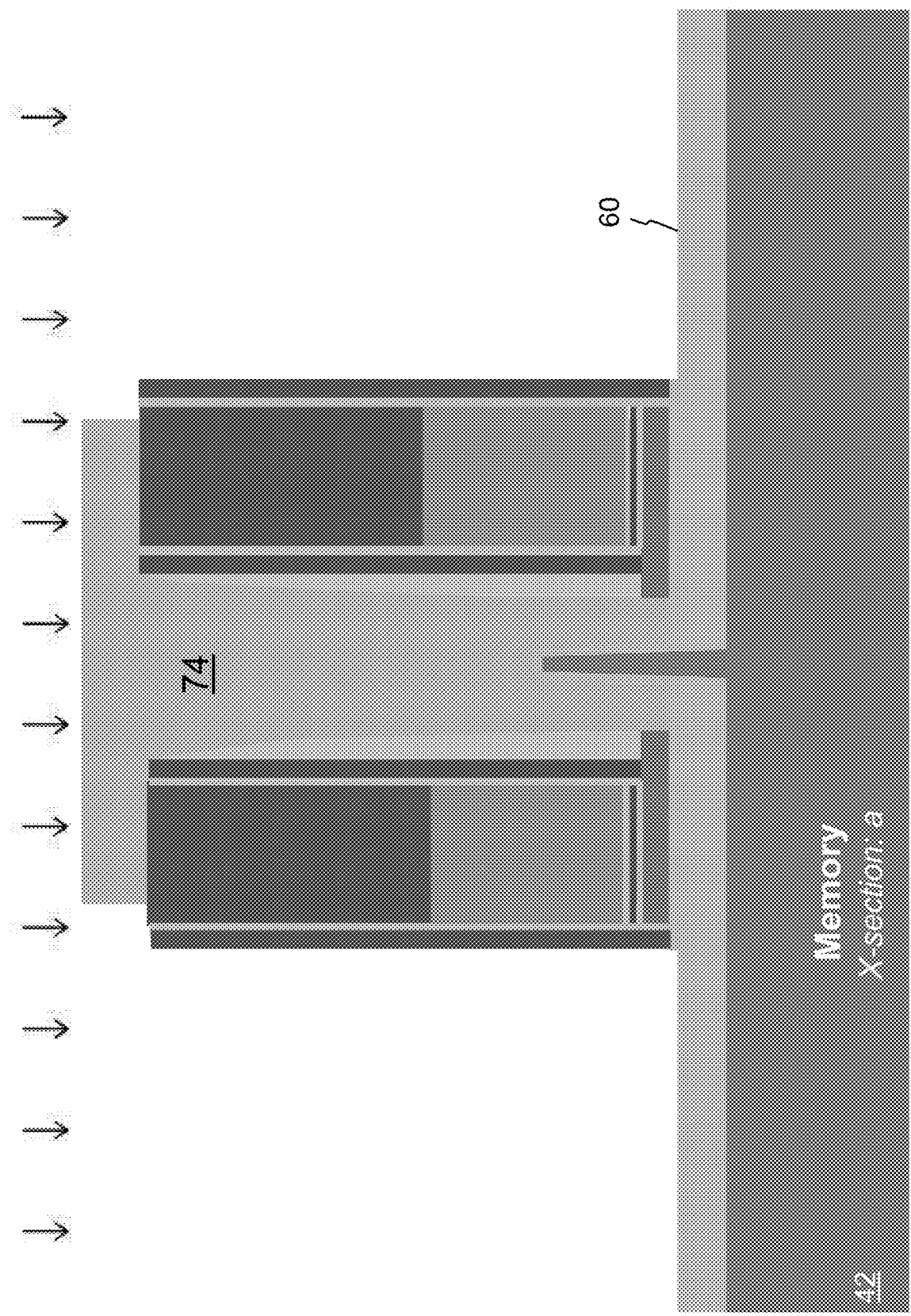
Figure 18B:
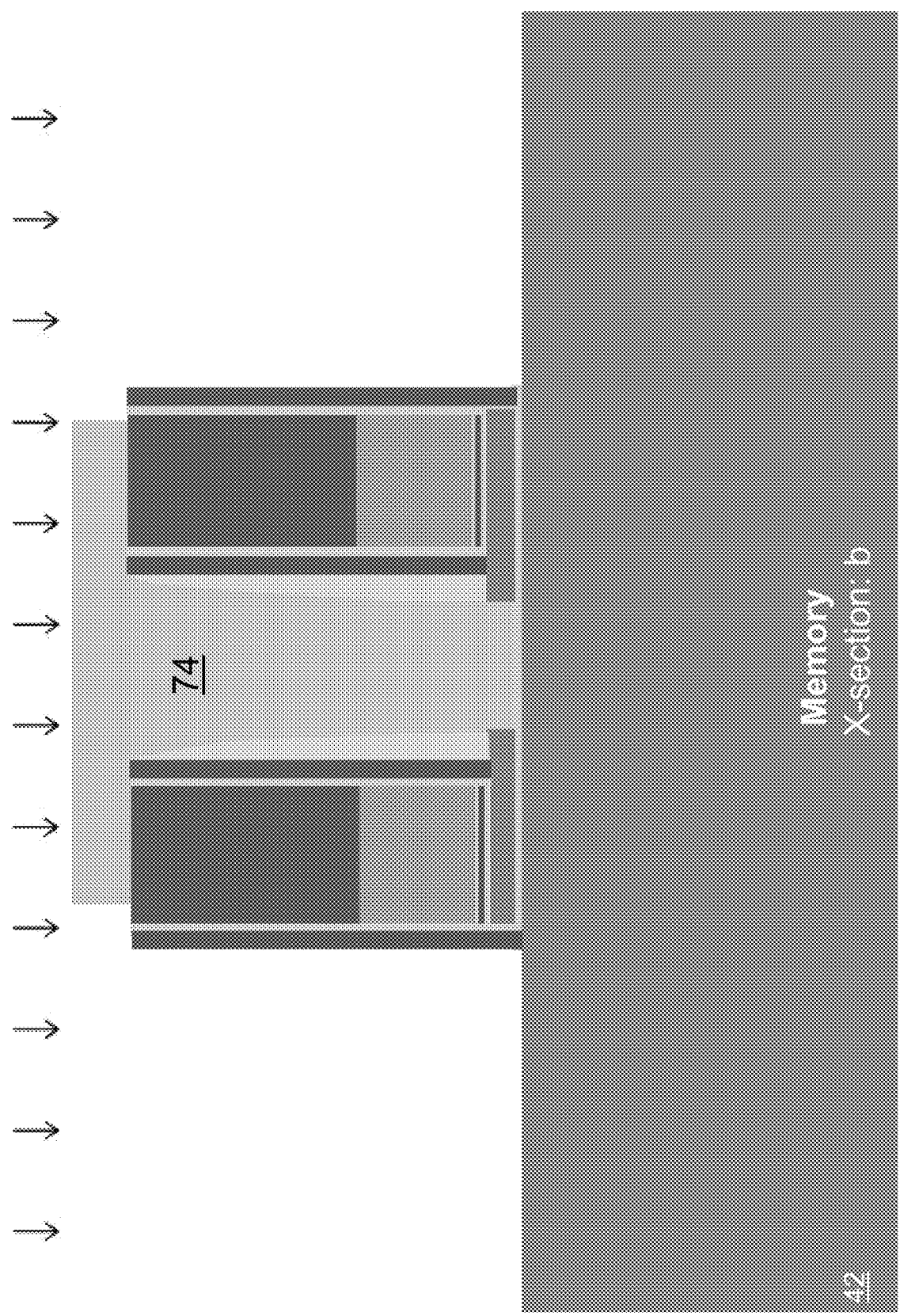
Figure 18C:
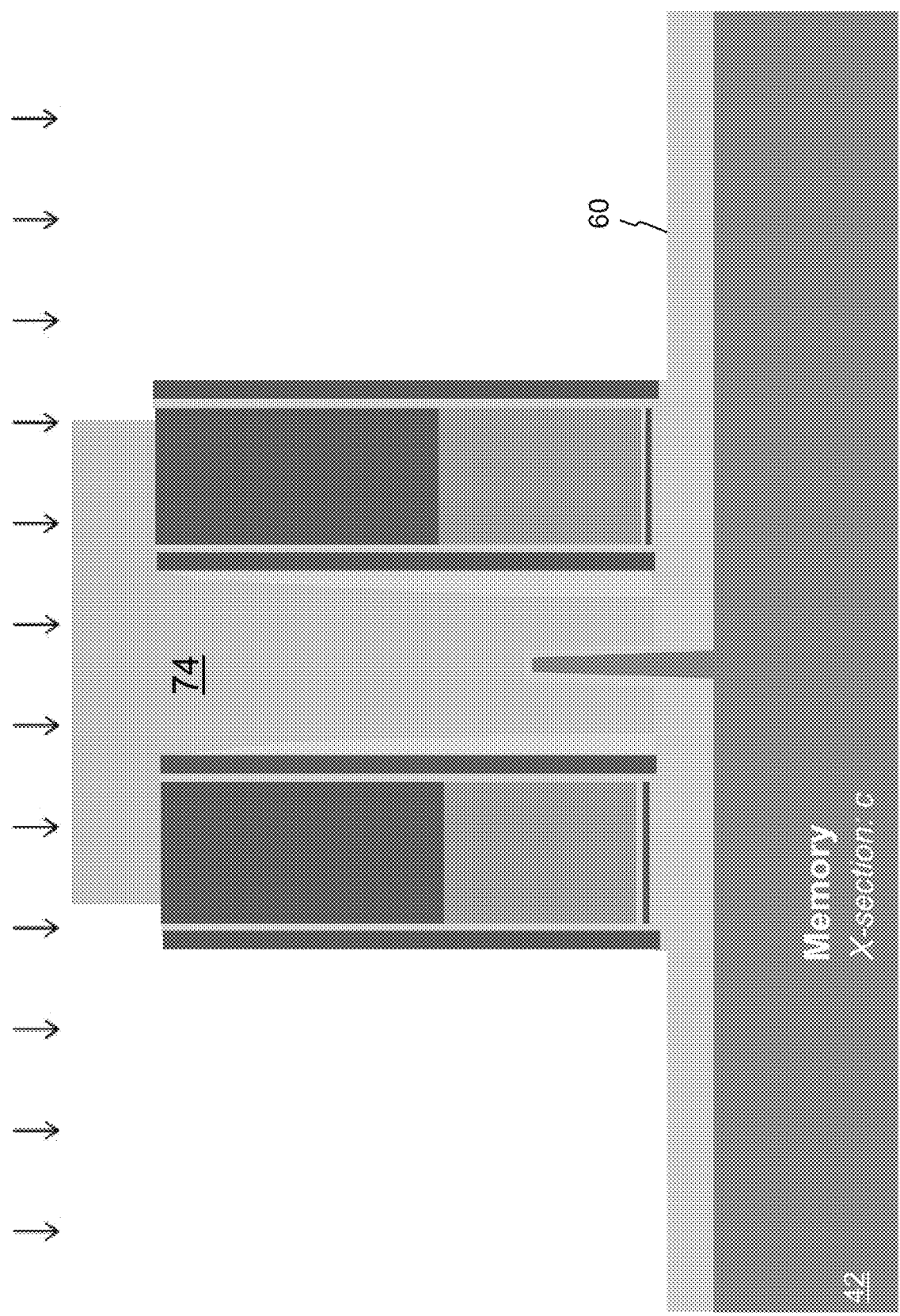
Figure 19A:
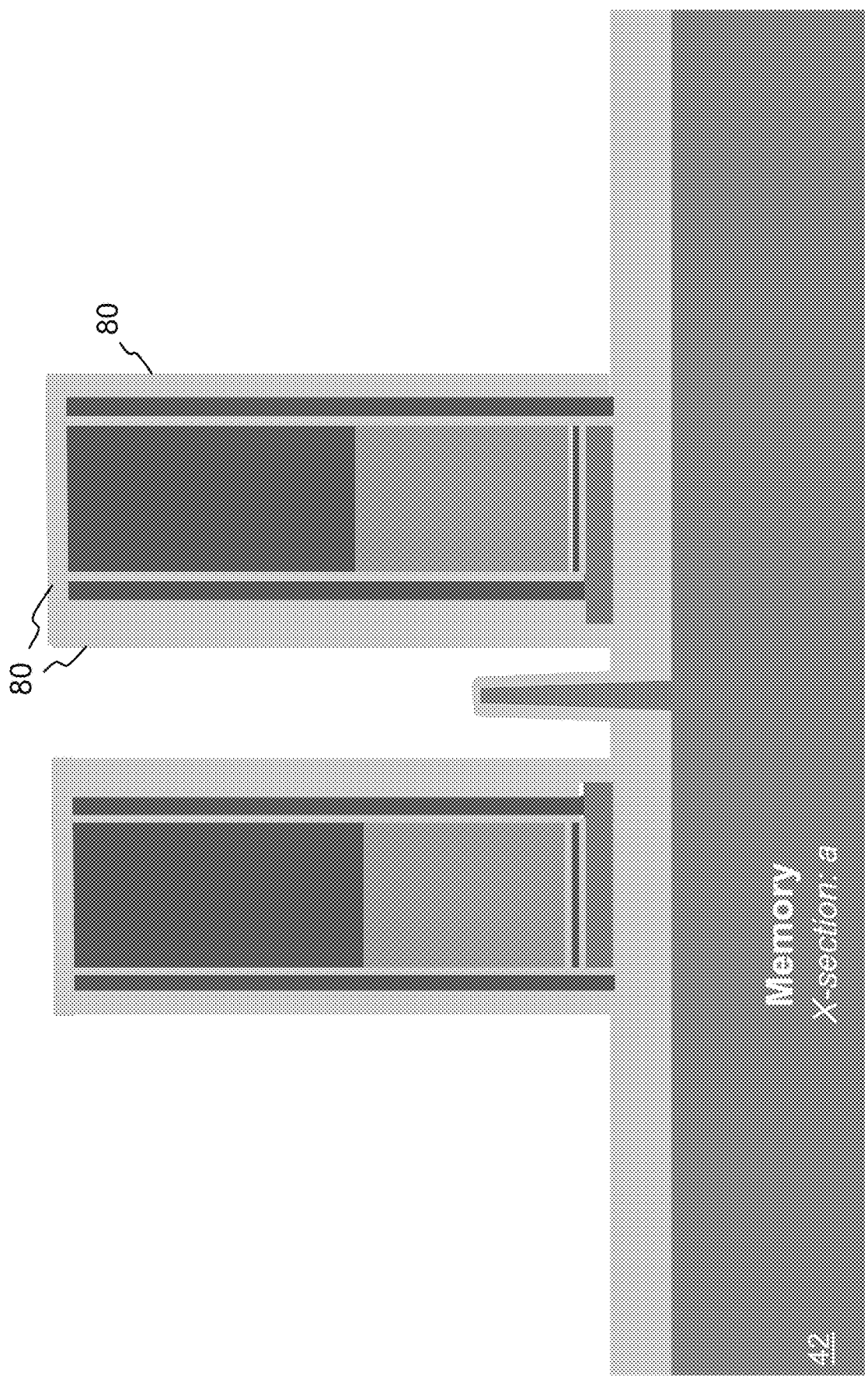
Figure 19B:
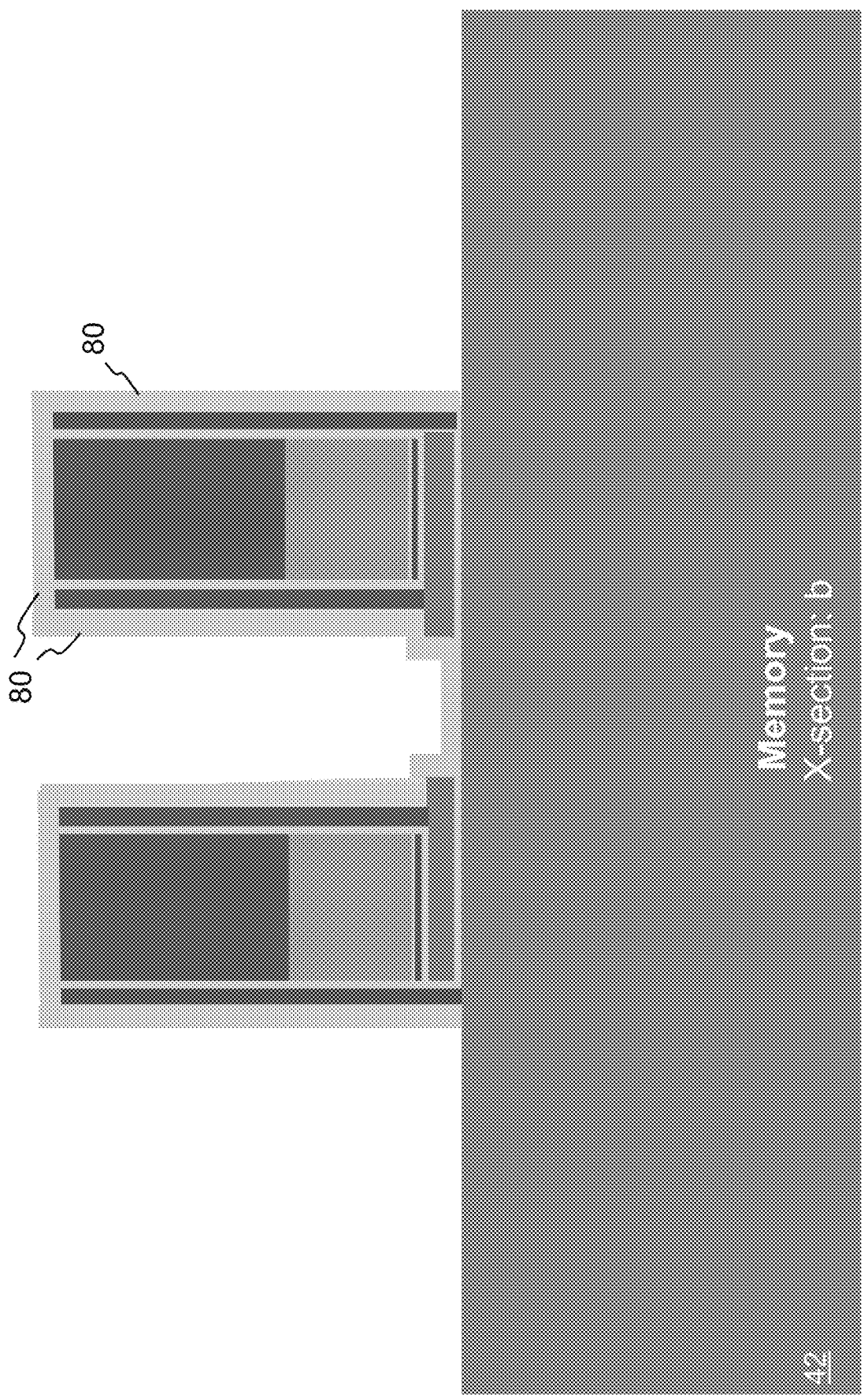
Figure 19C:
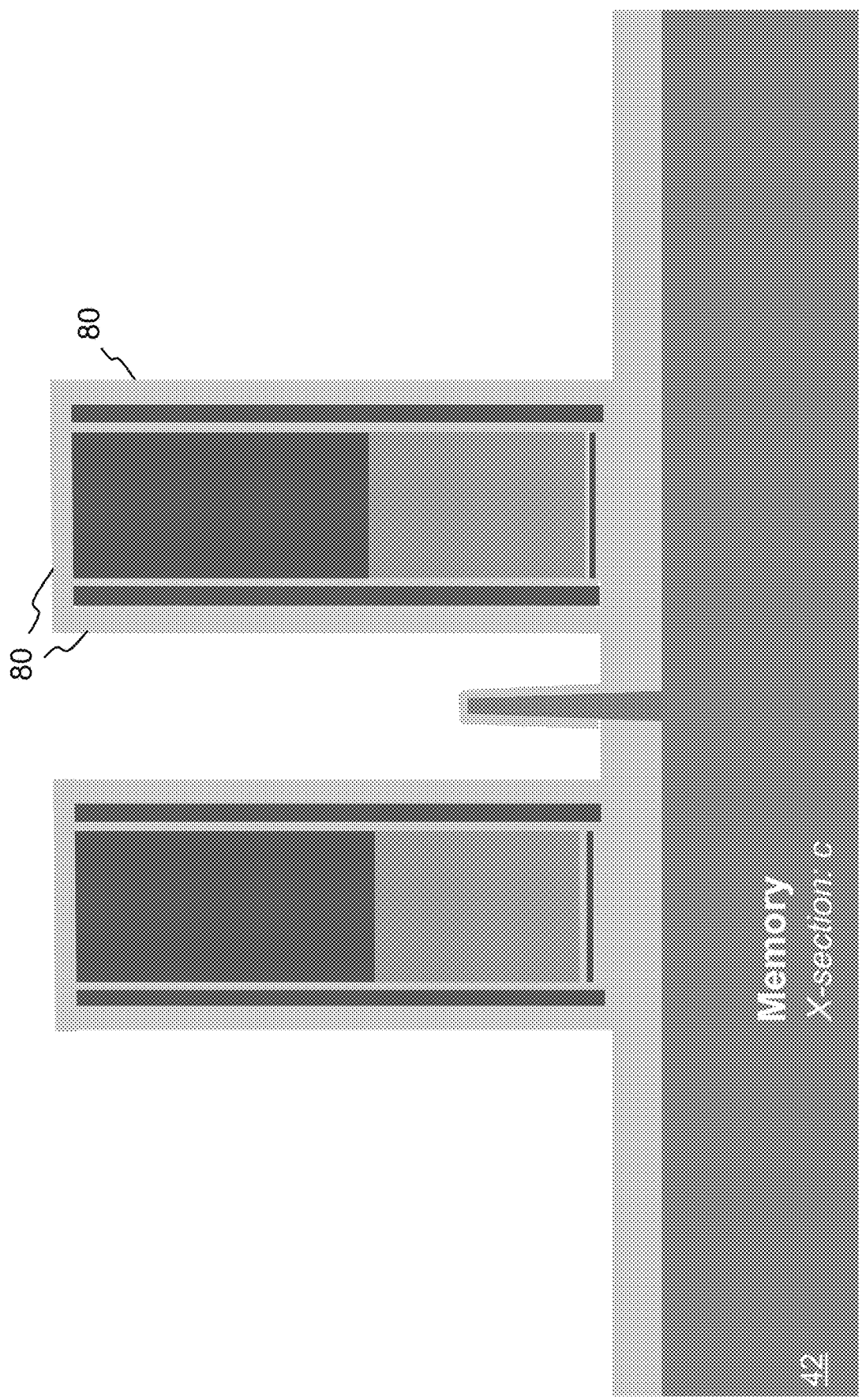
Figure 19D:
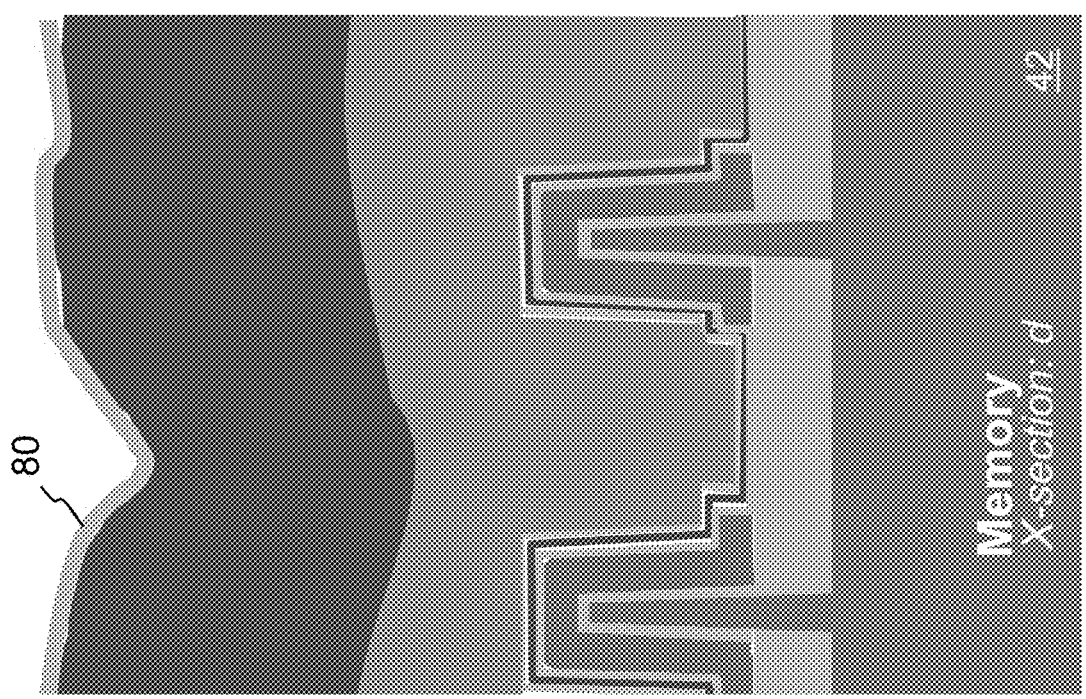
Figure 19E:
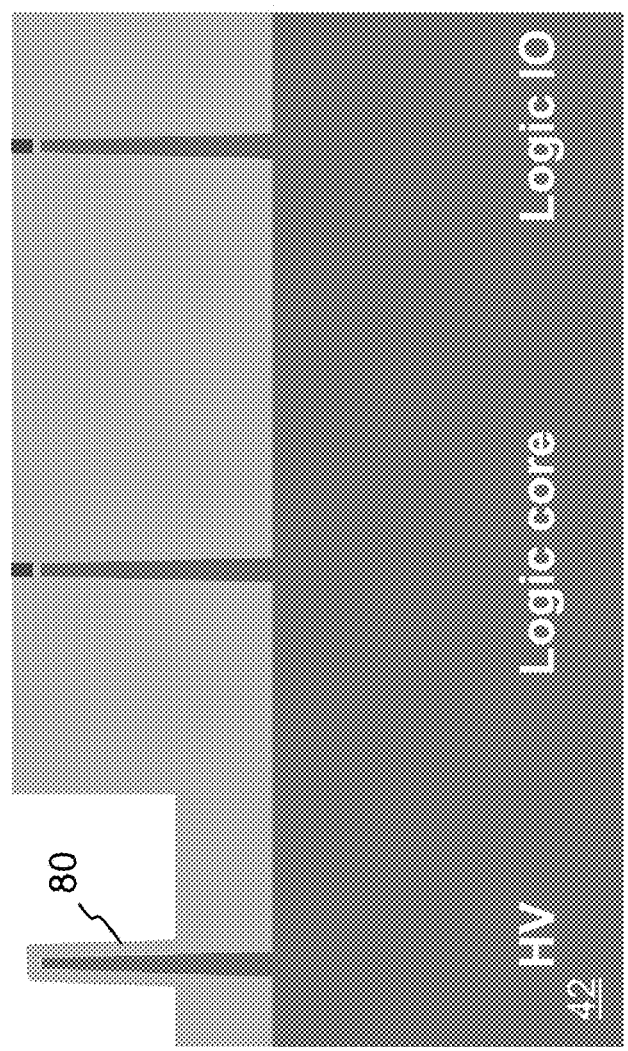
Figure 20A:
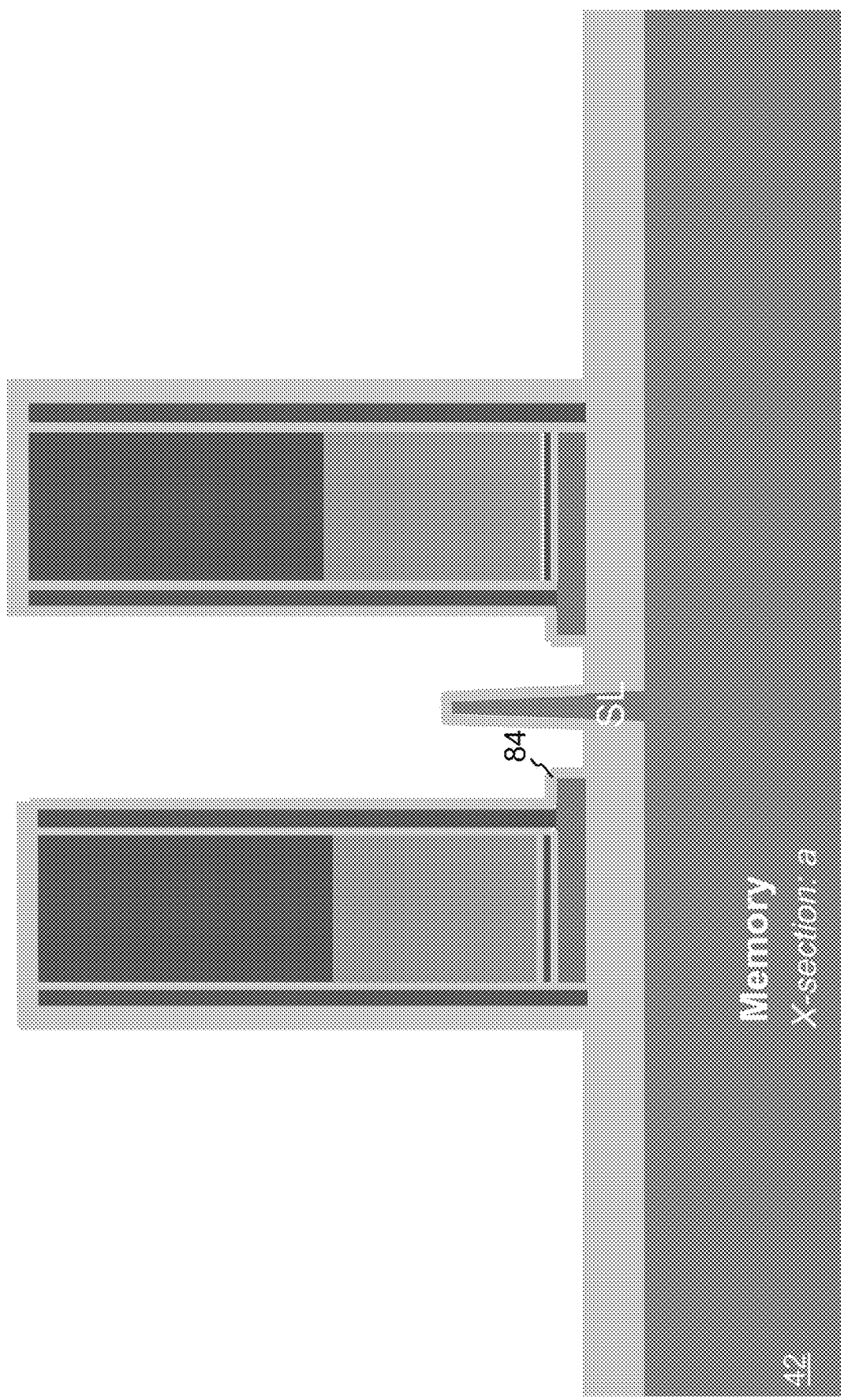
Figure 20B:
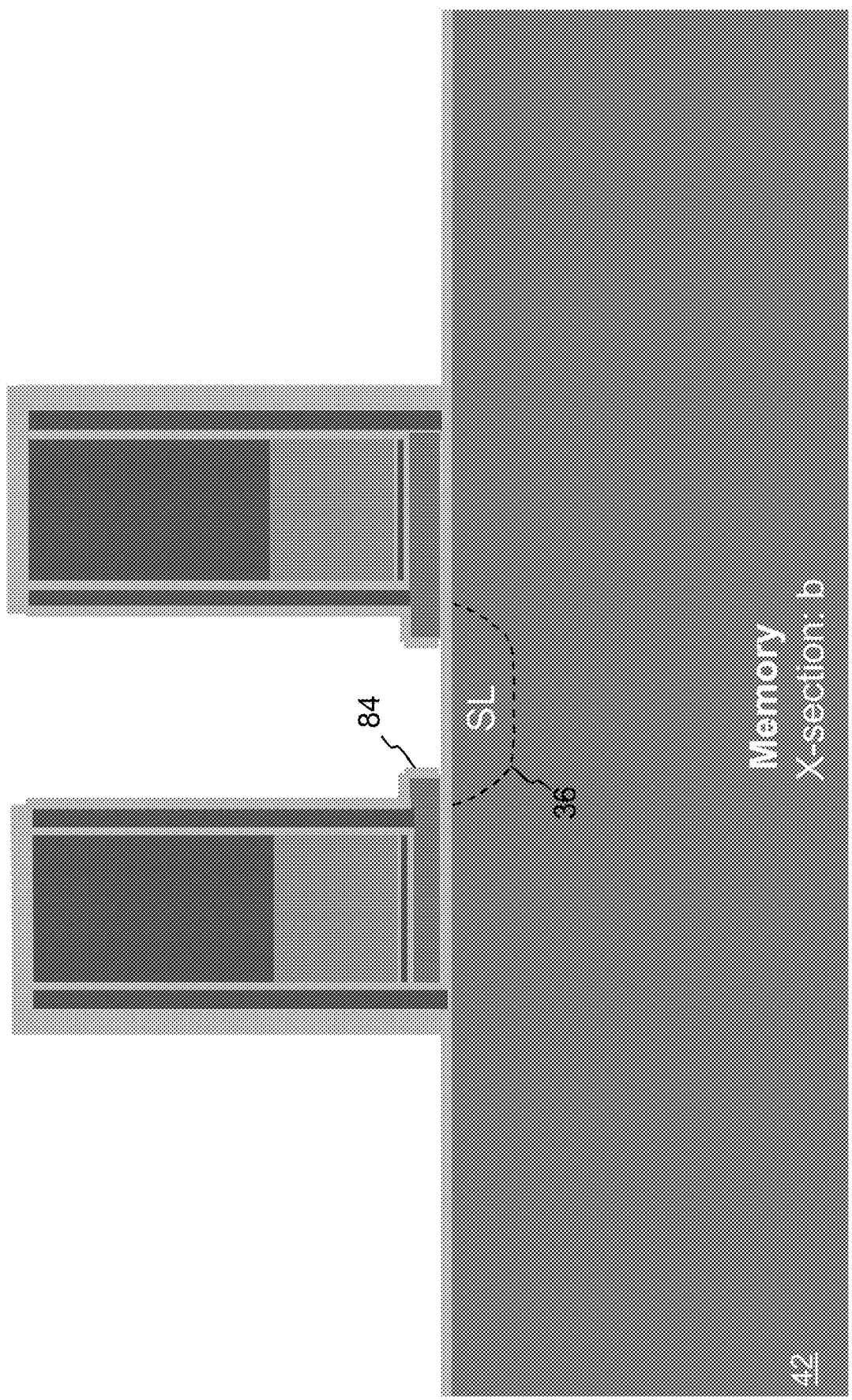
Figure 20C:
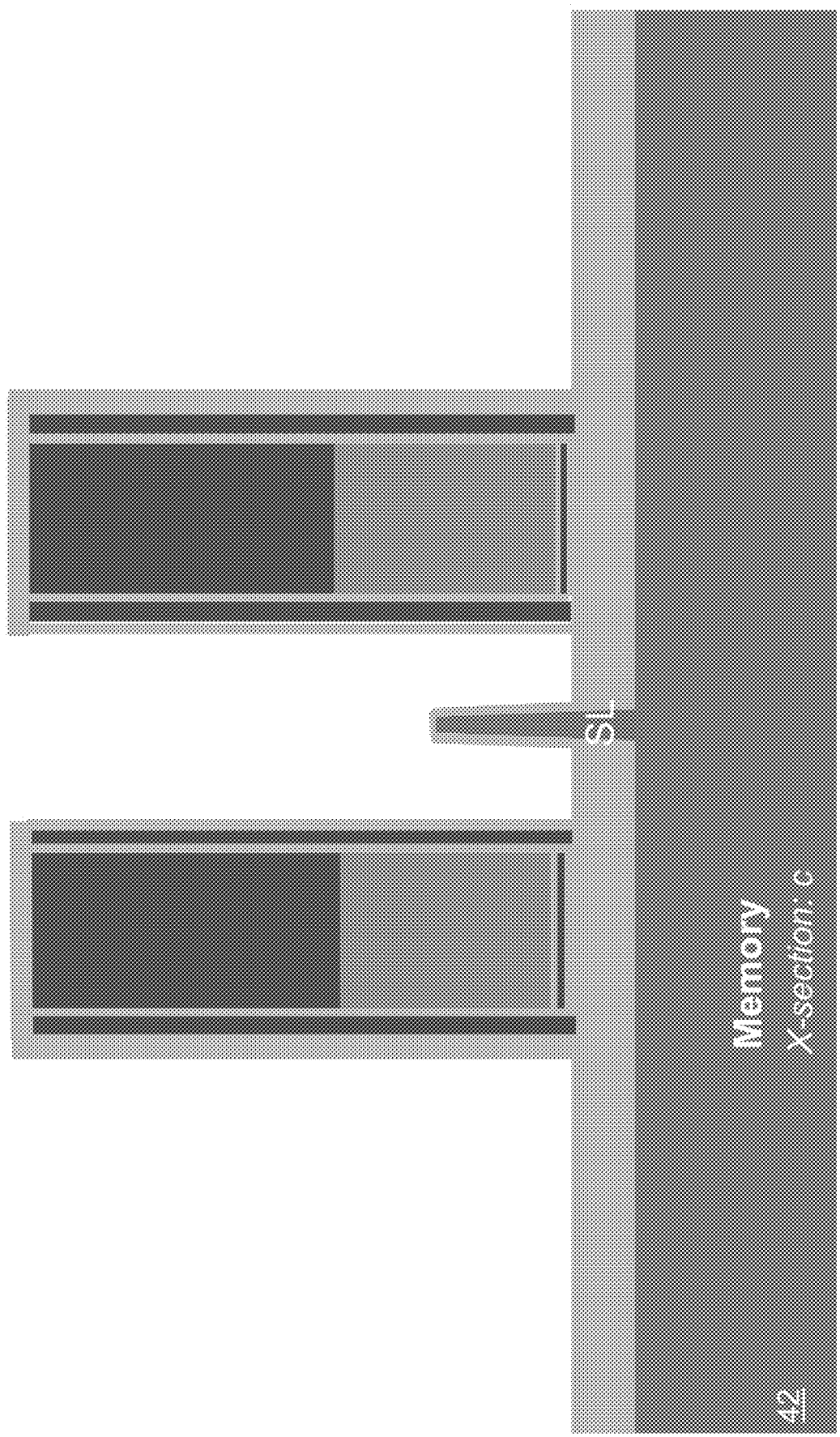
Figure 20E:
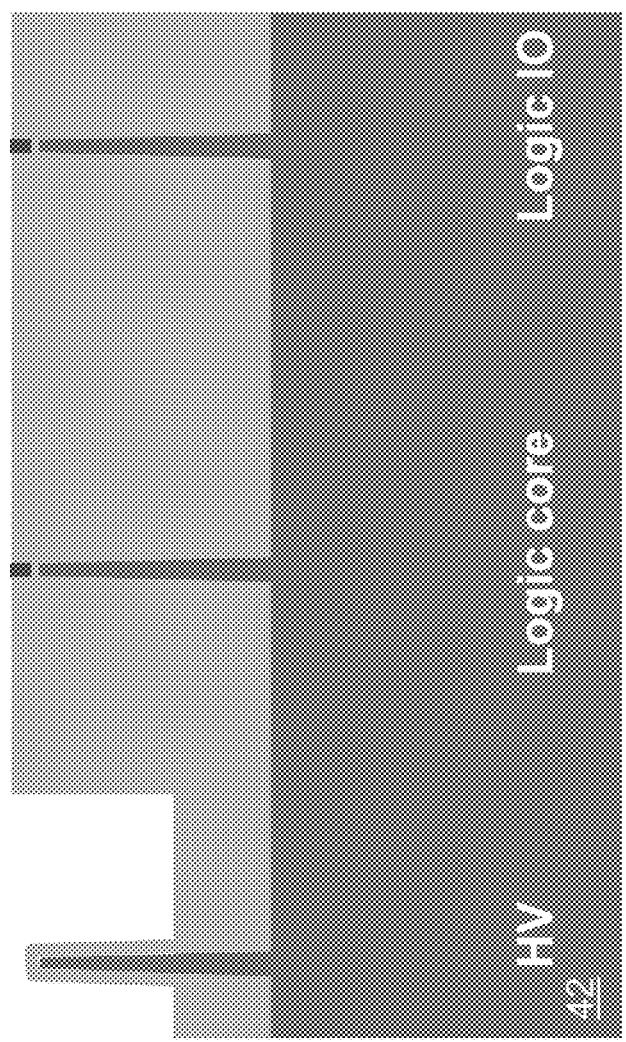
Figure 20D:
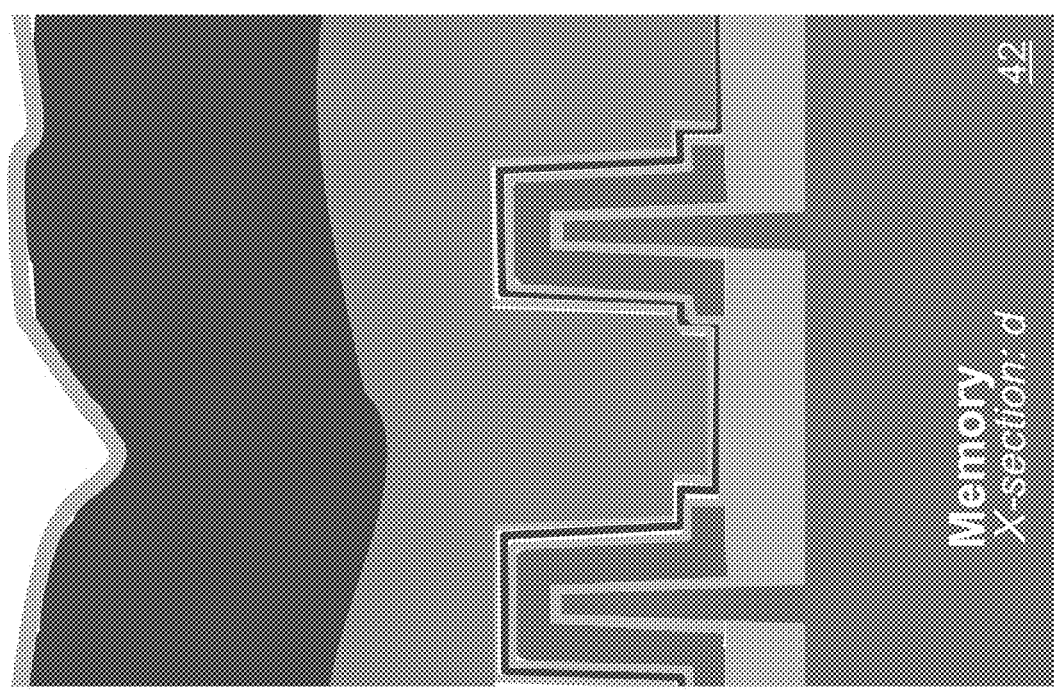

An oxide layer 54 is formed over the structure. This layer is conformal in the Logic Areas because the spacing between strips of hard mask material in the Logic Areas is greater than that in Memory Area 42a (in which the layer fills the space between hard mask material strips), as shown in FIGS. 7A and 7B. An anisotropic oxide etch follows, which leaves spacers of oxide on vertical sidewalls of the hard mask strips sufficiently spaced apart. A carbon wet strip etch is used to remove the carbon hard mask material, as shown in FIGS. 8A and 8B. The spacing between two neighboring patterns of hard mask material 50 in FIG. 6A in Memory Area 42a is preferably less than or equal to two times the thickness of oxide layer 54 in order to form the merged spacers as shown in FIG. 8A. Photoresist is formed over the structures and patterned to leave strips of photoresist covering alternating oxide spacers/blocks in Memory Area 42a and possibly some of the oxide spacers in the Logic Areas. An oxide etch is then used to remove those oxide spacers left exposed by photoresist. After photoresist removal, one or more etches are then performed to remove those portions of nitride 48, oxide 46 and upper portions of substrate 42 that are not underneath the remaining oxide spacers, which results in the formation of trenches 56 that extend into the substrate, leaving thin fin structures 58 of the substrate 42 between adjacent trenches 56, as shown in FIGS. 9A-9B (after removal of the oxide spacers). Fins 58 extend in both the vertical (column) and horizontal (row) directions in Memory Area 42a (i.e., they are the same as fins 40 and 41 referenced above). FIG. 9C shows a top view of Memory Area 42a, where fins 58 extend in the row and column directions in a grid pattern (i.e., the vertically extending fins which have lengths extending in the column direction intersect with the horizontally extending fins which have lengths extending in the row direction in a grid like manner). In Memory Area 42a, the final width of each fin 58 can be approximately 10-50 nm.

While FIG. 9B only shows one fin 58 in each of HV Area 42b, Logic Core Area 42c and Logic IO Area 42d, and FIG. 9A only shows two fins 58 in Memory Area 42a, many multiple fins are formed in each area. While not shown, the spacing between fins will vary based on the area. For example, the distance between adjacent fins in Logic Core Area 42c preferably is less than the distance that separates adjacent fins in Memory Area 42a. Insulation material 60 (e.g., oxide) is formed over the structures (including filling trenches 56 with oxide 60), followed by oxide planarization (e.g., CMP) to remove any portion of oxide 60 above the tops of nitride 48. A hard mask layer (e.g., nitride) 62 is formed over the Logic Areas but not over Memory Area 42a. An oxide etch is then used to recess (i.e., remove the upper portions of) oxide 60 in Memory Area 42a. The resulting structures are shown in FIGS. 10A and 10B.

The nitride 48 and oxide 46 on the tops of fins 58 in Memory Area 42a are removed with nitride and oxide etches (using photoresist to protect nitride layer 62 in the Logic Areas). After photoresist removal, a layer of oxide 64 is then formed on the two side surfaces and the top surface of each fin 58 in Memory Area 42a (e.g., by oxidation). A conformal layer of polysilicon (poly) 66 is then formed on the structures (including on oxide 64), as shown in FIGS. 11A-11D. In-situ doping of the poly layer 66 is then performed. A masking step and poly etch are performed to remove selected portions of poly layer 66 in the bottom of trenches 56 in Memory Area 42a (between fins 58), as shown in FIGS. 12A-12E. An insulation layer 67 (e.g., ONO, with oxide-nitride-oxide sublayers) is formed on the structures. A thick layer of polysilicon 68 is then formed on ONO layer 67 (which can be subjected to in-situ doping). A hard mask layer 69 (e.g., amorphous carbon or nitride) is then formed on poly layer 68. The resulting structures are shown in FIGS. 13A-13E.

A masking step and one or more etches are performed to remove selected portions of the hard mask layer 69, poly layer 68, and ONO layer 67 along the tops of the fins 58 in Memory Area 42a, leaving pairs of gate stack structures (stacks S1 and S2) on the top surface of each fin 58 in Memory Area 42a (which include poly blocks 68a and insulation blocks 69a), as shown in FIGS. 14A-14E.

A masking step is used to cover the portion of Memory Area 42a between the pair of stacks S1/S2 with photoresist, which is followed by a poly etch which removes exposed portions of poly layer 66 adjacent the outer sides of stacks S1/S2 in Memory Area 42a. A separate masking and etch process is used to remove hard mask layer 69, poly layers 68 and 66, and ONO layer 67 from the Logic Areas. The resulting structures are shown in FIGS. 15A-15E (after photoresist removal).

A high temperature oxide (HTO) deposition and anneal are performed to form oxide layer 70 along the sides of the gate stacks S1 and S2. A nitride deposition and etch are performed to form nitride layer 71 along oxide layer 70. A sacrificial oxide spacer 72 is formed along the nitride layer 71 by oxide deposition and etch. The resulting structures are shown in FIGS. 16A-16E. A poly etch is used to remove exposed portions of the floating gate poly layer 66 (from between stacks S1 and S2 in Memory Area 42a), as shown in FIGS. 17A-17E. Photoresist 74 is formed between each of the gate stack pairs S1 and S2 using a masking step. A word line Vt (WLVT) implant is then performed, followed by an oxide etch that removes oxide spacers 72 on the outer sides of the stack pairs S1 and S2 (and slightly recesses exposed portions of oxide 60), as shown in FIGS. 18A-18E.

After photoresist removal, a masking step is used to cover Memory Area 42a with photoresist and a nitride etch is used to remove nitride layer 62 covering the Logic Areas. After photoresist removal, a masking step is used to cover the structures with photoresist except for the HV Area 42b, which is subjected to oxide and nitride etches to remove nitride 48 and oxide 46 on the fins 58, and to recess oxide 60 on either sides of the fins 58. An oxide layer 80 is then formed on the exposed fins 58 in HV Area 42b (e.g., rapid thermal oxidation RTO+HTO and anneal) and in Memory Area 42a, as shown in FIGS. 19A-19E.

A masking step is used to cover the structures with photoresist except for the area between each of the gate stack pairs S1 and S2 in Memory Area 42a. An implant is performed in the substrate between each of the gate stack pairs S1 and S2 (i.e., source line implant for forming source lines SL, i.e., source regions 36 as shown in the b cross sections and source lines SL in fins 58 extending in the horizontal/row direction as shown in the a and c cross sections). An oxide etch is then used to remove the oxide 80 and 72 in that same region, followed by the formation of tunnel oxide layer 84 on the exposed surfaces of poly layer 66 and the inner sidewalls of gate stacks S1 and S2 (e.g., by wet or partial wet deposition to thicken the oxide on the substrate, followed by HTO deposition to achieve desired thickness on poly layer 66 and anneal), as shown in FIGS. 20A-20E (after photoresist removal).

Figure 21:
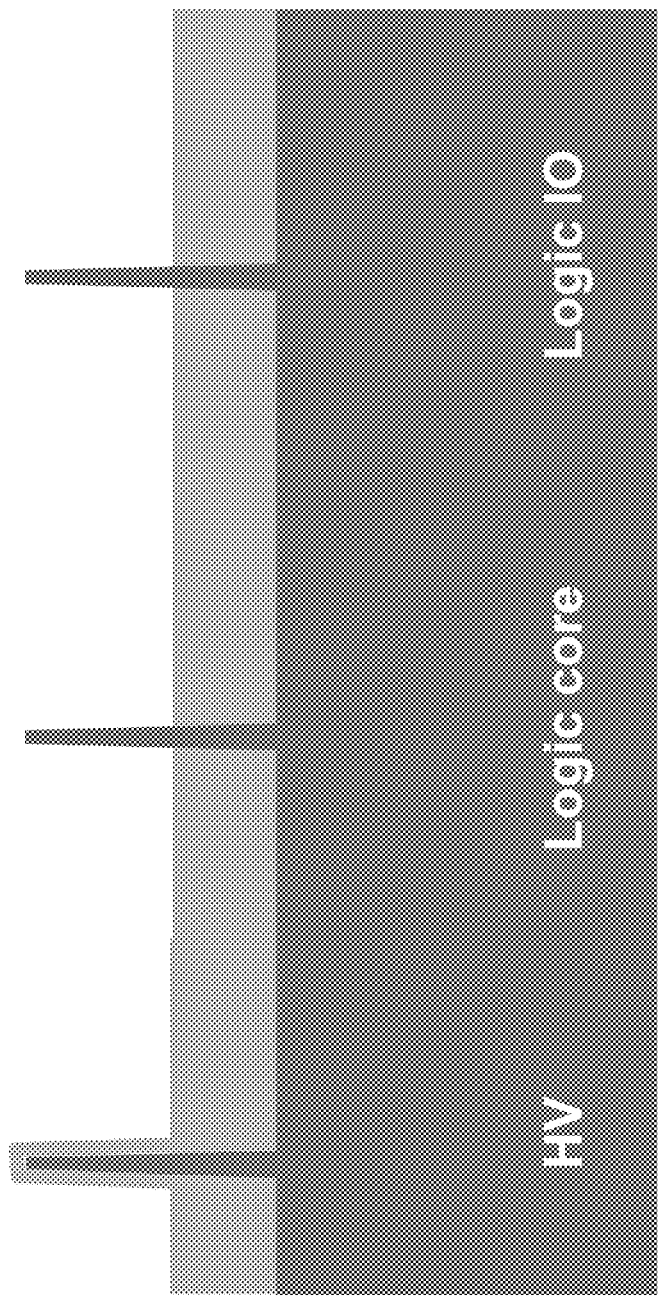
Figure 22A:
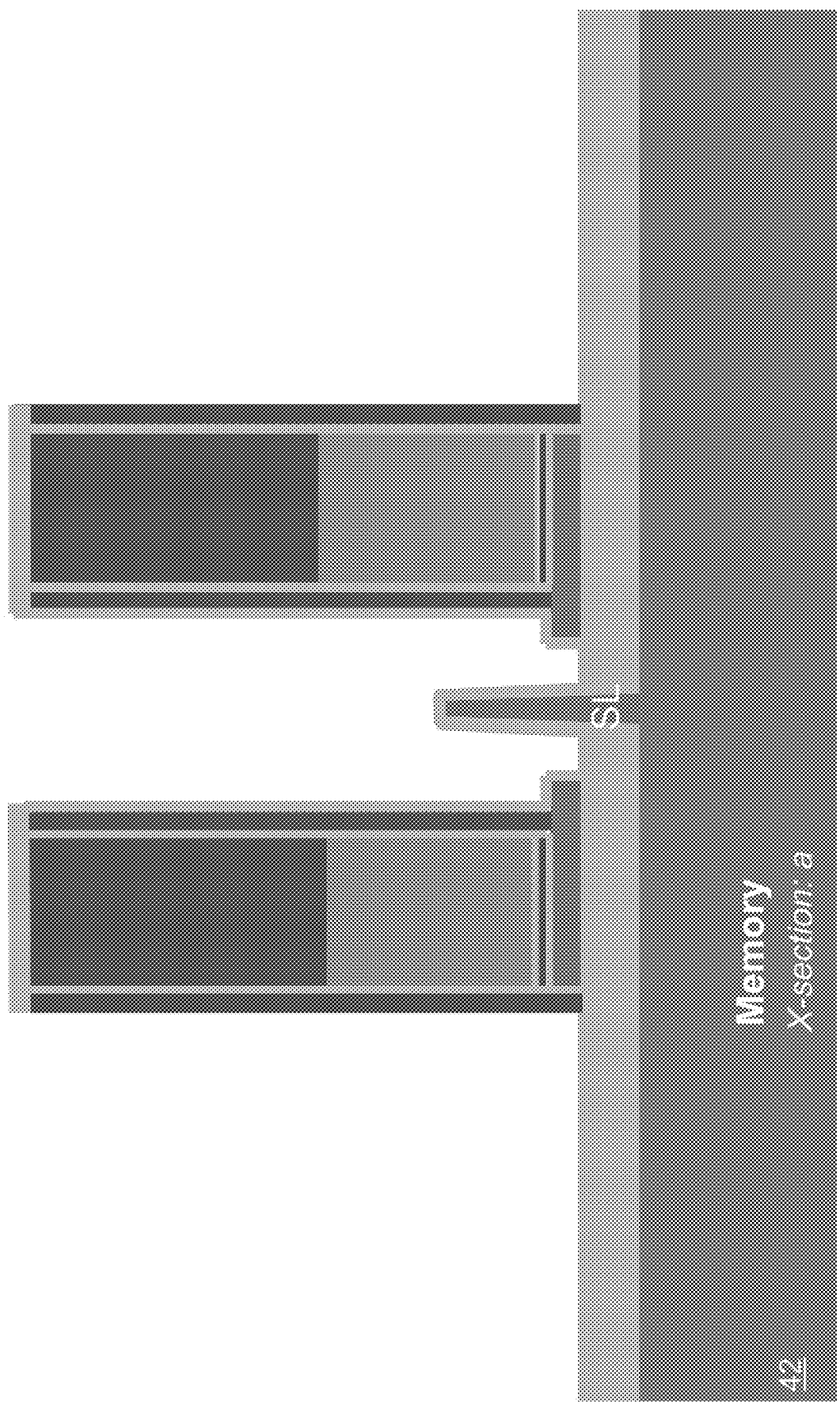
Figure 22B:
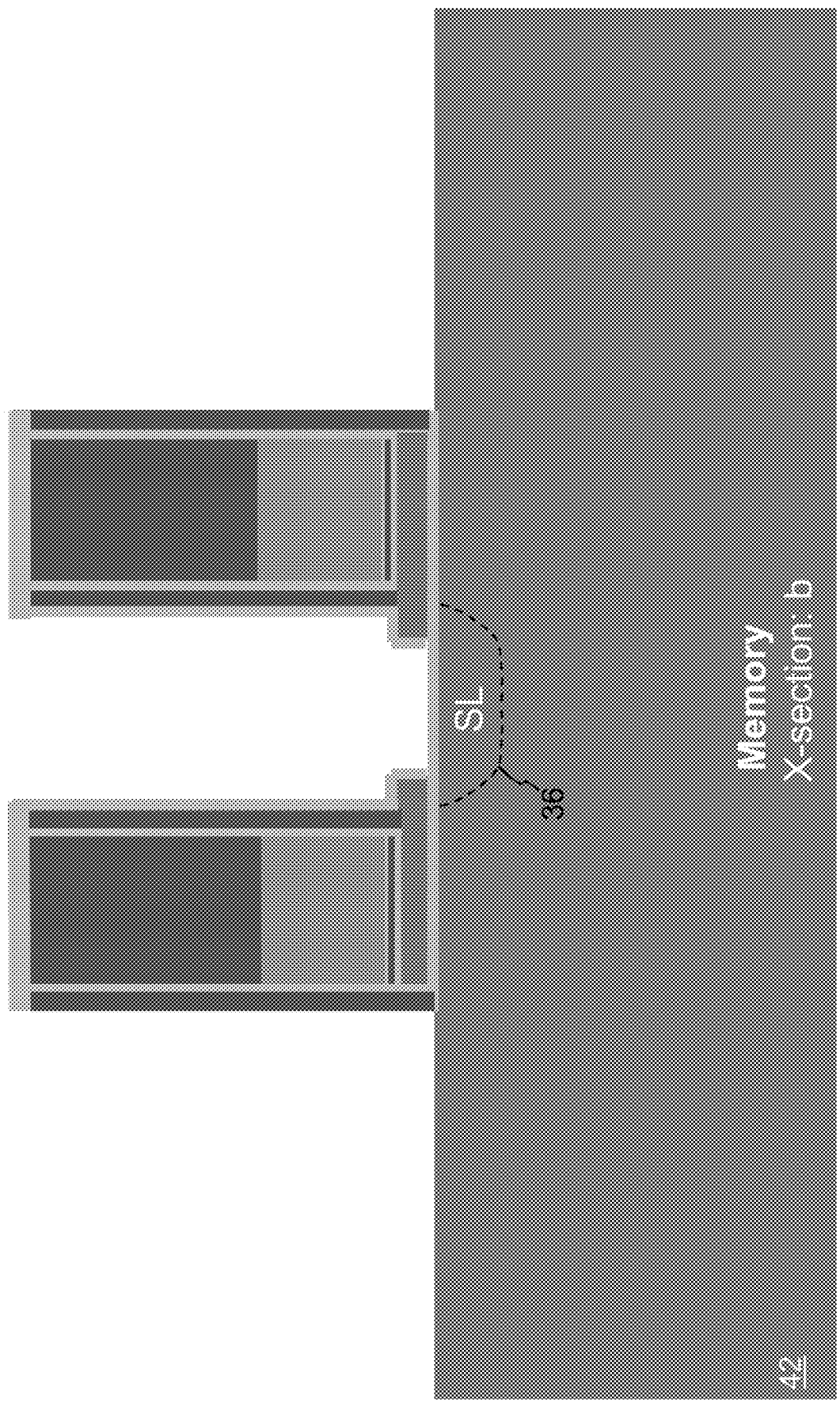
Figure 22C:
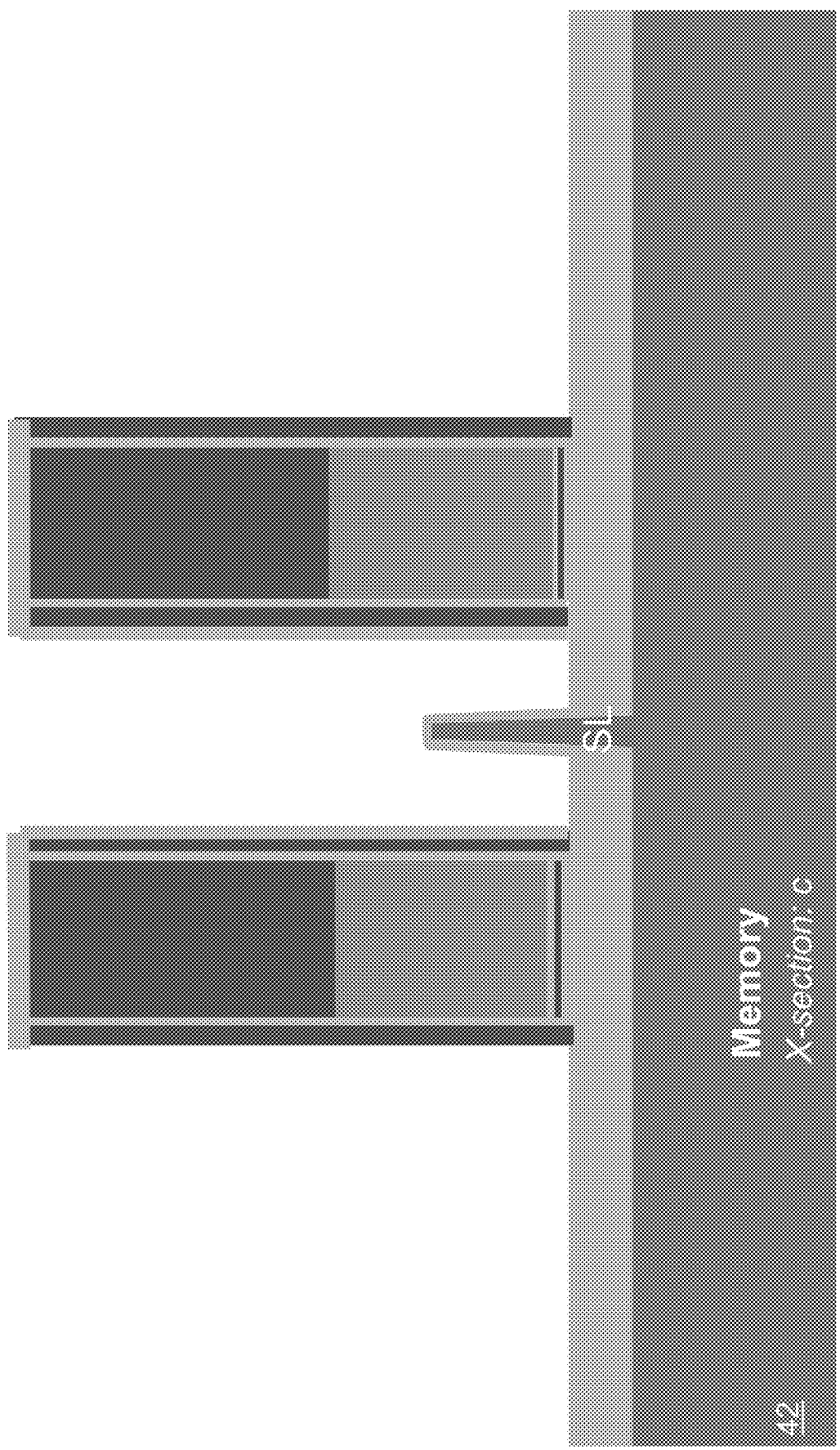
Figure 22D:
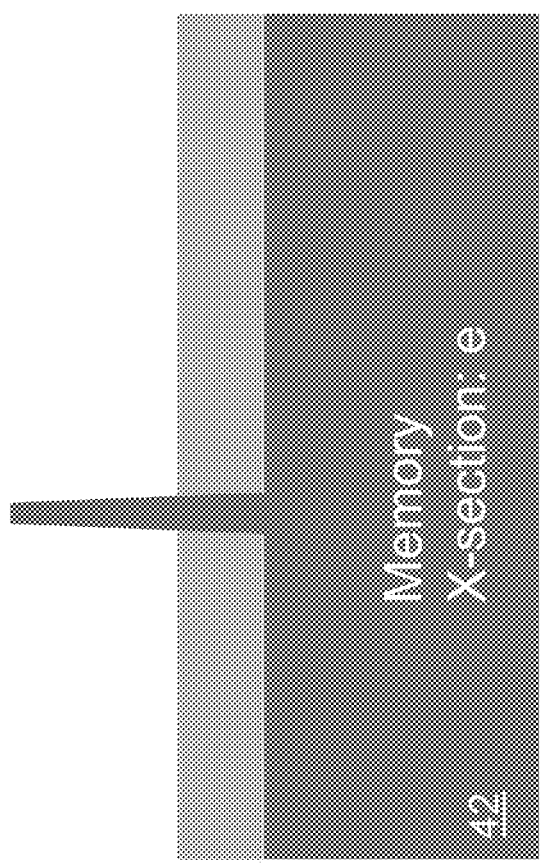

The Memory Area 42a and HV Area 42b are covered by photoresist, and the Logic Core Area 42c and Logic IO Area 42d are subjected to a nitride etch to remove nitride 48 on the tops of the fins, an oxide etch to remove the oxide 46 on the tops of the fins, and to recess oxide 60, as shown in FIG. 21 (after photoresist removal). Before the photoresist removal, one or more implantations are performed (which preferably includes an anti-punch through implantation that will prevent source to drain leakage in the logic devices formed in these areas). A masking step is used to cover the area between each of the gate stacks S1 and S2 in the Memory Area 42a and in the Logic Areas with photoresist. An oxide etch is then used to remove exposed oxide along the vertical outer surfaces of the pair of stacks S1/S2 and the exposed oxide on the tops and side surfaces of the fins 58 outside of the pair of stacks, as shown in FIGS. 22A-22D.

Figure 23B:
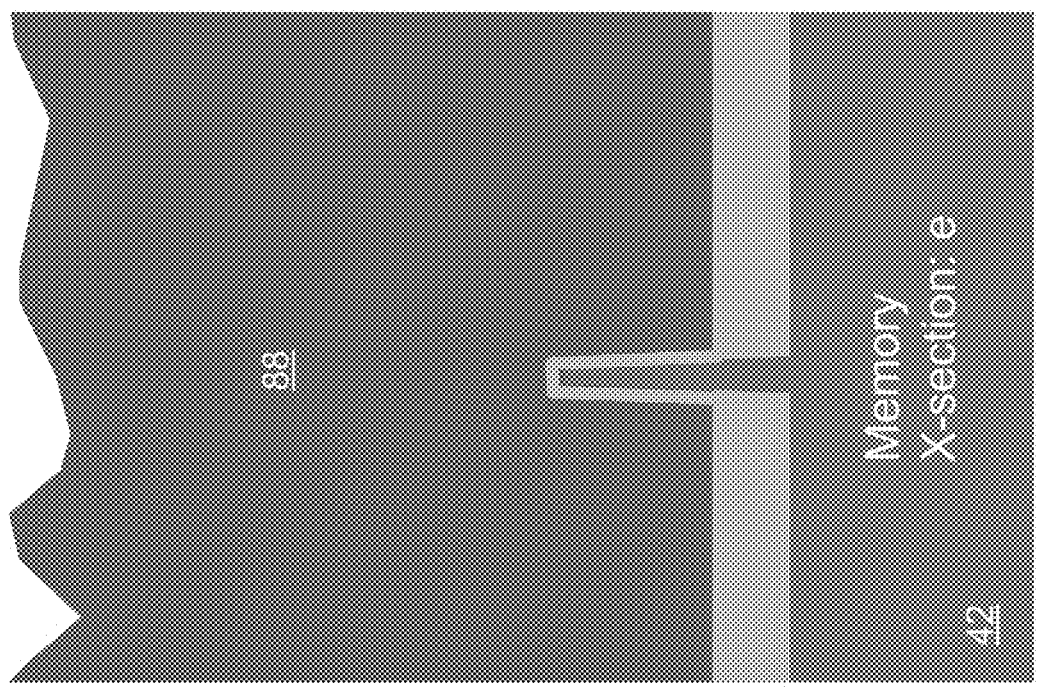
Figure 23A:
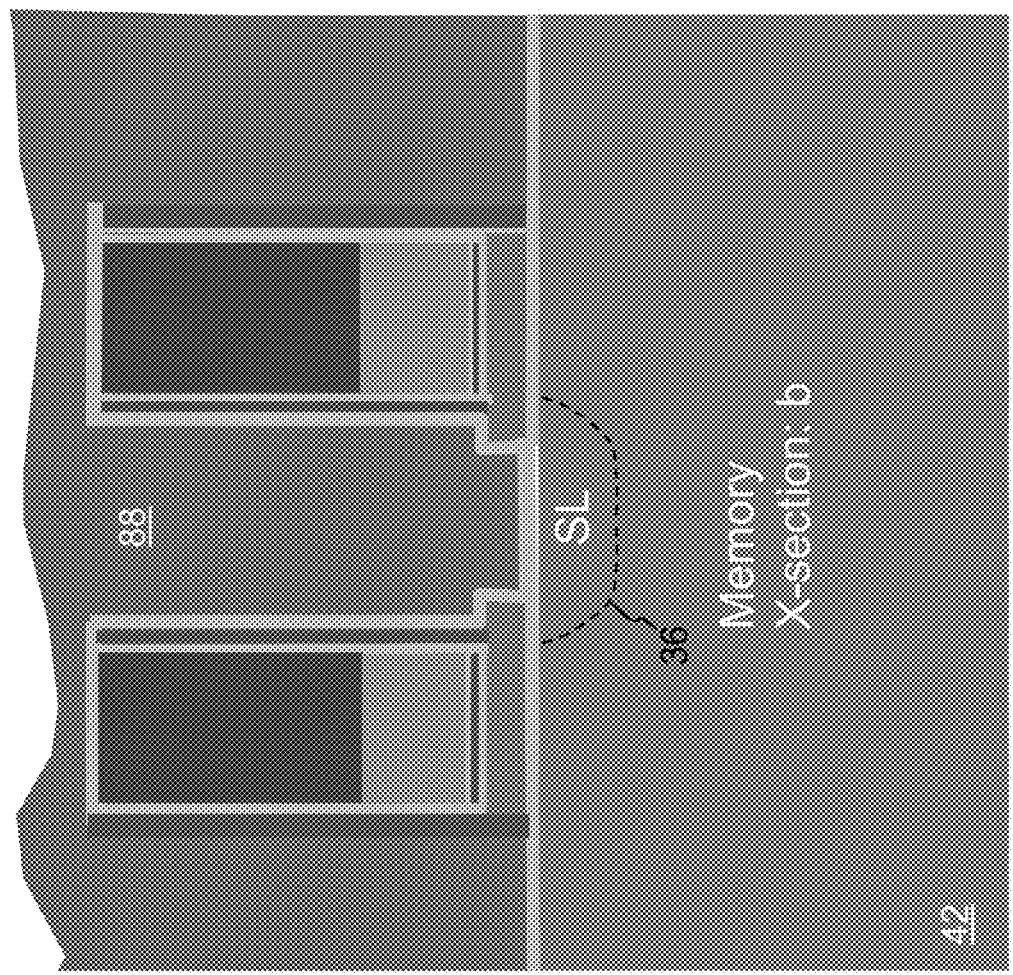
Figure 24B:
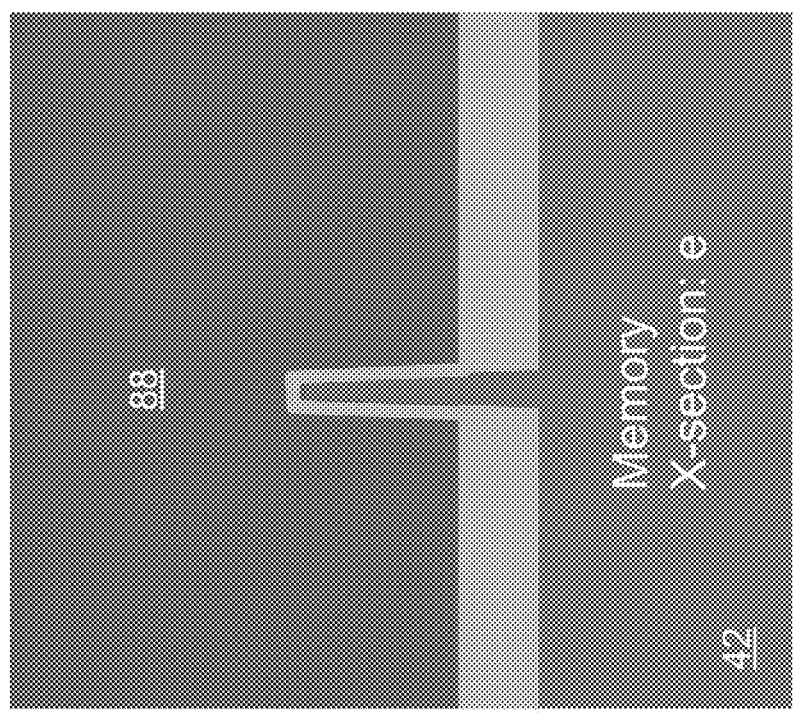
Figure 24A:
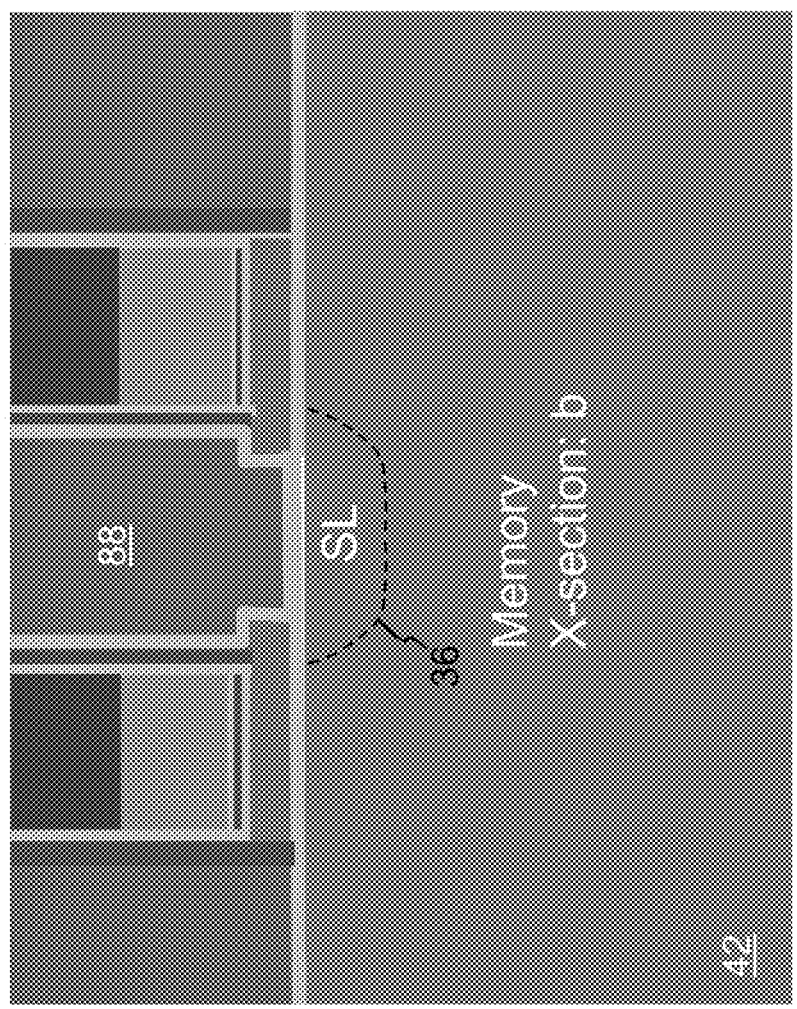
Figure 25A:
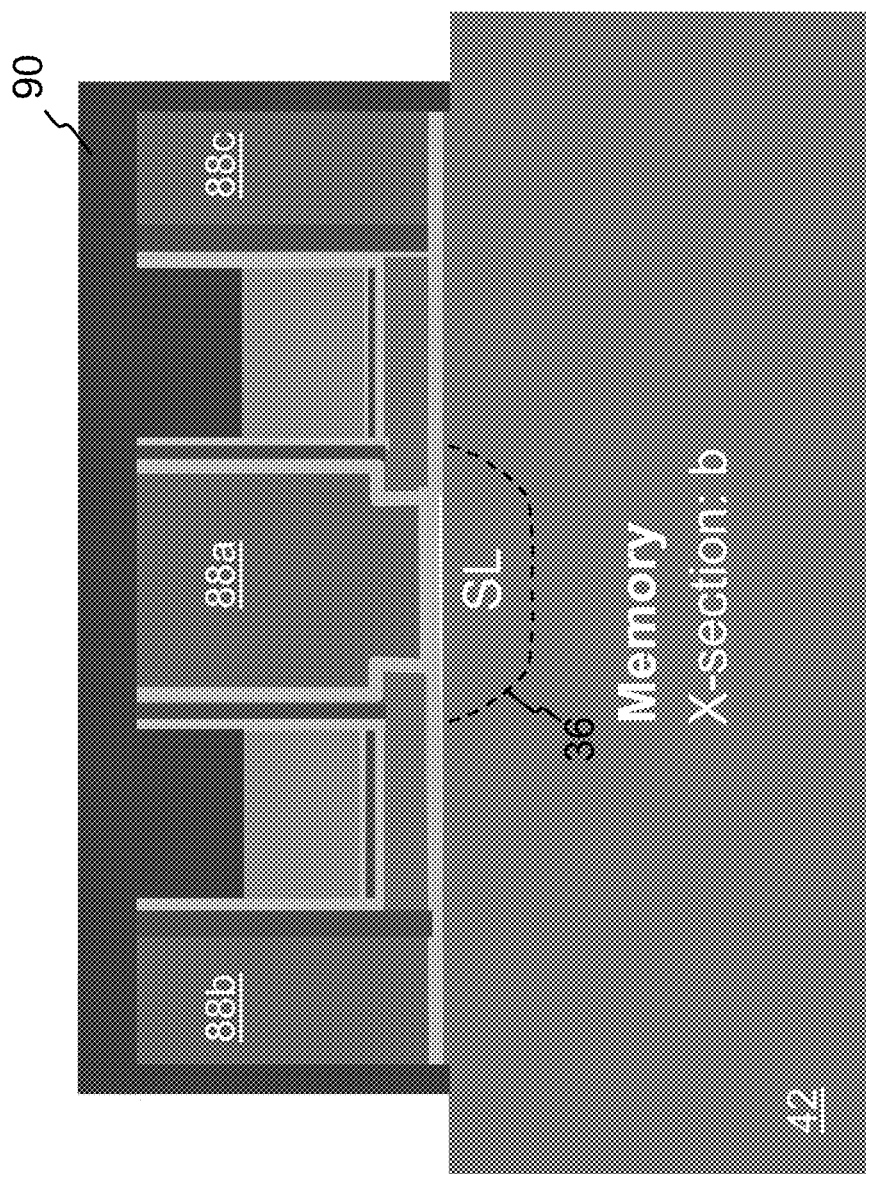
Figure 25B:
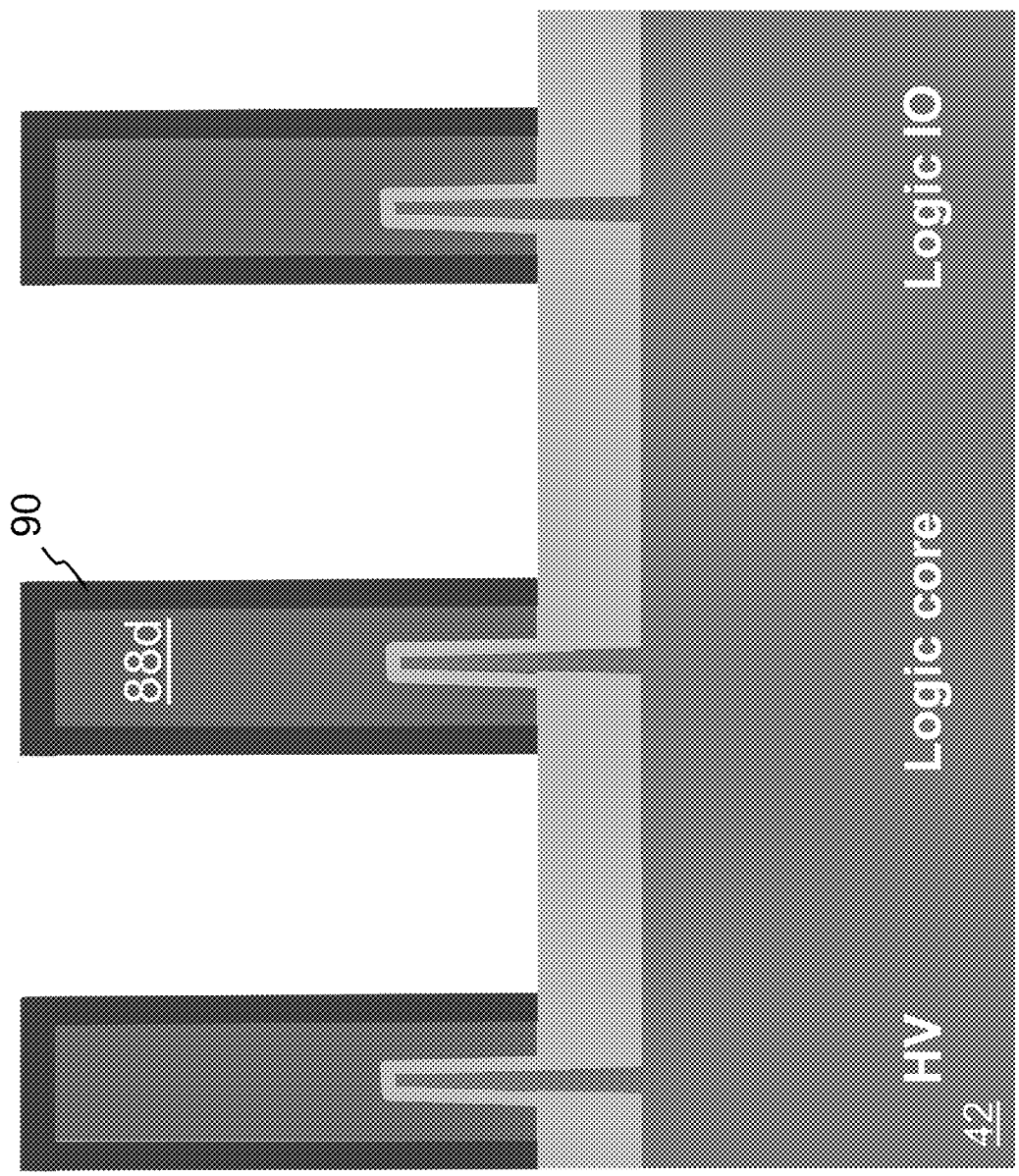
Figure 25C:
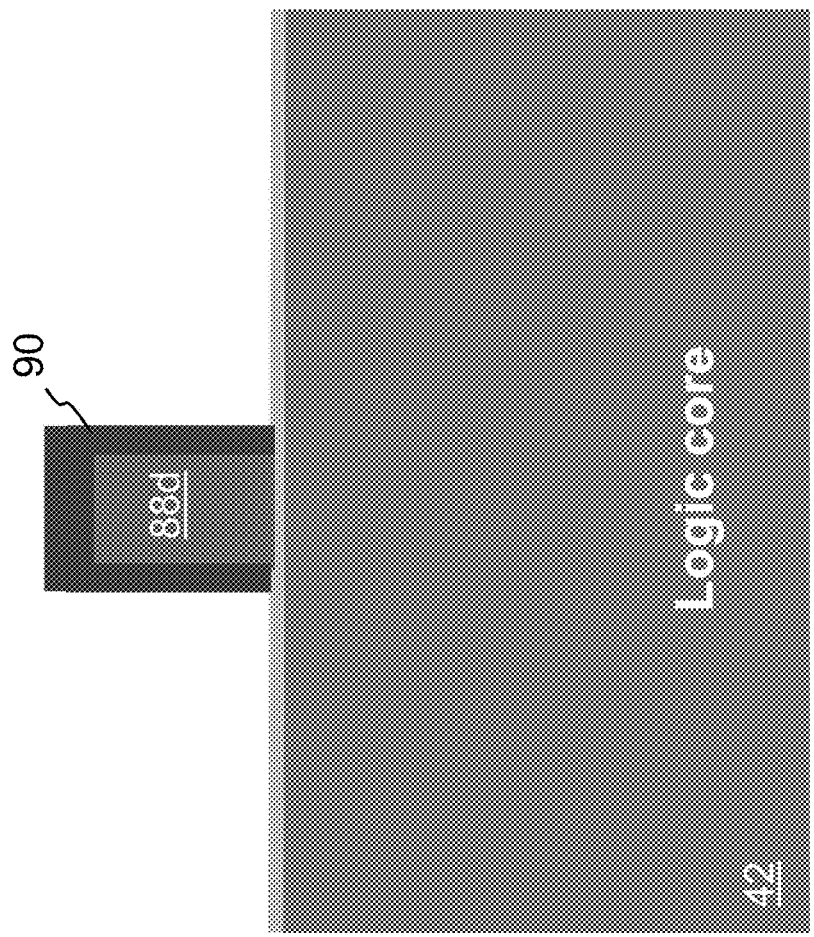

Photoresist is then formed on Memory Area 42a and HV Area 42b, followed by forming oxide 86 on the exposed fins 58 in Logic Core Area 42c and Logic IO Area 42d (and other exposed portions of substrate 42). Oxide 86 on the fins 58 in Logic Core Area 42c and Logic IO Area 42d is preferably formed by CVD, and is thinner than oxide 80 on the fins 58 in HV Area 42b. After photoresist removal, poly layer 88 is formed over the structures, as shown in FIGS. 23A-23B (for the memory area structures). A chemical mechanical polish (CMP) is used to remove the upper portions of, and planarize, the structures, as shown in FIGS. 24A-24B (for the memory area structures). A masking step and poly etch are used to remove a portion of poly layer 88 between adjacent pairs of gate stacks, leaving a poly block 88a between each of gate stacks S1 and S2, and poly blocks 88b and 88c on the outer portions of each pair of gate stacks S1 and S2. The poly etch also removes portions of poly layer 88 in the Logic Areas, leaving poly blocks 88d over the fins 58. Nitride 90 is formed over the poly blocks 88a-88d. The resulting structures are shown in FIGS. 25A-25C (with FIG. 25C showing an orthogonal view of Logic Core Area 42c, e.g., along the top of fin that extends in the same direction as the fins on which the memory cells are formed in Memory Area 42a).

Figure 26A:
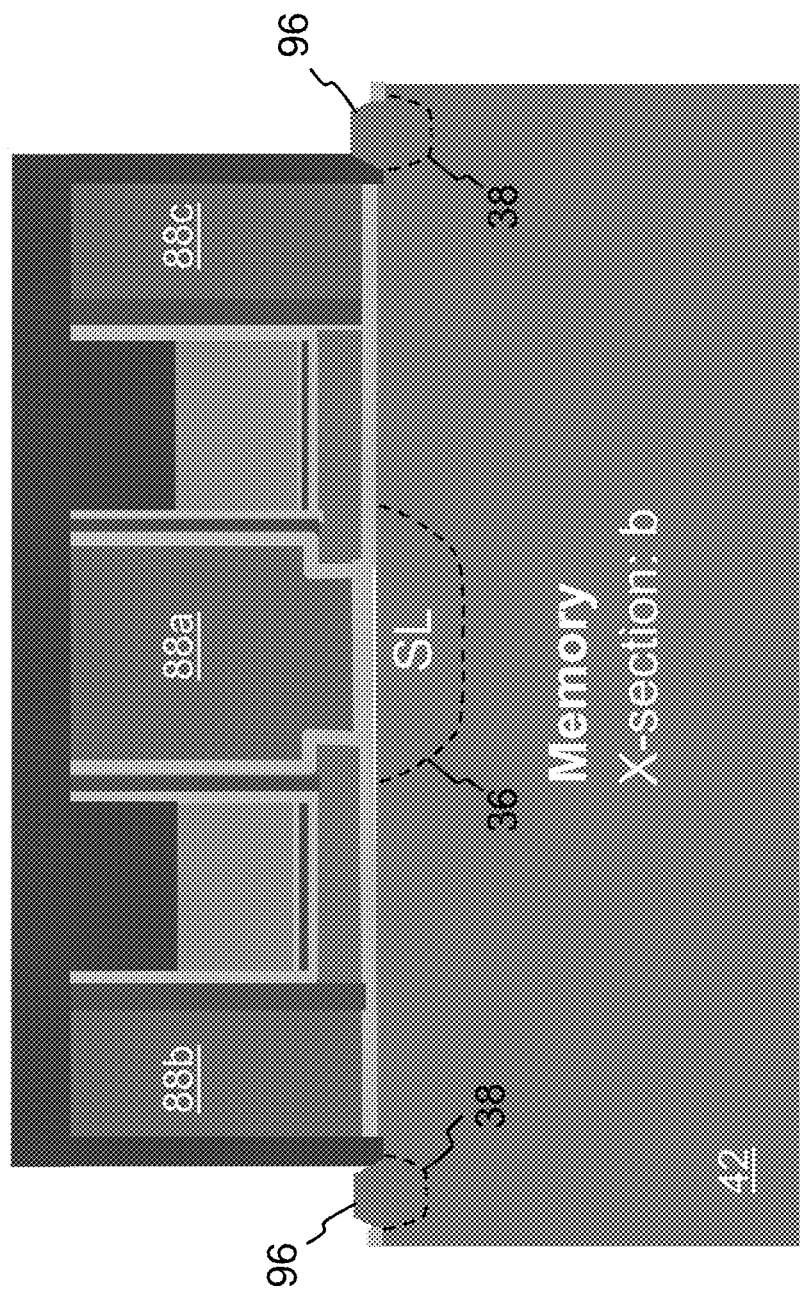
Figure 26B:
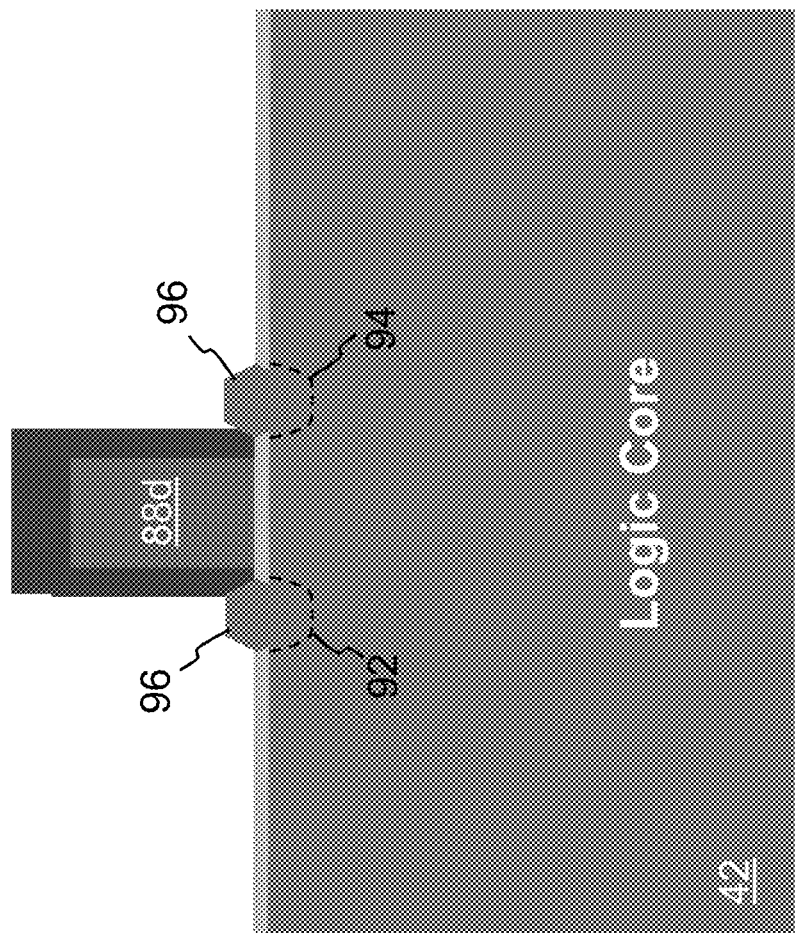

One or more implantations are performed to form source and drain regions in the substrate 42 for the memory cells and logic devices. Specifically, memory cell drain regions 38 are formed in Memory Area 42a adjacent to poly blocks 88b and 88c, and logic source and drain regions 92/94 are formed in HV Area 42b, Logic Core Area 42c and Logic IO Area 42d adjacent the remaining poly blocks 88d. Preferably, before the implantations, these regions are enhanced by performing a masking step and oxide etch to expose the substrate surface above where the memory drain and logic source/drain regions are to be formed. An epitaxial growth step is performed to grow silicon (S1) or silicon carbon (SiC) on the substrate surface, leaving raised silicon regions 96 on the substrate surface. The subsequent implantations forms the memory drain regions 38 and the logic source/drain regions 92/94 at least partially in these raised silicon regions 96, as shown in FIGS. 26A-26B.

Figure 27A:
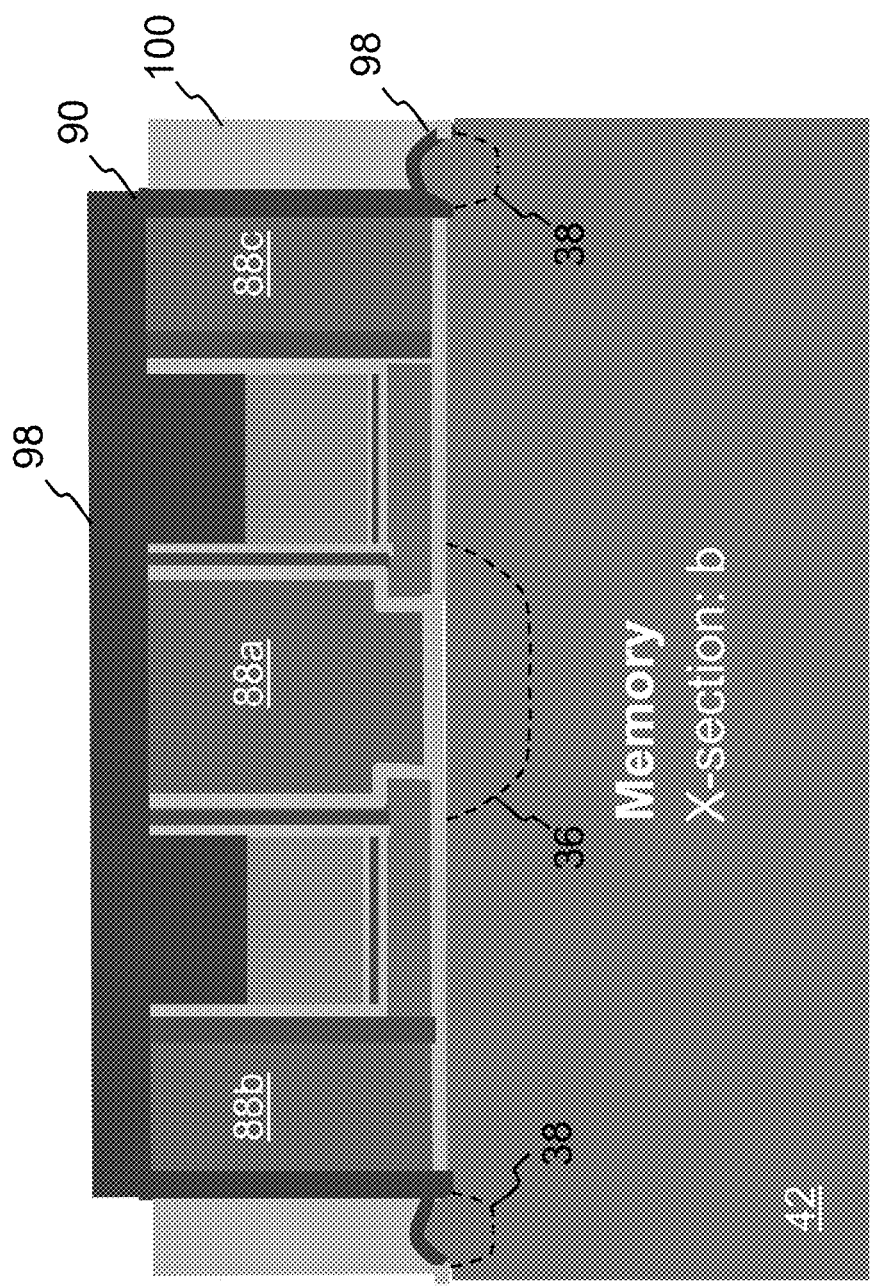
Figure 27B:
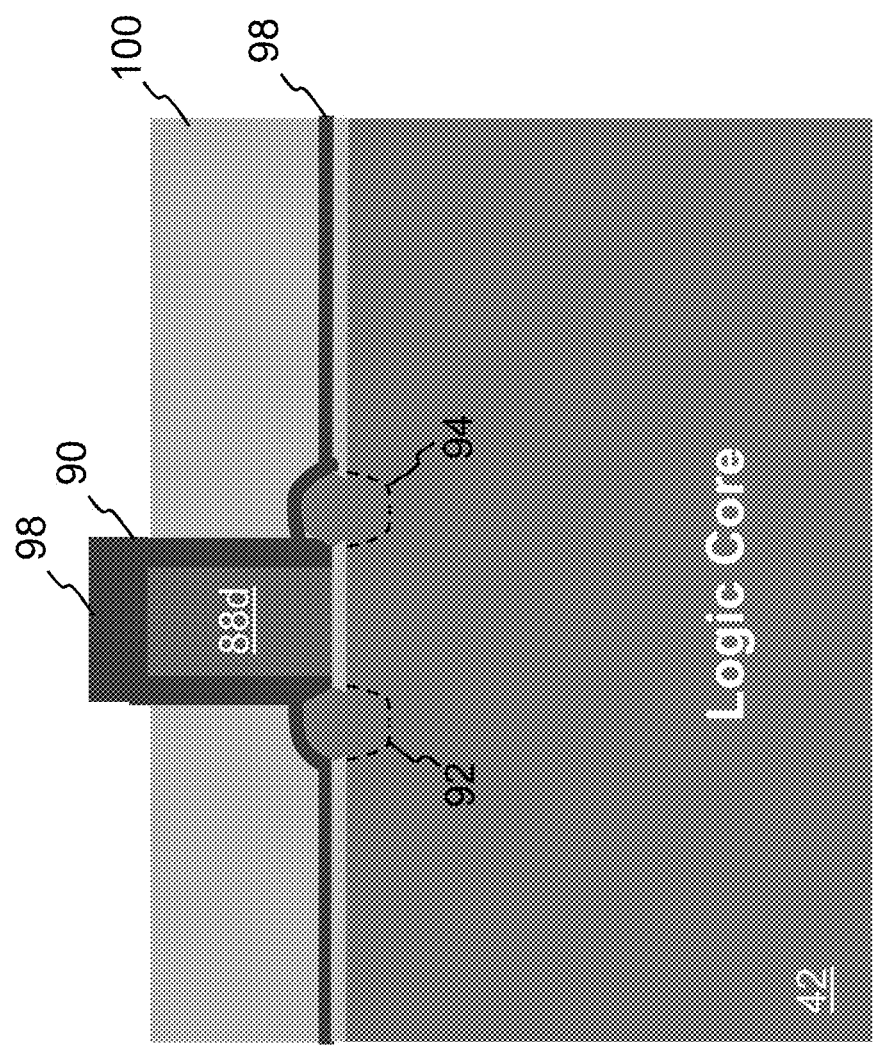
Figure 28A:
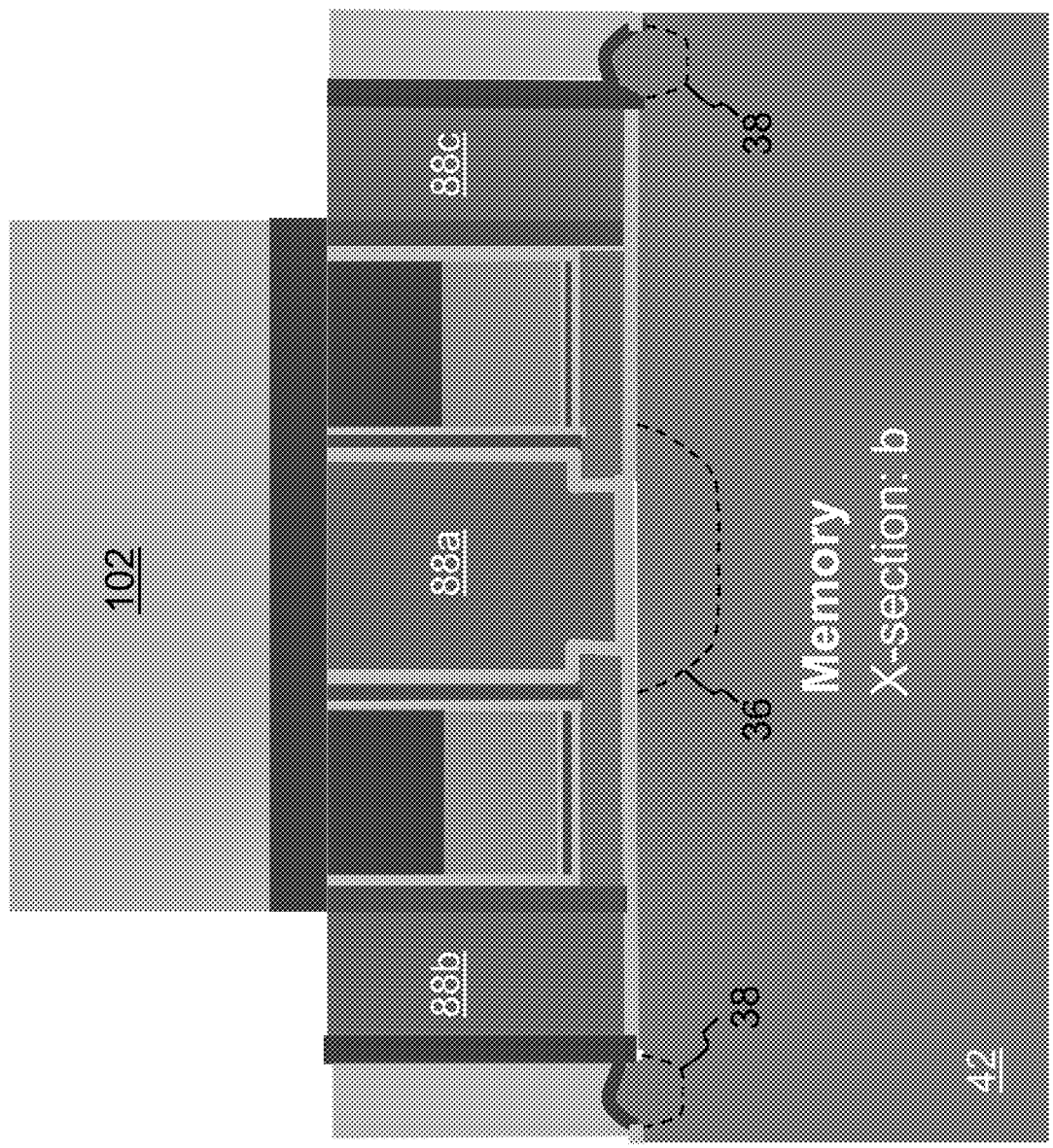
Figure 28B:
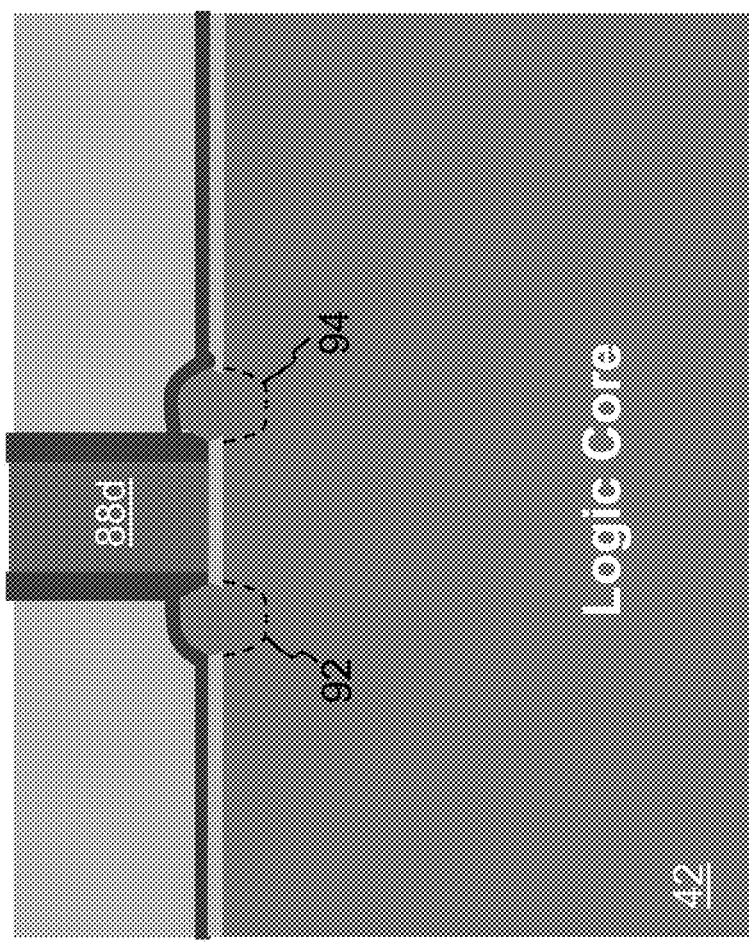
Figure 29A:
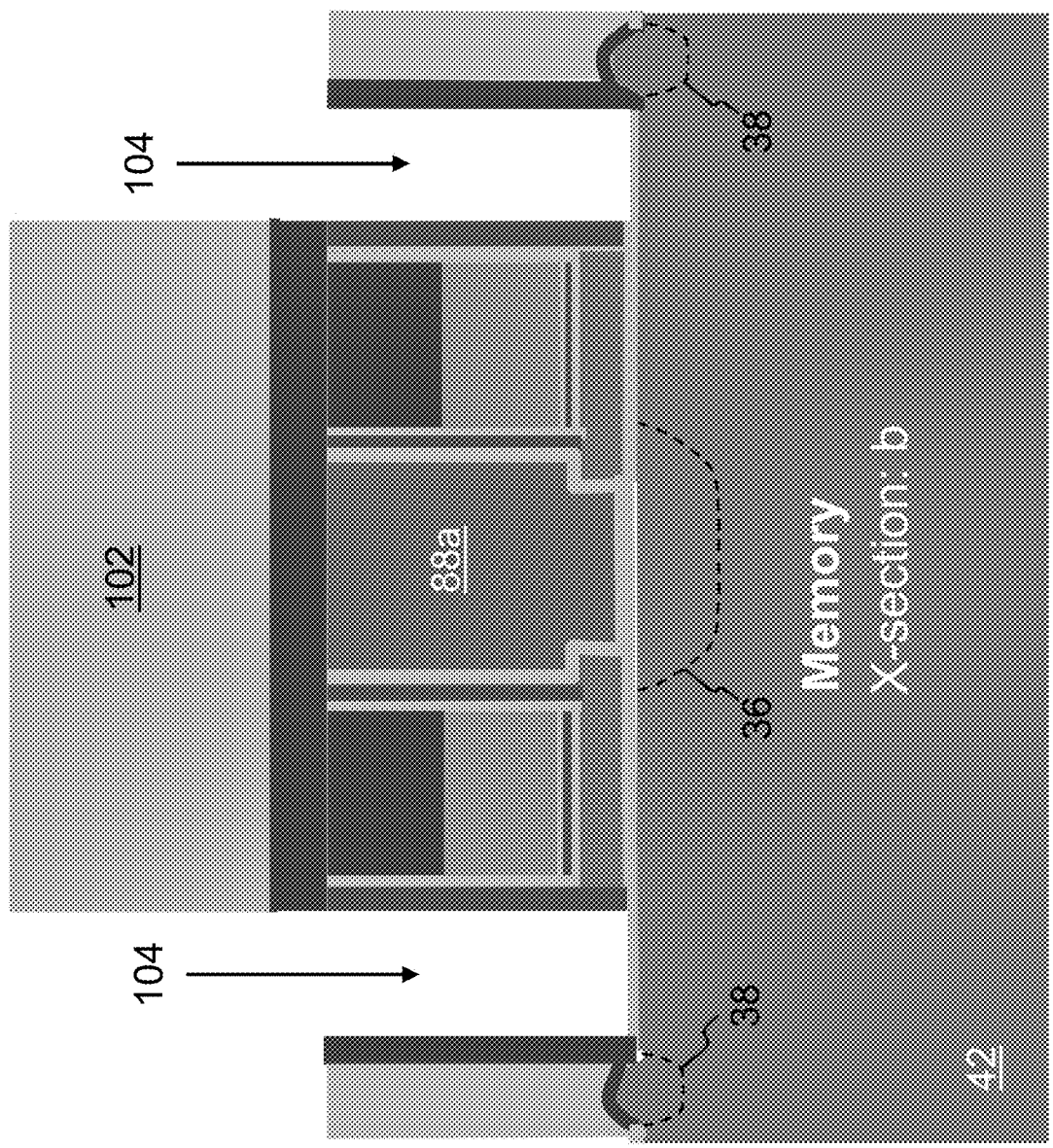
Figure 29B:
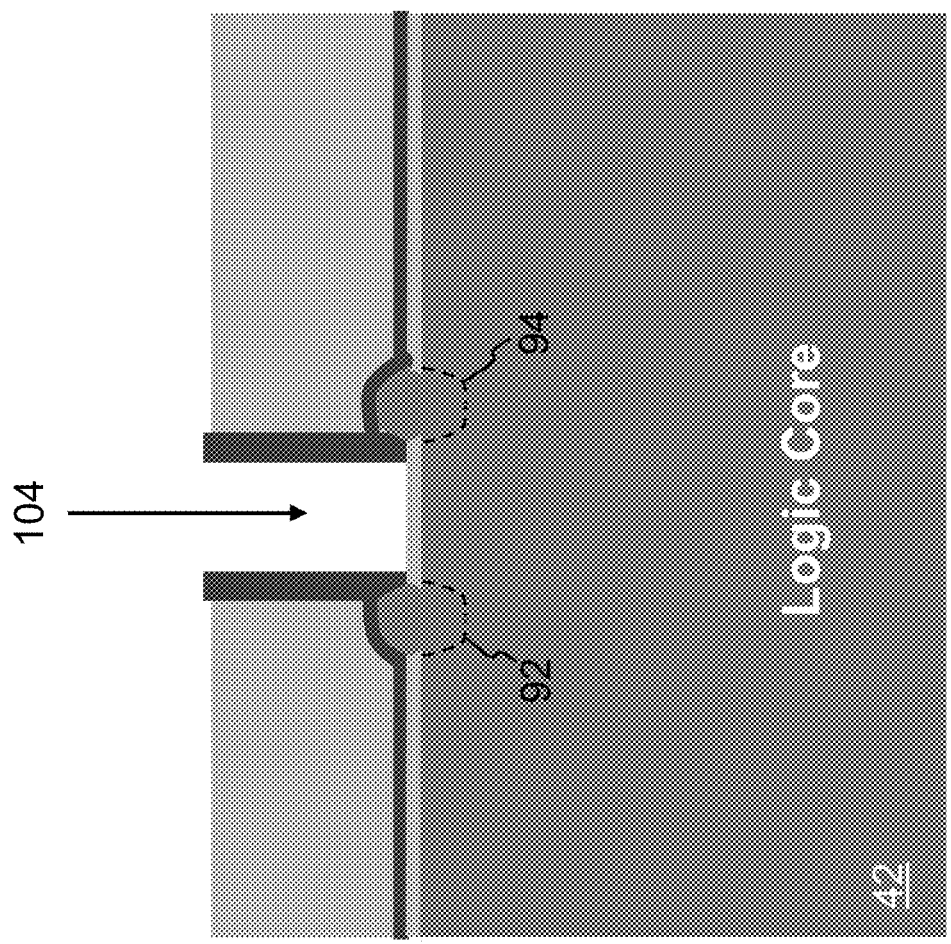
Figure 30A:
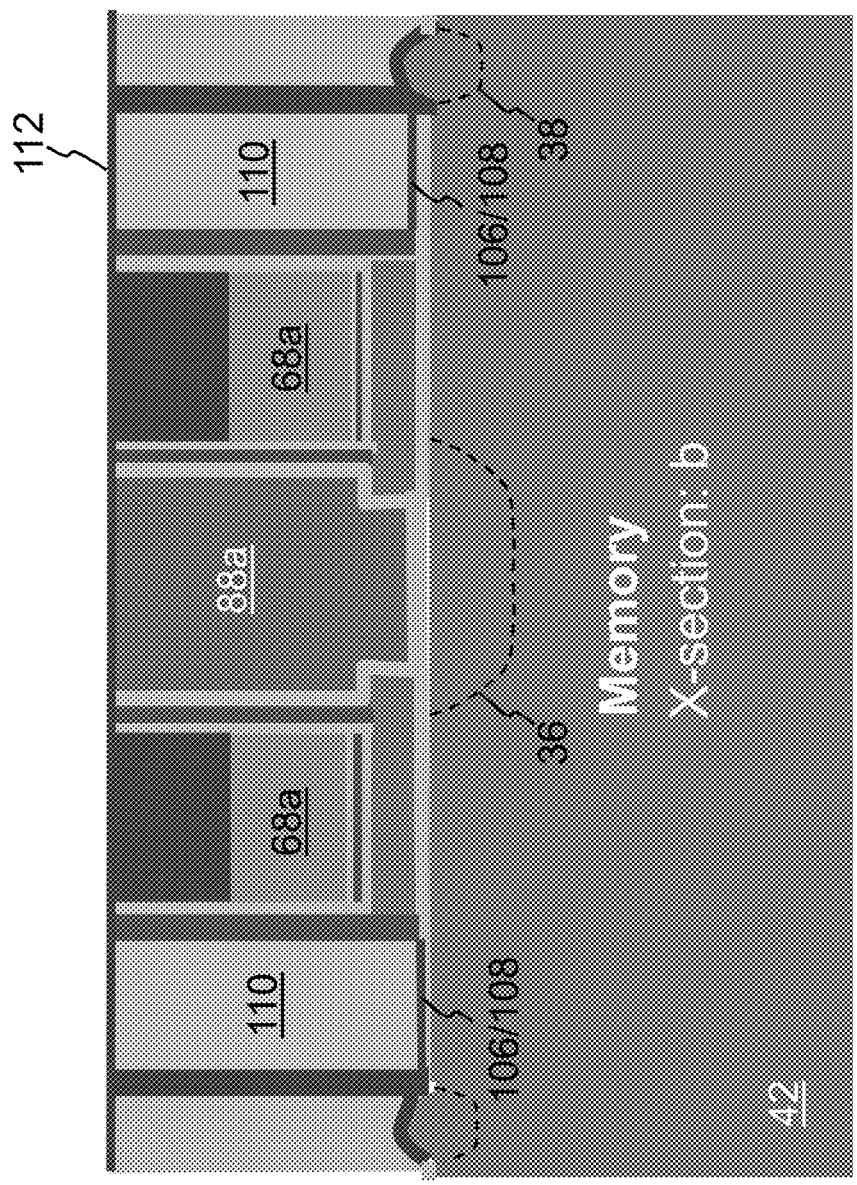
Figure 30B:
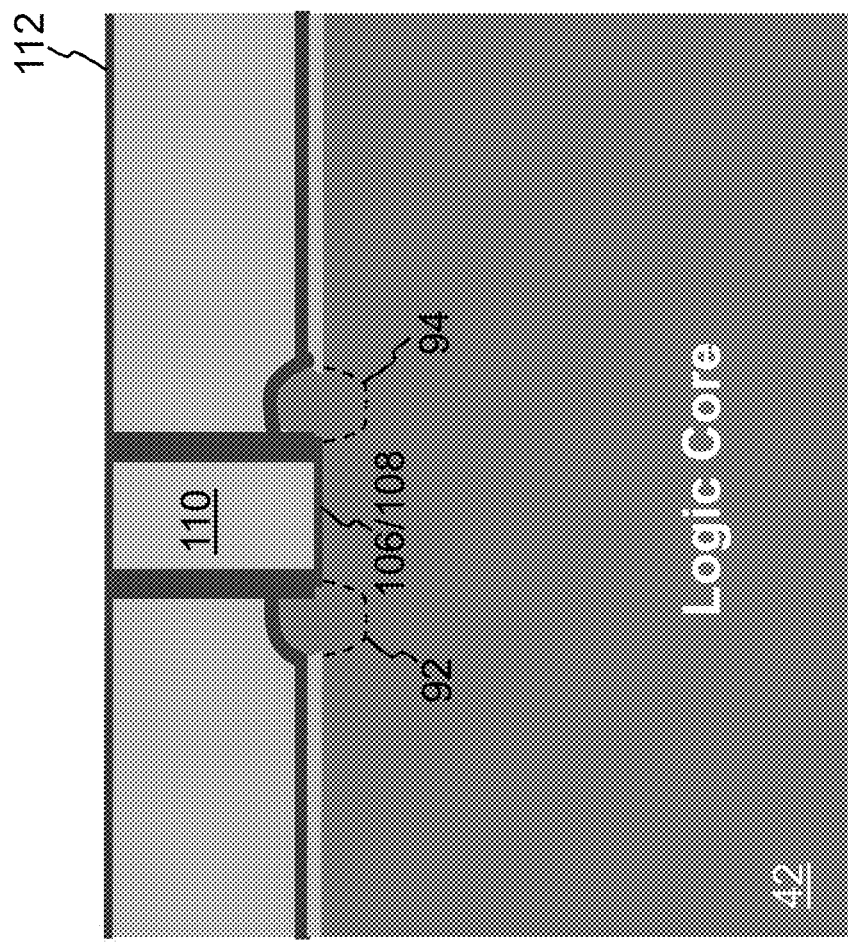

A layer of nitride 98 is formed over the structure. A thick layer of insulation material (ILD oxide) 100 is formed over the nitride 98. A chemical-mechanical polish is then performed to remove oxide 100 down to the top level of the nitride 98 over the poly blocks 88a/88b/88c/88d (i.e., use nitride 98 as an etch stop). An oxide etch back is used to recess the upper surface of oxide 100 below that of the exposed nitride, as shown in FIGS. 27A-27B. Photoresist 102 is formed over the structure, followed by a masking step to remove those portions of photoresist 102 over poly blocks 88b/88c/88d. A nitride etch is then performed to expose poly blocks 88b/88c/88d, as shown in FIGS. 28A-28B. A poly etch is then used to remove the exposed poly blocks 88b/88c/88d, leaving trenches 104 behind as shown in FIGS. 29A-29B. The oxide layer on the substrate fin exposed by the removal of poly block 88d in the Logic Areas (at the bottom of trenches 104) can optionally be removed and/or replaced at this time (using photoresist to protect the corresponding oxide in Memory Area 42a). A thin oxide layer 106 (interfacial layer—IL) is formed at the bottoms of trenches 104. A layer 108 of high K dielectric material (i.e. having a dielectric constant K greater than that of oxide, such as $HfO_2$, $ZrO_2$, $TiO_2$, $Ta_2O_5$, or other adequate materials) is formed on oxide layer 106 in trenches 104. Blocks 110 of metal material are then formed in trenches 104 (e.g., by metal deposition and CMP). A nitride layer 112 is then formed on the structure. The resulting structures are shown in FIGS. 30A-30B.

Figure 31A:
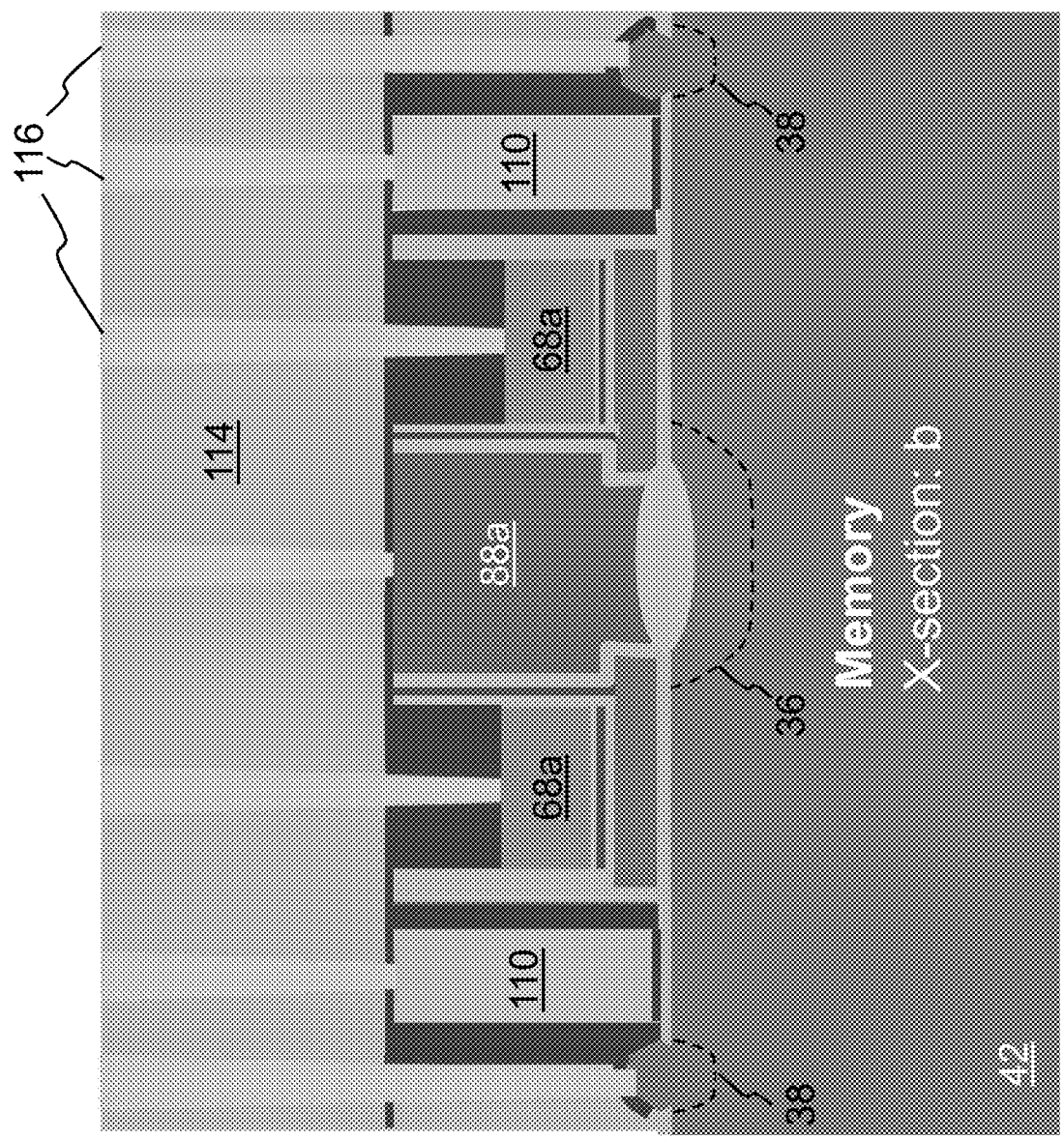
Figure 31B:
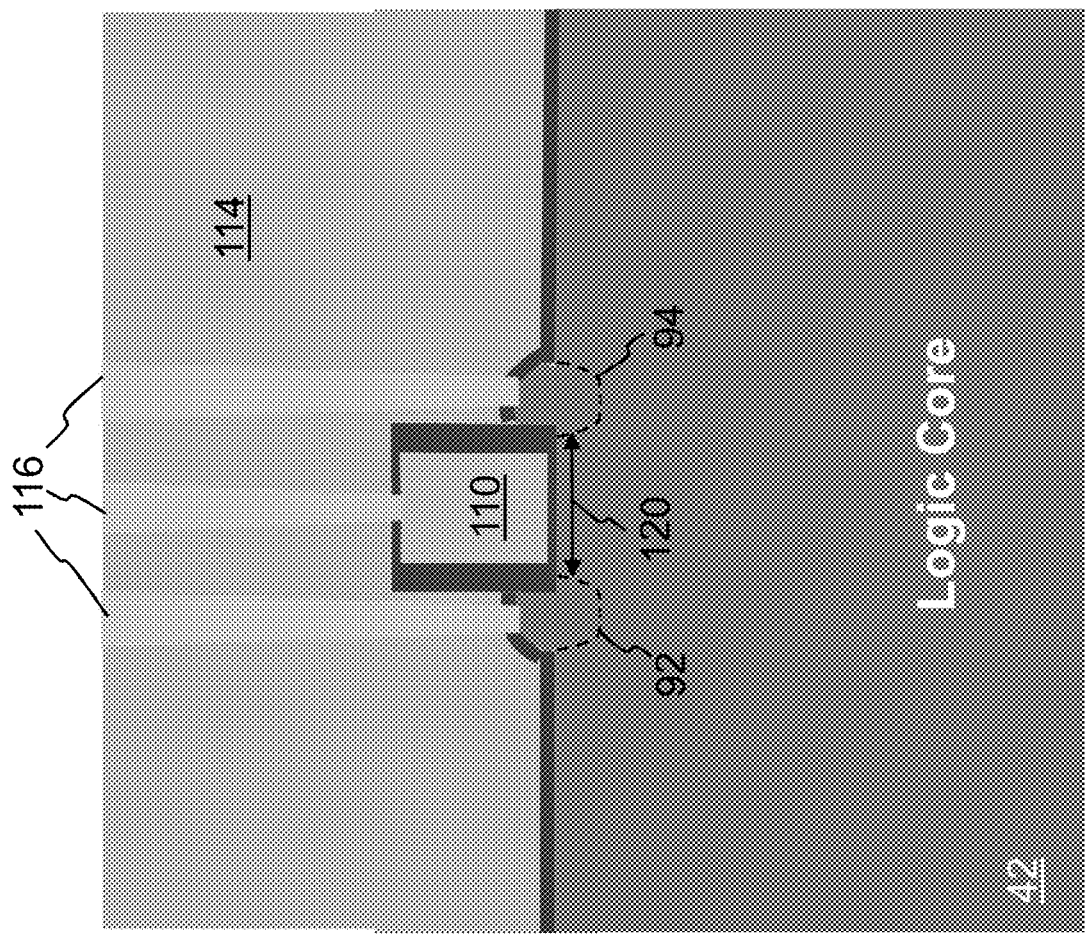

A layer of insulation (e.g., ILD oxide) 114 is formed over the structures and planarized (e.g., by CMP). Contact holes are formed in the insulation material 114 that extend to and expose drain regions 38, metal blocks 110, and the poly block 88a and 68a. The contact holes are then filled with metal to form metal contacts 116 electrically connected to the drain regions 38, metal blocks 110 and poly blocks 88a and 68a, as shown in FIGS. 31A-31B.

Figure 32A:
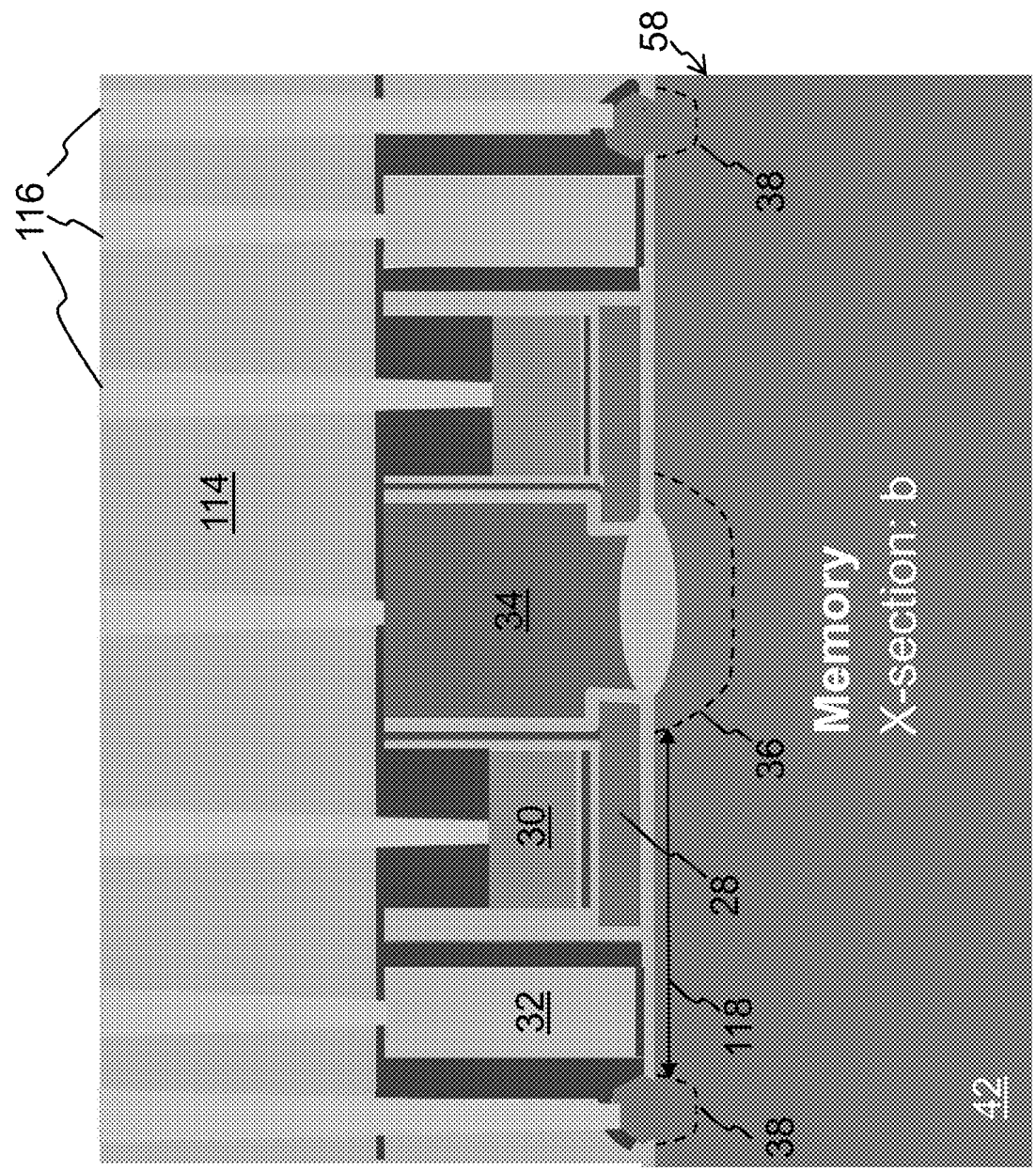

The final structure on fin 58 in Memory Area 42a is shown in FIG. 32A. Pairs of memory cells are formed end to end along each fin 58. Each memory cell includes a channel region 118 of the substrate that extends between the source and drain regions 36 and 38 (i.e., those portions of the substrate along the two side surfaces and the top surface of the fin 58 between the source/drain regions 36/38). Poly block 66a is the floating gate 28, which is disposed over and insulated from a first portion of the channel region 118. Poly block 68a is the control gate 30, which extends over and is insulated from the floating gate 28. Metal blocks 110 next to the control gates 30 are each the select gates 32, each of which is disposed over and insulated from a second portion of the channel region 118. Poly block 88a is the erase gate 34, which is adjacent to and insulated from the pair of the floating gates 28, and over and insulated from the source region 36. The erase gate 34 includes a pair of notches each facing a corner of one of the floating gates. The fin 58 has two opposing side surfaces and a top surface. The floating gate 28 wraps around the fin 58 so that it is adjacent to and insulated from both opposing side surfaces, as well as the top surface, of the fin 58. The select gate 32 also wraps around the fin 58 so that it is adjacent to and insulated from both opposing side surfaces, and the top surface, of the fin 58. Therefore, one advantage of the present configuration is that the surface area of the channel region 118 is greater in size versus an equally sized memory cell over a planar channel region (i.e., the amount of surface overlap between the floating and select gates and the substrate is greater than the horizontal area of the substrate occupied by these elements).

Figure 32B:
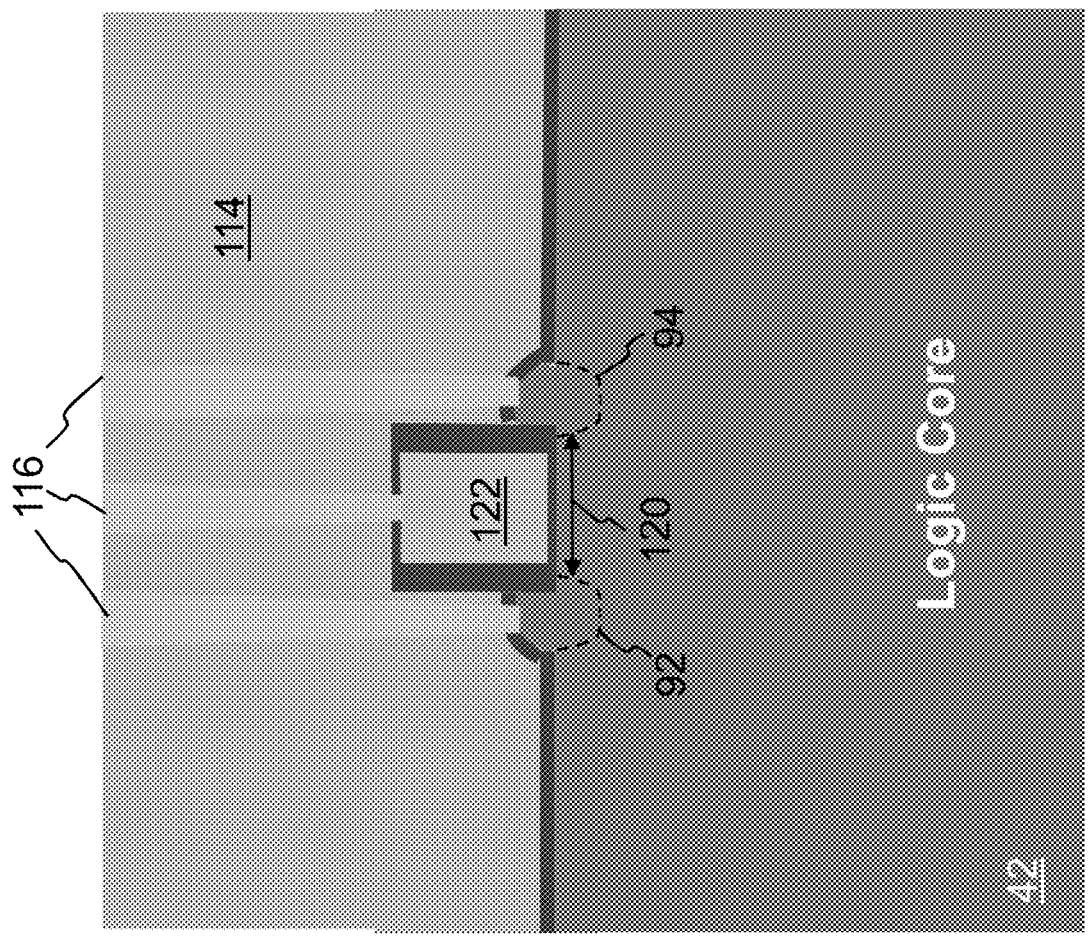

The final structures on and around the fins 58 in the HV Area 42b, the Logic Core Area 42c and the Logic IO Area 42d are similar in that the gates each wrap around the respective fin 58 so that it is adjacent to and insulated from both opposing side surfaces, and the top surface, of the fin 58. Therefore, another advantage of the present configuration is that the surface area of the channel region for each of the logic devices is greater in size versus an equally sized logic device over a planar channel region (i.e., the amount of surface overlap between the logic gate and the substrate is greater than the horizontal area of the substrate occupied by this element). For example, the final structure in Logic Core Area 42c is shown in FIG. 32B. Each logic device includes a channel region 120 of the substrate that extends between the source and drain regions 92 and 94 (i.e., those portions of the substrate along the two side surfaces and the top surface of the fin 58 between the source/drain regions 92/94). Metal block 110 is a logic gate 122 that is disposed over and insulated from (and controls the conductivity of) the channel region 120.

Two separate, non-limiting sets of exemplary operating voltages for the memory cells in Memory Area 42a are provided in Tables 1 and 2 below.

TABLE 1

|  | Program | Erase | Read |
| --- | --- | --- | --- |
| Drain 38 | 1-2 µA | 0 V | 0.5-1.1 V |
| Select Gate 32 | 0.5-1.2 V | 0 V | 0.5-2.5 V |
| Control Gate 30 | 5.5-13.5 V | 0 V | 0.5-2.5 V |
| Erase Gate 34 | 3.5-5.5 V | 8.5-15.5 V | 0 V |
| Source 36 | 3.5-5.5 V | 0 V | 0 V |

TABLE 2

|  | Program | Erase | Read |
| --- | --- | --- | --- |
| Drain 38 | 1-2 µA | 0 V | 0.5-1.1 V |
| Select Gate 32 | 0.5-1.2 V | 0 V | 0.5-2.5 V |
| Control Gate 30 | 5.5-13.5 V | −10 V to −15 V | 0.5-2.5 V |
| Erase Gate 34 | 3.5-5.5 V | 8.5-12 V | 0 V |
| Source 36 | 3.5-5.5 V | 0 V | 0 V |

Figures 34A, 34B:
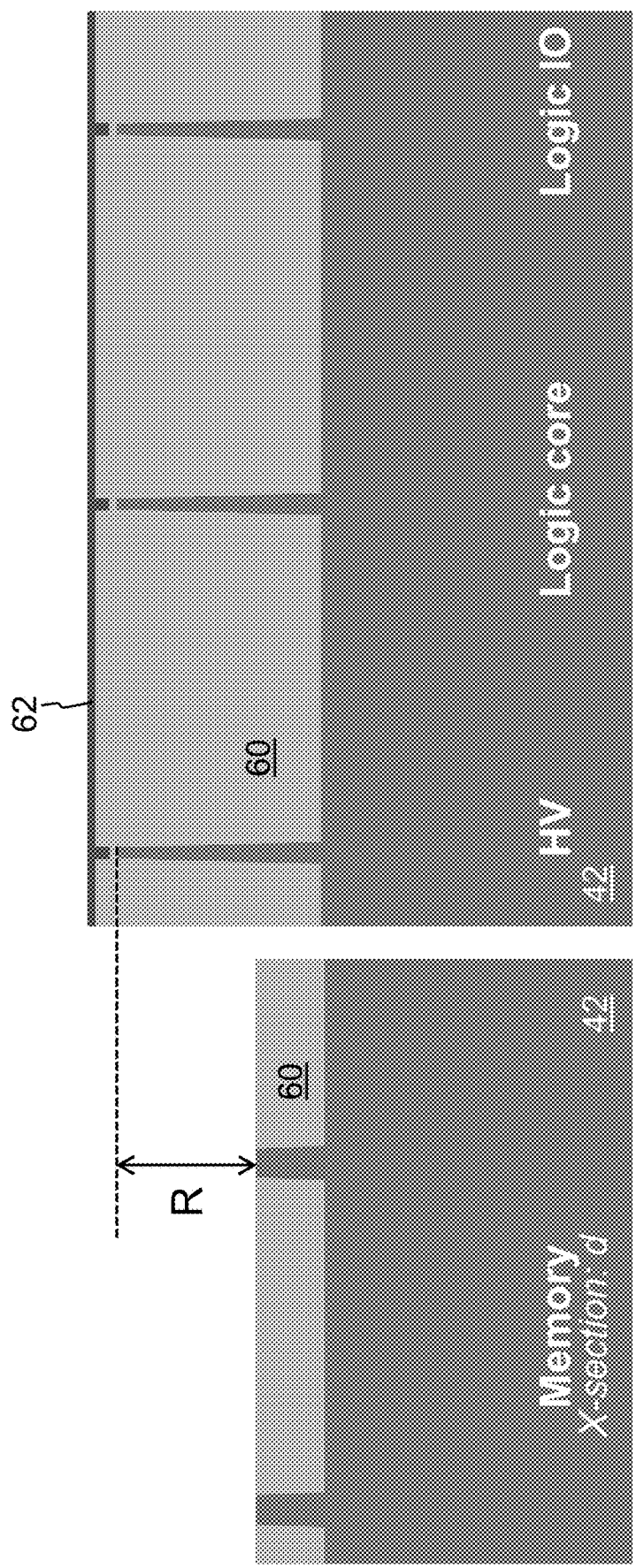

In an alternate embodiment, the recessing of the upper surface of the substrate as described above with respect to FIGS. 4A and 4B can be omitted, such that the fins 58 initially formed in the Memory and Logic Areas are even with each other, as shown in FIGS. 33A and 33B. Then, either before, during or after the recessing of the oxide 60 in Memory Area 42a, the tops of fins 58 in Memory Area 42a are removed by silicon etch, effectively reducing the height of fins 58 in Memory Area 42a relative to the height of the fins 58 in the Logic Areas by the amount R, as shown in FIGS. 34A and 34B. Forming the memory cells on the reduced height fins 58 in Memory Area 42a will similarly result in the taller memory cell gates having upper surfaces even with those of the logic device gates.

There are many advantages from different features of the present invention. Using a high K dielectric and metal for the select gates 32 and logic gates 122 increases conductivity and performance without increasing cell and logic device size (and in fact would aid in the scaling down in size of the memory cell), while using polysilicon for the erase gate 34 and floating gate 28 maintains control of the critical tunneling performance between these two gates. Conformal gates wrapping around the top and both side surfaces of the fins 58 are formed both in Memory Area 42a (i.e., floating, erase and select gates) and the Logic Areas (i.e., logic gates) allowing for further scaling down in size without compromising coupling surface area. Further, by recessing the fins in Memory Area 42a, the tops of the finished memory cells and the logic devices are approximately equal to each other (i.e., the tops of the select and erase gates of the memory cells are even with the tops of the logic gates in the logic regions), even though the gate stacks of the memory cells are taller than the logic gates of the logic devices, which improves manufacturability. In addition, memory cells and up to three different types of logic devices are all formed on fin shaped substrate structures of the same semiconductor substrate, where each memory cell is formed on a single fin, and each logic device is formed on a single fin, which enables a reduction of fin-to-fin spacing. Each of the source lines SL extends along one of the horizontally extending fins 58 and through a row of the memory cells, providing a continuous source line that extends across the isolation regions between adjacent cells (in the row direction). This allows for scaling the cells down to a smaller size, because this configuration avoids the need to form source line contacts for each pair of memory cells. Instead, the continuous source line extending along the fin can be electrically connected to a strap through periodic strap contacts (e.g., every 32 or 64 columns). By having a contact every 32 or 64 columns instead of one for every column, the size is the memory cells and thus a memory array of the memory cells can be significantly reduced. Nitride 69a over control gates 30 reduces alignment issues and helps protect the stack gate structures (including control gates 30 and floating gates 28) during subsequent processing. Finally, nitride 90 over the erase gate 34 and stacks S1/S2 protects these structures while the dummy poly blocks 88b/88c/88d are being removed and replaced with high K dielectric and metal (HKMG).

It is to be understood that the present invention is not limited to the embodiment(s) described above and illustrated herein, but encompasses any and all variations falling within the scope of any claims supported thereby. For example, references to the present invention herein are not intended to limit the scope of any claim or claim term, but instead merely make reference to one or more features that may be covered by one or more claims. Materials, processes and numerical examples described above are exemplary only, and should not be deemed to limit any claims. Further, not all method steps need be performed in the exact order illustrated. The fins could continuously extend between memory and Logic Areas. For example, one or more fins in Memory Area 42a (on which memory cells are formed) could continuously extend out of Memory Area 42a and into the Logic Areas (on which logic devices are formed), in which case memory devices and logic devices could be formed on the same continuously formed fin. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A memory device, comprising:
   a semiconductor substrate having an upper surface with a plurality of upwardly extending fins, wherein each of the fins includes first and second side surfaces that oppose each other and that terminate in a top surface;
   a memory cell formed on a first fin of the plurality of fins, comprising:
      spaced apart first source and first drain regions in the first fin, with a first channel region of the first fin extending along the top surface and the opposing side surfaces of the first fin between the first source and first drain regions,
      a floating gate of polysilicon material that extends along a first portion of the first channel region, wherein the floating gate wraps around the first fin so as to be adjacent to and insulated from the first and second side surfaces and the top surface of the first fin,
      a select gate of metal material that extends along a second portion of the first channel region, wherein the select gate wraps around the first fin so as to be adjacent to and insulated from the first and second side surfaces and the top surface of the first fin,
      a control gate of polysilicon material that extends along and is insulated from the floating gate, and
      an erase gate of polysilicon material that extends along and is insulated from the first source region;
   a logic device formed on a second fin of the plurality of fins, comprising:
      spaced apart second source and second drain regions in the second fin, with a second channel region of the second fin extending along the top surface and the opposing side surfaces of the second fin between the second source and second drain regions, and a first logic gate of metal material that extends along the second channel region, wherein the first logic gate wraps around the second fin so as to be adjacent to and insulated from the first and second side surfaces and the top surface of the second fin.

2. The memory device of claim 1, wherein high K dielectric material is disposed between the select gate and the second portion of the first channel region, and wherein high K dielectric material is disposed between the first logic gate and the second channel region.

3. The memory device of claim 1, wherein the top surface of the first fin is recessed relative to the top surface of the second fin.

4. The memory device of claim 1, wherein the top surface of the first fin includes a first raised portion of the substrate relative to a portion of the top surface of the first fin along which the first channel region extends, and wherein the first drain region is formed at least partially in the first raised portion.

5. The memory device of claim 4, wherein the top surface of the second fin includes second and third raised portions of the substrate relative to a portion of the top surface of the second fin along which the second channel region extends, and wherein the second source region is formed at least partially in the second raised portion and the second drain region is formed at least partially in the third raised portion.

6. The memory device of claim 1, further comprising:
a third fin of the plurality of fins having a length that extends in a first direction, wherein the first fin has a length that extends in a second direction that is perpendicular to the first direction, and wherein the first source region is formed in the first fin at an intersection of the first and third fins.

7. The memory device of claim 6, wherein the erase gate extends along and is insulated from the first and second side surfaces and the top surface of the first fin, and extends along and is insulated from the first and second side surfaces and the top surface of the third fin.

8. The memory device of claim 1, wherein the erase gate extends along and is insulated from an upper edge of the floating gate, and wherein the erase gate includes a notch facing the upper edge of the floating gate.

9. The memory device of claim 1, further comprising:
a second logic device formed on a third fin of the plurality of fins, comprising:
spaced apart third source and third drain regions in the third fin, with a third channel region of the third fin extending along the top surface and the opposing side surfaces of the third fin between the third source and third drain regions, and
a second logic gate that extends along the third channel region, wherein the second logic gate wraps around the third fin so as to be adjacent to and insulated from the first and second side surfaces and the top surface of the third fin.

10. The memory device of claim 9, wherein:
the first logic gate is insulated from the second fin by first insulation material;
the second logic gate is insulated from the third fin by second insulation material;
the second insulation material has a thickness that is greater than that of the first insulation material.

11. A method of forming a memory device, comprising:
forming a plurality of upwardly extending fins in an upper surface of a semiconductor substrate, wherein each of the fins includes first and second side surfaces that oppose each other and that terminate in a top surface;

forming a memory cell on a first fin of the plurality of fins, by:
forming spaced apart first source and first drain regions in the first fin, with a first channel region of the first fin extending along the top surface and the opposing side surfaces of the first fin between the first source and first drain regions,
forming a floating gate of polysilicon material that extends along a first portion of the first channel region, wherein the floating gate wraps around the first fin so as to be adjacent to and insulated from the first and second side surfaces and the top surface of the first fin,
forming a select gate of metal material that extends along a second portion of the first channel region, wherein the select gate wraps around the first fin so as to be adjacent to and insulated from the first and second side surfaces and the top surface of the first fin,
forming a control gate of polysilicon material that extends along and is insulated from the floating gate, and
forming an erase gate of polysilicon that extends along and is insulated from the first source region;
forming a logic device on a second fin of the plurality of fins, by:
forming spaced apart second source and second drain regions in the second fin, with a second channel region of the second fin extending along the top surface and the opposing side surfaces of the second fin between the second source and second drain regions, and
forming a first logic gate of metal material that extends along the second channel region, wherein the first logic gate wraps around the second fin so as to be adjacent to and insulated from the first and second side surfaces and the top surface of the second fin.

12. The method of claim 11, wherein the forming of the select gate, the erase gate and the first logic gate comprises:
forming a polysilicon layer over the substrate;
removing portions of the polysilicon layer such that a first block of the polysilicon layer extends along and is insulated from the first source region, a second block of the polysilicon layer extends along and is insulated from the second portion of the first channel region, and a third block of the polysilicon layer extends along and is insulated from the second channel region;
removing and replacing the second block of the polysilicon layer with a first block of metal material; and
removing and replacing the third block of the polysilicon layer with a second block of metal material;
wherein the first block of the polysilicon layer is the erase gate, the first block of metal material is the select gate and the second block of metal material is the first logic gate.

13. The method of claim 12, further comprising:
forming an insulation layer over the erase gate and the control gate before the removing of the second and third blocks of the polysilicon layer.

14. The method of claim 11, wherein the forming of the select gate includes forming high K dielectric material disposed between the select gate and the second portion of the first channel region, and wherein the forming of the first logic gate includes forming high K dielectric material disposed between the first logic gate and the second channel region.

15. The method of claim 11, wherein the top surface of the first fin is recessed relative to the top surface of the second fin.

16. The method of claim 11, further comprising:
forming a first raised portion in the top surface of the first fin relative to a portion of the top surface of the first fin along which the first channel region extends, wherein the first drain region is formed at least partially in the first raised portion.

17. The method of claim 16, further comprising:
forming a second raised portion in the top surface of the second fin relative to a portion of the top surface of the second fin along which the second channel region extends, wherein the second source region is formed at least partially in the second raised portion;
forming a third raised portion in the top surface of the second fin relative to the portion of the top surface of the second fin along which the second channel region extends, wherein the second drain region is formed at least partially in the third raised portion.

18. The method of claim 11, further comprising:
forming a third fin of the plurality of fins having a length that extends in a first direction, wherein the first fin has a length that extends in a second direction that is perpendicular to the first direction, and wherein the first source region is formed in the first fin at an intersection of the first and third fins.

19. The method of claim 18, wherein the erase gate extends along and is insulated from the first and second side surfaces and the top surface of the first fin, and extends along and is insulated from the first and second side surfaces and the top surface of the third fin.

20. The method of claim 11, wherein the erase gate extends along and is insulated from an upper edge of the floating gate, and wherein the erase gate includes a notch facing the upper edge of the floating gate.

21. The method of claim 11, further comprising:
forming a second logic device on a third fin of the plurality of fins, by:
forming spaced apart third source and third drain regions in the third fin, with a third channel region of the third fin extending along the top surface and the opposing side surfaces of the third fin between the third source and third drain regions, and
forming a second logic gate that extends along the third channel region, wherein the second logic gate wraps around the third fin so as to be adjacent to and insulated from the first and second side surfaces and the top surface of the third fin.

22. The method of claim 21, wherein:
the first logic gate is insulated from the second fin by first insulation material;
the second logic gate is insulated from the third fin by second insulation material;
the second insulation material has a thickness that is greater than that of the first insulation material.

* * * * *